US011114807B2

(12) United States Patent
Lloyd et al.

(10) Patent No.: US 11,114,807 B2
(45) Date of Patent: Sep. 7, 2021

(54) CIRCUIT BOARD BYPASS ASSEMBLIES AND COMPONENTS THEREFOR

(71) Applicant: Molex, LLC, Lisle, IL (US)

(72) Inventors: Brian Keith Lloyd, Maumelle, AR (US); Gregory B. Walz, Maumelle, AR (US); Bruce Reed, Maumelle, AR (US); Gregory Fitzgerald, Merrimack, NH (US); Ayman Isaac, Little Rock, AR (US); Kent E. Regnier, Lombard, IL (US); Brandon Janowiak, Wheaton, IL (US); Darian R. Schulz, Little Rock, AR (US); Munawar Ahmad, Maumelle, AR (US); Eran J. Jones, Conway, AR (US); Javier Resendez, Streamwood, IL (US); Michael Rost, Lisle, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/823,333

(22) Filed: Mar. 19, 2020

(65) Prior Publication Data
US 2020/0220312 A1 Jul. 9, 2020

Related U.S. Application Data

(63) Continuation of application No. 16/110,727, filed on Aug. 23, 2018, now Pat. No. 10,637,200, which is a
(Continued)

(51) Int. Cl.
*H01R 31/00* (2006.01)
*H01R 13/66* (2006.01)
(Continued)

(52) U.S. Cl.
CPC ........... *H01R 31/005* (2013.01); *G06F 1/181* (2013.01); *G06F 1/189* (2013.01); *H01R 12/79* (2013.01);
(Continued)

(58) Field of Classification Search
CPC .. H01R 31/005; H01R 12/79; H01R 13/6583; H01R 13/6658; H01R 13/7175;
(Continued)

(56) References Cited

U.S. PATENT DOCUMENTS 3,007,131 A   10/1961 Dahlgren et al.
3,594,613 A    7/1971 Prietula
(Continued)

FOREIGN PATENT DOCUMENTS

CN    2379933 Y    5/2000
CN    2415473 Y    1/2001
(Continued)

OTHER PUBLICATIONS

Amphenol Aerospace, "Size 8 High Speed Quadrax and Differential Twinax Contacts for Use in MIL-DTL-38999 Special Subminiature Cylindrical and ARINC 600 Rectangular Connectors", Retrieved from the Internet URL: www.peigenesis.com/images/content/news/amphenol quadrax.pdf, May 2008.
(Continued)

*Primary Examiner* — Peter G Leigh

(57) ABSTRACT

A connector for use in a free-standing connector port for mating with an external pluggable module is disclosed. The connector has terminals that extend lengthwise of the connector so that cables may be terminated to the terminals and the terminals and cable generally are horizontally aligned together. The connector defines a card-receiving slot and is
(Continued)

position in a cage that defines the connector port. The cables exit from the rear of the connector and from the connector port.

12 Claims, 55 Drawing Sheets

Related U.S. Application Data continuation of application No. 15/541,775, filed as application No. PCT/US2016/012848 on Jan. 11, 2016, now Pat. No. 10,135,211.

(60) Provisional application No. 62/102,045, filed on Jan. 11, 2015, provisional application No. 62/102,046, filed on Jan. 11, 2015, provisional application No. 62/102,047, filed on Jan. 11, 2015, provisional application No. 62/102,048, filed on Jan. 11, 2015, provisional application No. 62/156,602, filed on May 4, 2015, provisional application No. 62/156,708, filed on May 4, 2015, provisional application No. 62/156,587, filed on May 4, 2015, provisional application No. 62/167,036, filed on May 27, 2015, provisional application No. 62/182,161, filed on Jun. 19, 2015.

(51) Int. Cl.
| | | |
|---|---|---|
| *H05K 7/14* | (2006.01) | |
| *G06F 1/18* | (2006.01) | |
| *H01R 12/79* | (2011.01) | |
| *H01R 13/6583* | (2011.01) | |
| *H01R 13/717* | (2006.01) | |
| *H01R 24/60* | (2011.01) | |

(52) U.S. Cl.
CPC ..... *H01R 13/6583* (2013.01); *H01R 13/6658* (2013.01); *H01R 13/7175* (2013.01); *H01R 24/60* (2013.01); *H05K 7/1487* (2013.01); *H05K 7/1492* (2013.01)

(58) Field of Classification Search
CPC ......... H01R 24/60; G06F 1/181; G06F 1/189; H05K 7/1487; H05K 7/1492
USPC ...................................................... 439/607.2
See application file for complete search history.

(56) References Cited

U.S. PATENT DOCUMENTS

| | | | |
|---|---|---|---|
| 3,633,152 A | 1/1972 | Podmore | |
| 3,963,319 A | 6/1976 | Schumacher | |
| 4,009,921 A | 3/1977 | Narozny | |
| 4,025,141 A | 5/1977 | Thelissen | |
| 4,060,295 A | 11/1977 | Tomkiewicz | |
| 4,072,387 A | 2/1978 | Sochor | |
| 4,083,615 A | 4/1978 | Volinskie | |
| 4,157,612 A | 6/1979 | Rainal | |
| 4,290,664 A | 9/1981 | Davis | |
| 4,307,926 A | 12/1981 | Smith | |
| 4,346,355 A | 8/1982 | Tsukii | |
| 4,417,779 A | 11/1983 | Wilson | |
| 4,508,403 A | 4/1985 | Weltman | |
| 4,611,186 A | 9/1986 | Ziegner | |
| 4,615,578 A | 10/1986 | Stadler | |
| 4,639,054 A | 1/1987 | Kersbergen | |
| 4,656,441 A | 4/1987 | Takahashi | |
| 4,657,329 A | 4/1987 | Dechelette | |
| 4,679,321 A | 7/1987 | Plonski | |
| 4,697,862 A | 10/1987 | Hasircoglu | |
| 4,724,409 A | 2/1988 | Lehman | |
| 4,889,500 A | 12/1989 | Lazar | |
| 4,924,179 A | 5/1990 | Sherman | |
| 4,948,379 A | 8/1990 | Evans | |
| 4,984,992 A | 1/1991 | Beamenderfer et al. | |
| 4,991,001 A | 2/1991 | Takubo | |
| 5,112,251 A | 5/1992 | Cesar | |
| 5,197,893 A | 3/1993 | Morlion et al. | |
| 5,332,979 A | 7/1994 | Roskewitsch | |
| 5,387,130 A | 2/1995 | Fedder et al. | |
| 5,402,088 A | 3/1995 | Pierro et al. | |
| 5,435,757 A | 7/1995 | Fedder et al. | |
| 5,441,424 A | 8/1995 | Morlion et al. | |
| 5,479,110 A | 12/1995 | Crane et al. | |
| 5,487,673 A | 1/1996 | Hurtarte | |
| 5,509,827 A | 4/1996 | Huppenthal et al. | |
| 5,554,038 A | 9/1996 | Morlion et al. | |
| 5,598,627 A | 2/1997 | Saka et al. | |
| 5,632,634 A | 5/1997 | Soes | |
| 5,691,506 A | 11/1997 | Miyazaki et al. | |
| 5,781,759 A | 7/1998 | Kashiwabara | |
| 5,784,644 A | 7/1998 | Larabell | |
| 5,813,243 A | 9/1998 | Johnson et al. | |
| 5,842,873 A | 12/1998 | Gonzales | |
| 5,876,239 A | 3/1999 | Morin et al. | |
| 6,004,139 A | 12/1999 | Dramstad | |
| 6,053,770 A | 4/2000 | Blom | |
| 6,067,226 A * | 5/2000 | Barker | G06F 1/181 |
| | | | 361/679.6 |
| 6,083,046 A | 7/2000 | Wu et al. | |
| 6,095,872 A | 8/2000 | Lang et al. | |
| 6,098,127 A | 8/2000 | Kwang | |
| 6,139,372 A | 10/2000 | Yang | |
| 6,144,559 A | 11/2000 | Johnson et al. | |
| 6,156,981 A | 12/2000 | Ward et al. | |
| 6,195,263 B1 | 2/2001 | Aoike | |
| 6,203,376 B1 | 3/2001 | Magajne et al. | |
| 6,216,184 B1 | 4/2001 | Fackenthall et al. | |
| 6,238,219 B1 | 5/2001 | Wu | |
| 6,255,741 B1 * | 7/2001 | Yoshihara | B81B 7/0058 |
| | | | 257/414 |
| 6,266,712 B1 * | 7/2001 | Henrichs | G06F 3/0608 |
| | | | 710/8 |
| 6,273,753 B1 | 8/2001 | Ko | |
| 6,273,758 B1 | 8/2001 | Lloyd | |
| 6,366,471 B1 | 4/2002 | Edwards et al. | |
| 6,368,120 B1 | 4/2002 | Scherer | |
| 6,371,788 B1 | 4/2002 | Bowling et al. | |
| 6,452,789 B1 | 9/2002 | Pallotti et al. | |
| 6,454,605 B1 | 9/2002 | Bassler et al. | |
| 6,489,563 B1 | 12/2002 | Zhao et al. | |
| 6,535,367 B1 | 3/2003 | Carpenter | |
| 6,538,903 B1 | 3/2003 | Radu et al. | |
| 6,574,115 B2 | 6/2003 | Asano et al. | |
| 6,575,772 B1 | 6/2003 | Soubh et al. | |
| 6,592,401 B1 | 7/2003 | Gardner et al. | |
| 6,652,296 B2 | 11/2003 | Kuroda et al. | |
| 6,652,318 B1 | 11/2003 | Winings et al. | |
| 6,667,891 B2 | 12/2003 | Coglitore et al. | |
| 6,685,501 B1 | 2/2004 | Wu et al. | |
| 6,692,262 B1 | 2/2004 | Loveless | |
| 6,705,893 B1 | 3/2004 | Ko | |
| 6,764,342 B2 | 7/2004 | Murayama et al. | |
| 6,780,069 B2 | 8/2004 | Scherer | |
| 6,797,891 B1 | 9/2004 | Blair et al. | |
| 6,812,560 B2 | 11/2004 | Recktenwald et al. | |
| 6,824,426 B1 | 11/2004 | Spink, Jr. | |
| 6,843,657 B2 | 1/2005 | Driscoll et al. | |
| 6,859,854 B2 | 2/2005 | Kwong | |
| 6,878,012 B2 | 4/2005 | Gutierrez et al. | |
| 6,882,241 B2 | 4/2005 | Abo | |
| 6,903,934 B2 | 6/2005 | Lo | |
| 6,910,914 B1 | 6/2005 | Spink, Jr. | |
| 6,916,183 B2 | 7/2005 | Alger et al. | |
| 6,955,565 B2 | 10/2005 | Lloyd | |
| 6,969,270 B2 | 11/2005 | Renfro | |
| 6,969,280 B2 | 11/2005 | Chien | |
| 6,971,887 B1 | 12/2005 | Trobaugh | |
| 7,004,765 B2 | 2/2006 | Hsu | |
| 7,004,767 B2 | 2/2006 | Kim | |
| 7,004,793 B2 | 2/2006 | Scherer | |

(56) References Cited

U.S. PATENT DOCUMENTS

| | | | |
|---|---|---|---|
| 7,008,234 B1 | 3/2006 | Brown |
| 7,040,918 B2 | 5/2006 | Moriyama et al. |
| 7,044,772 B2 | 5/2006 | McCreery |
| 7,052,292 B2 | 5/2006 | Hsu et al. |
| 7,056,128 B2 | 6/2006 | Driscoll et al. |
| 7,066,756 B2 | 6/2006 | Lange et al. |
| 7,070,446 B2 | 7/2006 | Henry |
| 7,086,888 B2 | 8/2006 | Wu |
| 7,108,522 B2 | 9/2006 | Verelst et al. |
| 7,148,428 B2 | 12/2006 | Meier et al. |
| 7,163,421 B1 | 1/2007 | Cohen et al. |
| 7,168,961 B2 | 1/2007 | Hsieh |
| 7,175,446 B2 | 2/2007 | Bright |
| 7,192,300 B2 | 3/2007 | Hashiguchi et al. |
| 7,214,097 B1 | 5/2007 | Hsu et al. |
| 7,223,915 B2 | 5/2007 | Hackman |
| 7,234,944 B2 | 6/2007 | Nordin |
| 7,244,137 B2 | 7/2007 | Renfro et al. |
| 7,280,372 B2 | 10/2007 | Grundy et al. |
| 7,307,293 B2 | 12/2007 | Fjelstad et al. |
| 7,331,816 B2 | 2/2008 | Krohn et al. |
| 7,345,359 B2 | 3/2008 | Kim et al. |
| 7,384,275 B2 | 6/2008 | Ngo |
| 7,394,665 B2 | 7/2008 | Hamasaki et al. |
| 7,402,048 B2 | 7/2008 | Meier et al. |
| 7,431,608 B2 | 10/2008 | Sakaguchi et al. |
| 7,445,471 B1 | 11/2008 | Scherer et al. |
| 7,462,924 B2 | 12/2008 | Shuey |
| 7,489,514 B2 * | 2/2009 | Hamasaki ............ G02B 6/3817 361/721 |
| 7,534,142 B2 | 5/2009 | Avery |
| 7,535,090 B2 | 5/2009 | Furuyama et al. |
| 7,540,773 B2 | 6/2009 | Ko |
| 7,549,897 B2 | 6/2009 | Fedder et al. |
| 7,621,779 B2 | 11/2009 | Laurx et al. |
| 7,637,767 B2 | 12/2009 | Davis |
| 7,654,831 B1 | 2/2010 | Wu |
| 7,658,654 B2 | 2/2010 | Ohyama |
| 7,667,982 B2 * | 2/2010 | Hamasaki ............... H05K 3/222 361/803 |
| 7,690,930 B2 | 4/2010 | Chen et al. |
| 7,719,843 B2 | 5/2010 | Dunham |
| 7,737,360 B2 | 6/2010 | Wiemeyer et al. |
| 7,744,385 B2 | 6/2010 | Scherer |
| 7,744,403 B2 | 6/2010 | Barr |
| 7,744,414 B2 | 6/2010 | Scherer et al. |
| 7,748,988 B2 | 7/2010 | Hori |
| 7,771,207 B2 | 8/2010 | Hamner et al. |
| 7,789,529 B2 | 9/2010 | Roberts |
| 7,813,146 B1 | 10/2010 | Phan |
| 7,819,675 B2 | 10/2010 | Ko et al. |
| 7,824,197 B1 | 11/2010 | Westman |
| 7,857,629 B2 | 12/2010 | Chin |
| 7,857,630 B2 | 12/2010 | Hermant et al. |
| 7,862,344 B2 | 1/2011 | Morgan |
| 7,892,019 B2 * | 2/2011 | Rao ..................... H01R 31/005 439/492 |
| 7,904,763 B2 | 3/2011 | Araki et al. |
| 7,906,730 B2 | 3/2011 | Atkinson et al. |
| 7,931,502 B2 | 4/2011 | Lida |
| 7,985,097 B2 | 7/2011 | Gulla |
| 7,997,933 B2 | 8/2011 | Feldman |
| 8,002,583 B2 | 8/2011 | Van Woensel |
| 8,018,733 B2 | 9/2011 | Jia |
| 8,035,973 B2 | 10/2011 | Mccolloch |
| 8,036,500 B2 | 10/2011 | McColloch |
| 8,089,779 B2 | 1/2012 | Fietz et al. |
| 8,096,813 B2 | 1/2012 | Biggs |
| 8,157,573 B2 | 4/2012 | Tanaka |
| 8,162,675 B2 | 4/2012 | Regnier |
| 8,187,038 B2 | 5/2012 | Kamiya |
| 8,188,594 B2 | 5/2012 | Ganesan et al. |
| 8,192,222 B2 | 6/2012 | Kameyama |
| 8,226,441 B2 | 7/2012 | Regnier |
| 8,308,491 B2 | 11/2012 | Nichols et al. |
| 8,337,243 B2 | 12/2012 | Elkhatib et al. |
| 8,338,713 B2 | 12/2012 | Fjelstad et al. |
| 8,374,470 B2 | 2/2013 | Ban et al. |
| 8,398,433 B1 | 3/2013 | Yang |
| 8,419,472 B1 | 4/2013 | Swanger |
| 8,435,074 B1 | 5/2013 | Grant |
| 8,439,704 B2 | 5/2013 | Reed |
| 8,449,312 B2 | 5/2013 | Lan |
| 8,449,330 B1 | 5/2013 | Schroll |
| 8,465,302 B2 | 6/2013 | Regnier |
| 8,480,413 B2 | 7/2013 | Minich |
| 8,517,765 B2 | 8/2013 | Schroll |
| 8,535,069 B2 | 9/2013 | Zhang |
| 8,540,525 B2 | 9/2013 | Regnier |
| 8,575,529 B2 | 9/2013 | Asahi |
| 8,553,102 B2 | 10/2013 | Yamada |
| 8,575,491 B2 | 11/2013 | Gundel et al. |
| 8,585,442 B2 | 11/2013 | Tuma et al. |
| 8,588,561 B2 * | 11/2013 | Zbinden ............... G02B 6/4284 385/14 |
| 8,597,055 B2 | 12/2013 | Regnier |
| 8,651,890 B2 | 2/2014 | Chiarelli |
| 8,672,707 B2 | 3/2014 | Nichols et al. |
| 8,687,350 B2 | 4/2014 | Santos |
| 8,690,604 B2 | 4/2014 | Davis |
| 8,715,003 B2 | 5/2014 | Buck |
| 8,721,361 B2 | 5/2014 | Wu |
| 8,740,644 B2 | 6/2014 | Long |
| 8,747,158 B2 | 6/2014 | Szczesny |
| 8,753,145 B2 | 6/2014 | Lang |
| 8,758,051 B2 | 6/2014 | Nonen et al. |
| 8,764,483 B2 | 7/2014 | Ellison |
| 8,784,122 B2 | 7/2014 | Soubh |
| 8,787,711 B2 | 7/2014 | Zbinden |
| 8,794,991 B2 | 8/2014 | Ngo |
| 8,804,342 B2 | 8/2014 | Behziz et al. |
| 8,814,595 B2 | 8/2014 | Cohen et al. |
| 8,834,190 B2 | 9/2014 | Ngo |
| 8,845,364 B2 | 9/2014 | Wanha et al. |
| 8,864,521 B2 | 10/2014 | Atkinson et al. |
| 8,888,533 B2 | 11/2014 | Westman et al. |
| 8,905,767 B2 | 12/2014 | Putt, Jr. et al. |
| 8,911,255 B2 | 12/2014 | Scherer et al. |
| 8,926,342 B2 | 1/2015 | Vinther |
| 8,926,377 B2 | 1/2015 | Kirk |
| 8,992,236 B2 | 3/2015 | Wittig |
| 8,992,237 B2 | 3/2015 | Regnier |
| 8,992,258 B2 | 3/2015 | Raschilla |
| 9,011,177 B2 * | 4/2015 | Lloyd .................... H05K 3/222 439/607.47 |
| 9,028,281 B2 | 5/2015 | Kirk |
| 9,035,183 B2 | 5/2015 | Kodama et al. |
| 9,040,824 B2 | 5/2015 | Guetig et al. |
| 9,054,432 B2 | 6/2015 | Yang |
| 9,071,001 B2 | 6/2015 | Scherer et al. |
| 9,118,151 B2 | 8/2015 | Tran et al. |
| 9,119,292 B2 | 8/2015 | Gundel |
| 9,136,652 B2 | 9/2015 | Ngo |
| 9,142,921 B2 | 9/2015 | Wanha et al. |
| 9,155,214 B2 | 10/2015 | Ritter |
| 9,160,123 B1 | 10/2015 | Pao |
| 9,160,151 B2 | 10/2015 | Vinther |
| 9,161,463 B2 | 10/2015 | Takamura |
| 9,166,320 B1 | 10/2015 | Herring |
| 9,196,983 B2 | 11/2015 | Saur et al. |
| 9,203,171 B2 | 12/2015 | Yu |
| 9,209,539 B2 | 12/2015 | Herring |
| 9,214,756 B2 | 12/2015 | Nishio |
| 9,214,768 B2 | 12/2015 | Pao |
| 9,232,676 B2 | 1/2016 | Sechrist et al. |
| 9,246,251 B2 | 1/2016 | Regnier |
| 9,277,649 B2 | 3/2016 | Ellison |
| 9,292,055 B2 | 3/2016 | Wu |
| 9,312,618 B2 | 4/2016 | Regnier |
| 9,331,432 B1 | 5/2016 | Phillips |
| 9,350,108 B2 | 5/2016 | Long |
| 9,356,366 B2 | 5/2016 | Moore |
| 9,385,455 B2 | 7/2016 | Regnier |
| 9,391,407 B1 | 7/2016 | Bucher |

(56) References Cited

U.S. PATENT DOCUMENTS

| | | |
|---|---|---|
| 9,401,563 B2 | 7/2016 | Simpson |
| 9,413,090 B2 | 8/2016 | Nagamine |
| 9,413,097 B2 | 8/2016 | Tamarkin et al. |
| 9,413,112 B2 | 8/2016 | Helster |
| 9,431,773 B2 | 8/2016 | Chen |
| 9,437,981 B2 | 9/2016 | Wu |
| 9,455,538 B2 | 9/2016 | Nishio |
| 9,484,671 B2 | 11/2016 | Zhu |
| 9,484,673 B1 | 11/2016 | Yang |
| 9,490,587 B1 | 11/2016 | Phillips |
| 9,496,655 B1 | 11/2016 | Huang |
| 9,515,429 B2 | 12/2016 | DeGeest |
| 9,525,245 B2 | 12/2016 | Regnier |
| 9,543,688 B2 | 1/2017 | Pao |
| 9,553,381 B2 | 1/2017 | Regnier |
| 9,559,465 B2 | 1/2017 | Phillips |
| 9,565,780 B2 | 2/2017 | Nishio |
| 9,608,348 B2* | 3/2017 | Wanha ............... H01R 13/6474 |
| 9,608,388 B2 | 3/2017 | Kondo |
| 9,608,590 B2 | 3/2017 | Hamner |
| 9,627,818 B1 | 4/2017 | Chen |
| 9,660,364 B2 | 5/2017 | Wig et al. |
| 9,666,998 B1 | 5/2017 | DeBoer |
| 9,673,570 B2 | 6/2017 | Briant |
| 9,705,258 B2 | 7/2017 | Phillips et al. |
| 9,812,799 B2 | 11/2017 | Wittig |
| 9,846,287 B2 | 12/2017 | Mack |
| 9,985,367 B2 | 5/2018 | Wanha |
| 10,348,015 B2* | 7/2019 | Mason ................. H05K 1/0203 |
| 10,424,856 B2* | 9/2019 | Lloyd .................... H01R 12/73 |
| 10,637,200 B2 | 4/2020 | Lloyd et al. |
| 2001/0016438 A1 | 8/2001 | Reed |
| 2001/0042913 A1 | 11/2001 | Fukuda et al. |
| 2002/0111067 A1 | 8/2002 | Sakurai et al. |
| 2002/0157865 A1 | 10/2002 | Noda |
| 2002/0180554 A1 | 12/2002 | Clark |
| 2003/0064616 A1 | 4/2003 | Reed et al. |
| 2003/0073331 A1 | 4/2003 | Peloza et al. |
| 2003/0180006 A1 | 9/2003 | Loh et al. |
| 2003/0222282 A1 | 12/2003 | Fjelstad et al. |
| 2004/0094328 A1 | 5/2004 | Fjelstad et al. |
| 2004/0121633 A1 | 6/2004 | David et al. |
| 2004/0155328 A1 | 8/2004 | Kline |
| 2004/0155734 A1 | 8/2004 | Kosemura |
| 2004/0229510 A1 | 11/2004 | Lloyd |
| 2004/0264894 A1 | 12/2004 | Cooke |
| 2005/0006126 A1 | 1/2005 | Aisenbrey |
| 2005/0051810 A1* | 3/2005 | Funakura ............ H01L 23/3121 |
| | | 257/232 |
| 2005/0093127 A1 | 5/2005 | Fjelstad et al. |
| 2005/0130490 A1 | 6/2005 | Rose |
| 2005/0142944 A1 | 6/2005 | Ling et al. |
| 2005/0239339 A1 | 10/2005 | Pepe |
| 2006/0001163 A1 | 1/2006 | Kolbehdari et al. |
| 2006/0035523 A1 | 2/2006 | Kuroda et al. |
| 2006/0038287 A1* | 2/2006 | Hamasaki ............ G02B 6/389 |
| | | 257/726 |
| 2006/0050493 A1 | 3/2006 | Hamasaki et al. |
| 2006/0067066 A1 | 3/2006 | Meier et al. |
| 2006/0079102 A1 | 4/2006 | DeLessert |
| 2006/0079119 A1 | 4/2006 | Wu |
| 2006/0088254 A1 | 4/2006 | Mohammed |
| 2006/0091507 A1 | 5/2006 | Fjelstad et al. |
| 2006/0114016 A1* | 6/2006 | Suzuki ..................... H03F 1/56 |
| | | 326/30 |
| 2006/0160399 A1 | 7/2006 | Dawiedczyk |
| 2006/0189212 A1 | 8/2006 | Avery |
| 2006/0194475 A1 | 8/2006 | Miyazaki |
| 2006/0216969 A1 | 9/2006 | Bright |
| 2006/0228922 A1 | 10/2006 | Morriss |
| 2006/0234556 A1 | 10/2006 | Wu |
| 2006/0238991 A1 | 10/2006 | Drako |
| 2006/0282724 A1 | 12/2006 | Roulo |
| 2006/0292898 A1 | 12/2006 | Meredith |
| 2007/0032104 A1 | 2/2007 | Yamada |
| 2007/0141871 A1 | 6/2007 | Scherer |
| 2007/0243741 A1 | 10/2007 | Yang |
| 2008/0024999 A1 | 1/2008 | Huang |
| 2008/0131997 A1 | 6/2008 | Kim et al. |
| 2008/0171476 A1 | 7/2008 | Liu |
| 2008/0186666 A1 | 8/2008 | Wu |
| 2008/0242127 A1 | 10/2008 | Murr et al. |
| 2008/0297988 A1 | 12/2008 | Chau |
| 2008/0305689 A1 | 12/2008 | Zhang et al. |
| 2009/0023330 A1 | 1/2009 | Stoner et al. |
| 2009/0153169 A1 | 6/2009 | Soubh et al. |
| 2009/0166082 A1 | 7/2009 | Liu et al. |
| 2009/0174991 A1 | 7/2009 | Mahdavi |
| 2009/0215309 A1 | 8/2009 | Mongold et al. |
| 2010/0042770 A1 | 2/2010 | Chuang |
| 2010/0068944 A1 | 3/2010 | Scherer |
| 2010/0112850 A1* | 5/2010 | Rao ...................... H01R 31/005 |
| | | 439/492 |
| 2010/0120286 A1* | 5/2010 | Johnsen ................. H01R 13/70 |
| | | 439/540.1 |
| 2010/0159829 A1 | 6/2010 | McCormack |
| 2010/0177489 A1 | 7/2010 | Yagisawa |
| 2010/0190373 A1 | 7/2010 | Yeh |
| 2010/0203768 A1 | 8/2010 | Kondo |
| 2011/0051373 A1 | 3/2011 | Mccolloch |
| 2011/0074213 A1 | 3/2011 | Schaffer |
| 2011/0080719 A1 | 4/2011 | Jia |
| 2011/0136387 A1 | 6/2011 | Matsuura |
| 2011/0177699 A1 | 7/2011 | Crofoot et al. |
| 2011/0212633 A1 | 9/2011 | Regnier |
| 2011/0230104 A1 | 9/2011 | Lang |
| 2011/0263156 A1 | 10/2011 | Ko |
| 2011/0300757 A1 | 12/2011 | Regnier |
| 2011/0304966 A1 | 12/2011 | Schrempp |
| 2012/0003848 A1 | 1/2012 | Casher et al. |
| 2012/0033370 A1 | 2/2012 | Reinke et al. |
| 2012/0034820 A1 | 2/2012 | Lang |
| 2012/0225585 A1 | 9/2012 | Lee |
| 2012/0243837 A1 | 9/2012 | Ko et al. |
| 2012/0246373 A1 | 9/2012 | Chang |
| 2012/0251116 A1 | 10/2012 | Li et al. |
| 2013/0005178 A1 | 1/2013 | Straka et al. |
| 2013/0012038 A1 | 1/2013 | Kirk |
| 2013/0017715 A1 | 1/2013 | Van Laarhoven |
| 2013/0040482 A1 | 2/2013 | Ngo |
| 2013/0092429 A1 | 4/2013 | Ellison |
| 2013/0148321 A1 | 6/2013 | Liang |
| 2013/0340251 A1 | 12/2013 | Regnier |
| 2014/0041937 A1* | 2/2014 | Lloyd ................. H01R 13/6461 |
| | | 174/74 R |
| 2014/0073173 A1 | 3/2014 | Yang |
| 2014/0073174 A1 | 3/2014 | Yang |
| 2014/0073181 A1 | 3/2014 | Yang |
| 2014/0111293 A1 | 4/2014 | Madeberg |
| 2014/0148048 A1* | 5/2014 | Shinohara ............ G06F 1/1601 |
| | | 439/533 |
| 2014/0217571 A1 | 8/2014 | Ganesan et al. |
| 2014/0242844 A1 | 8/2014 | Wanha |
| 2014/0273551 A1 | 9/2014 | Resendez |
| 2014/0273594 A1 | 9/2014 | Jones et al. |
| 2014/0335736 A1 | 11/2014 | Regnier |
| 2015/0013936 A1 | 1/2015 | Mack |
| 2015/0079845 A1 | 3/2015 | Wanha |
| 2015/0090491 A1 | 4/2015 | Dunwoody |
| 2015/0180578 A1 | 6/2015 | Leigh et al. |
| 2015/0212961 A1 | 7/2015 | Wu |
| 2015/0207247 A1 | 9/2015 | Chen et al. |
| 2015/0289407 A1 | 10/2015 | Wu et al. |
| 2016/0013596 A1 | 1/2016 | Regnier |
| 2016/0064119 A1 | 3/2016 | Grant |
| 2016/0104956 A1 | 4/2016 | Santos |
| 2016/0181713 A1 | 6/2016 | Peloza |
| 2016/0190720 A1 | 6/2016 | Lindkamp |
| 2016/0190747 A1 | 6/2016 | Regnier |
| 2016/0197423 A1 | 7/2016 | Regnier |
| 2016/0218455 A1 | 7/2016 | Sayre |
| 2016/0233598 A1 | 8/2016 | Wittig |
| 2016/0233615 A1 | 8/2016 | Scholeno |
| 2016/0336692 A1 | 11/2016 | Champion |

(56) References Cited

U.S. PATENT DOCUMENTS

| | | |
|---|---|---|
| 2016/0380383 A1 | 12/2016 | Lord |
| 2017/0033482 A1 | 2/2017 | Liao |
| 2017/0033509 A1 | 2/2017 | Liao |
| 2017/0077621 A1 | 3/2017 | Liao |
| 2017/0098901 A1 | 4/2017 | Regnier |
| 2017/0110222 A1 | 4/2017 | Liptak et al. |
| 2017/0162960 A1 | 6/2017 | Wanha |
| 2017/0302036 A1 | 10/2017 | Regnier |
| 2017/0365942 A1 | 12/2017 | Regnier |
| 2018/0006416 A1* | 1/2018 | Lloyd .................. G06F 1/189 |
| 2018/0034175 A1 | 2/2018 | Lloyd |
| 2018/0120906 A1* | 5/2018 | Reed .................. H05K 7/1487 |
| 2019/0027870 A1 | 1/2019 | Lloyd et al. |
| 2019/0319380 A1 | 10/2019 | Lloyd et al. |

FOREIGN PATENT DOCUMENTS

| | | |
|---|---|---|
| CN | 1316802 A | 10/2001 |
| CN | 1336095 A | 2/2002 |
| CN | 2624465 Y | 7/2004 |
| CN | 1604398 A | 4/2005 |
| CN | 1647323 A | 7/2005 |
| CN | 1647599 A | 7/2005 |
| CN | 1266813 C | 7/2006 |
| CN | 101155037 A | 4/2008 |
| CN | 101656384 A | 2/2010 |
| CN | 101944697 A | 1/2011 |
| CN | 102074825 A | 5/2011 |
| CN | 102365907 A | 2/2012 |
| CN | 102986316 A | 3/2013 |
| DE | 3447556 A1 | 7/1986 |
| JP | 02-079571 U | 6/1990 |
| JP | 04-14372 U1 | 2/1992 |
| JP | 05-059761 U | 8/1993 |
| JP | H0559761 U | 8/1993 |
| JP | H10145767 A | 5/1998 |
| JP | 2001244661 A | 9/2001 |
| JP | 2001313109 A | 11/2001 |
| JP | 2005-222537 A | 8/2005 |
| JP | 2007-287380 A | 11/2007 |
| JP | 2008-041285 A | 2/2008 |
| JP | 2008-059857 A | 3/2008 |
| JP | 2009-043590 A | 2/2009 |
| JP | 2009094842 A | 4/2009 |
| JP | 2010-017388 A | 1/2010 |
| JP | 2010112789 A | 5/2010 |
| JP | 2010-123274 A | 6/2010 |
| JP | 2011-018673 A | 1/2011 |
| JP | 2011103442 A | 5/2011 |
| JP | 2013-016394 A | 1/2013 |
| JP | 2013-524443 A | 6/2013 |
| JP | 2014045080 A | 3/2014 |
| JP | 2014-204057 A | 10/2014 |
| JP | 2014-531723 A | 11/2014 |
| TW | 200423204 A | 11/2004 |
| TW | M359141 U | 6/2009 |
| TW | M408835 U | 8/2011 |
| TW | 201225455 A | 6/2012 |
| WO | 2008/072322 A1 | 6/2008 |
| WO | 2009/147791 A1 | 12/2009 |
| WO | 2012/078434 A2 | 6/2012 |
| WO | 2013/006592 A2 | 1/2013 |
| WO | 2016/112379 A1 | 7/2016 |
| WO | 2017123574 A1 | 7/2017 |
| WO | 2017127513 A1 | 7/2017 |

OTHER PUBLICATIONS

Hitachi Cable America Inc., "Direct Attach Cables: OMNIBIT supports 25 Gbit/s interconnections". Retrieved from the Internet URL: www.hca.hitachi-cable.com/products/hca/catalog/pdfs/direct-attach-cable-assemblies.pdf, Aug. 10, 2017.
"File:Wrt54gl-layout.jpg-Embedded Xinu", Internet Citation, Sep. 8, 2006, Retrieved from the Internet URL: http://xinu.rnscs.edu/File:Wrl54gl-layout.jpg, Retrieved on Sep. 23, 2014.
Notification of reasons for refusal received for JP application No. 2018-170271, dated Oct. 15, 2019, 10 pages. (5 pages of english translation and 5 pages of official copy).
Agilent, "Designing Scalable 1 OG Backplane Interconnect Systems Utilizing Advanced Verification Methodologies," White Paper, Published, May 5, 2012.
Amphenol TCS, "Amphenol TCS expands the XCede Platform with 85 Ohm Connectors and High-Speed Cable Solutions," Press Release, Retrieved from the Internet URL: http://www.amphenol.com/about/news archive/2009/58, Feb. 25, 2009.
International Search Report and Written Opinion received for PCT application No. PCT/US2016/012848, dated Apr. 25, 2016, 11 pages.
International Preliminary Report on Patentability received for PCT Application No. PCT/US2016/012848, dated Jul. 20, 2017, 10 pages.
U.S. Appl. No. 61/714,871, filed Oct. 17, 2012, 53 pages.
Decision to Grant received for JP application No. 2019-078432, dated Sep. 1, 2020, 5 pages. (2 pages of English translation and 3 pages of official copy).
Notification of Reasons for Refusal received for KR application No. 10-2019-7013547, dated Aug. 18, 2020, 5 pages. (2 pages of English translation and 3 pages of official copy).
Decision to Grant received for Japanese Patent Application No. 2017-557303, dated Jul. 16, 2019, 5 pages. (2 Pages of English Translation and 3 pages of Official).
Decision to Grant received for related JP application No. 2019-149015 dated Nov. 10, 2020, 5 pages. (2 ages of English translation and 3 pages of Official copy).
First Office Action received for related CN application No. 201780007317.X, dated Apr. 9, 2019, 10 pages. (5 pages of English translation and 5 pages of Official copy).
Non-Final rejection received for U.S. Appl. No. 15/561,100, dated Oct. 31, 2018, 10 pages.
Notice of Allowance received for Japanese Application No. 2018-536097, dated May 28, 2019, 5 pages. (2 pages of English translation and 3 pages of Official notification).
Office Action received for CN Application No. 201910933045.7, dated Mar. 1, 2021, 21 Pages. (12 pages of English Translation and 9 pages of Official communication).
Office Action received for Japanese application No. 2019-149015, dated Oct. 6, 2020, 4 pages. (2 pages of English translation and 2 pages of official copy).
Office Action received for Japanese Patent Application No. 2017-557303, dated Nov. 6, 2018, 10 pages. (5 pages of English Translation and 5 pages of Official notification).

* cited by examiner

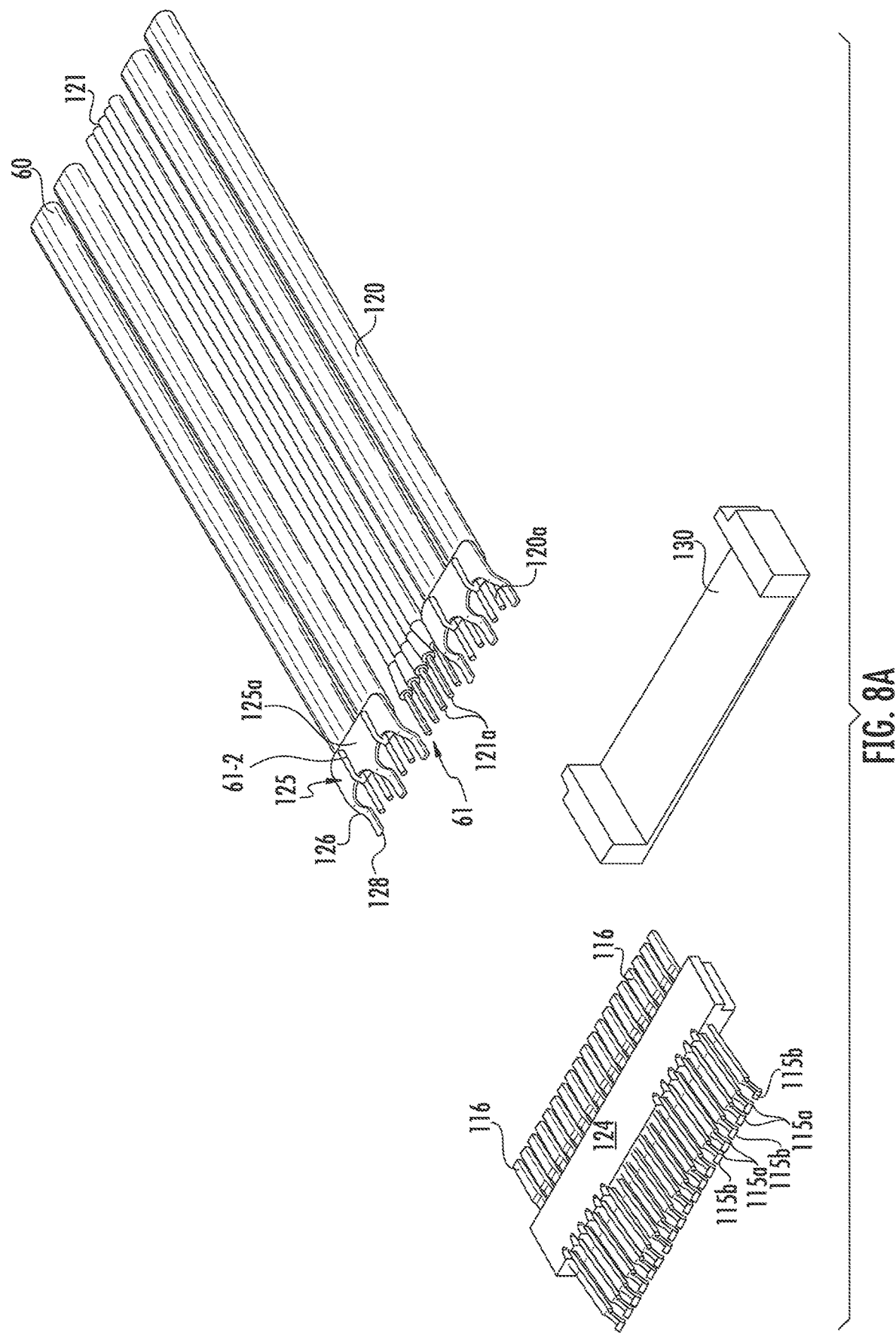

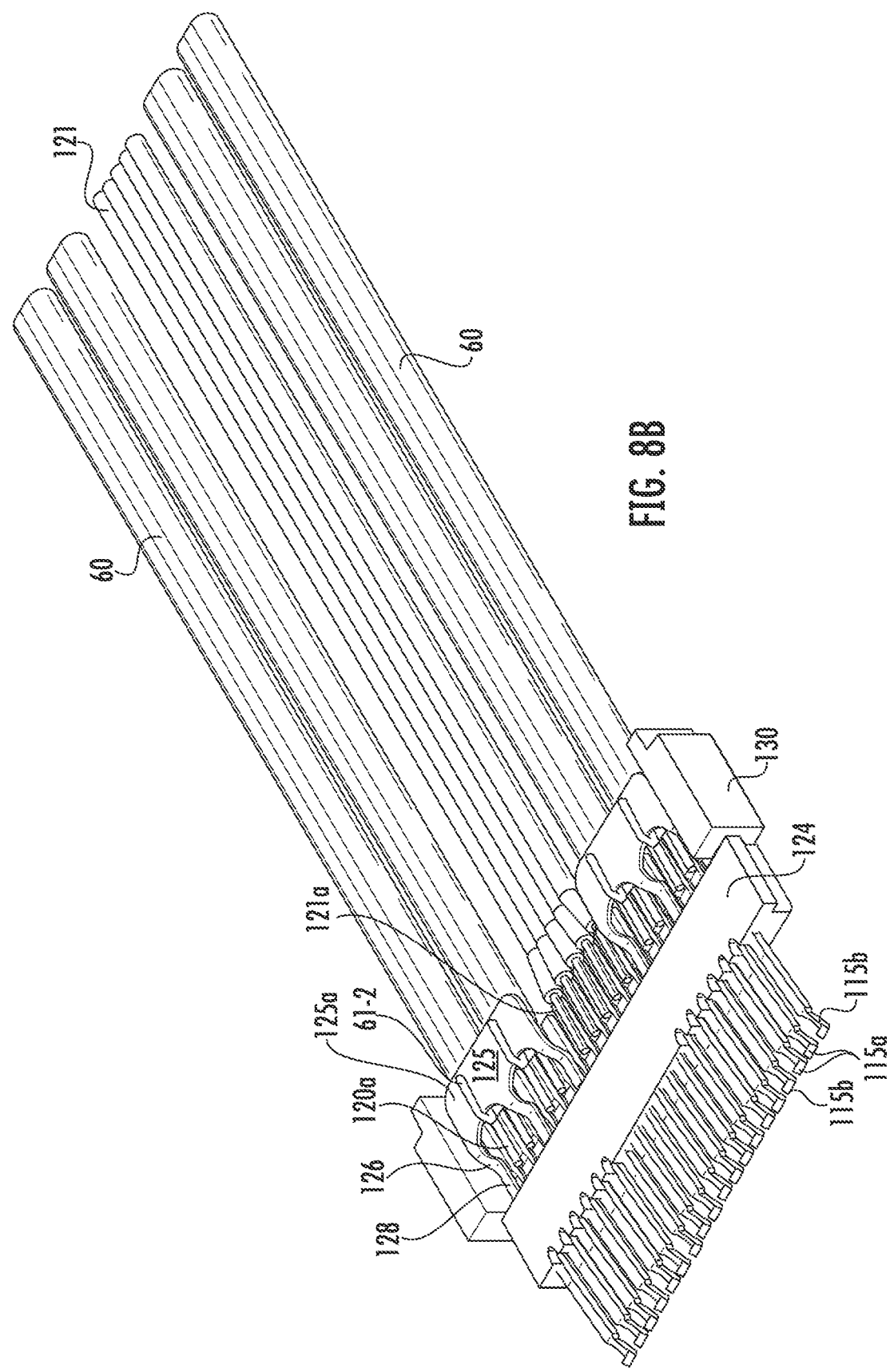

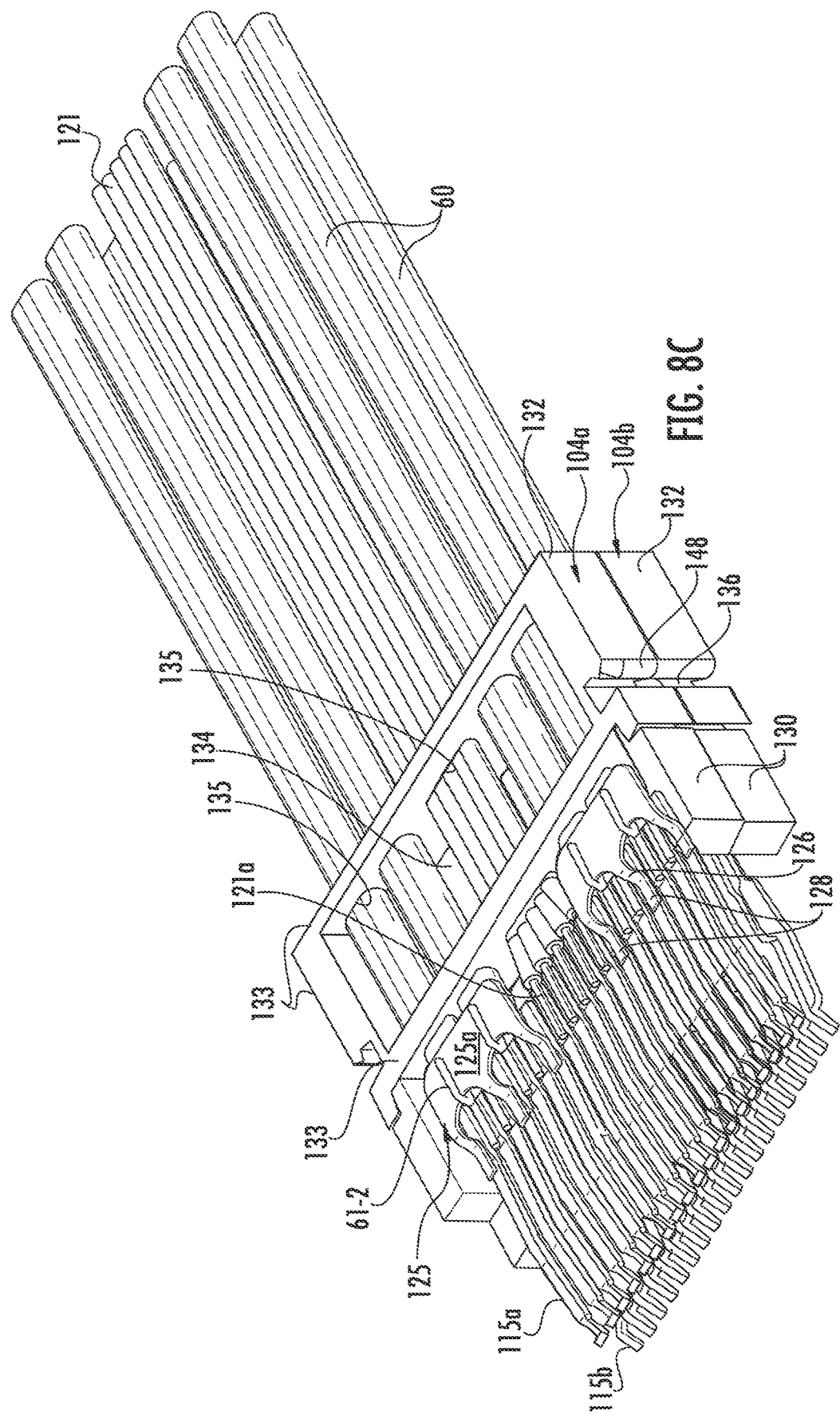

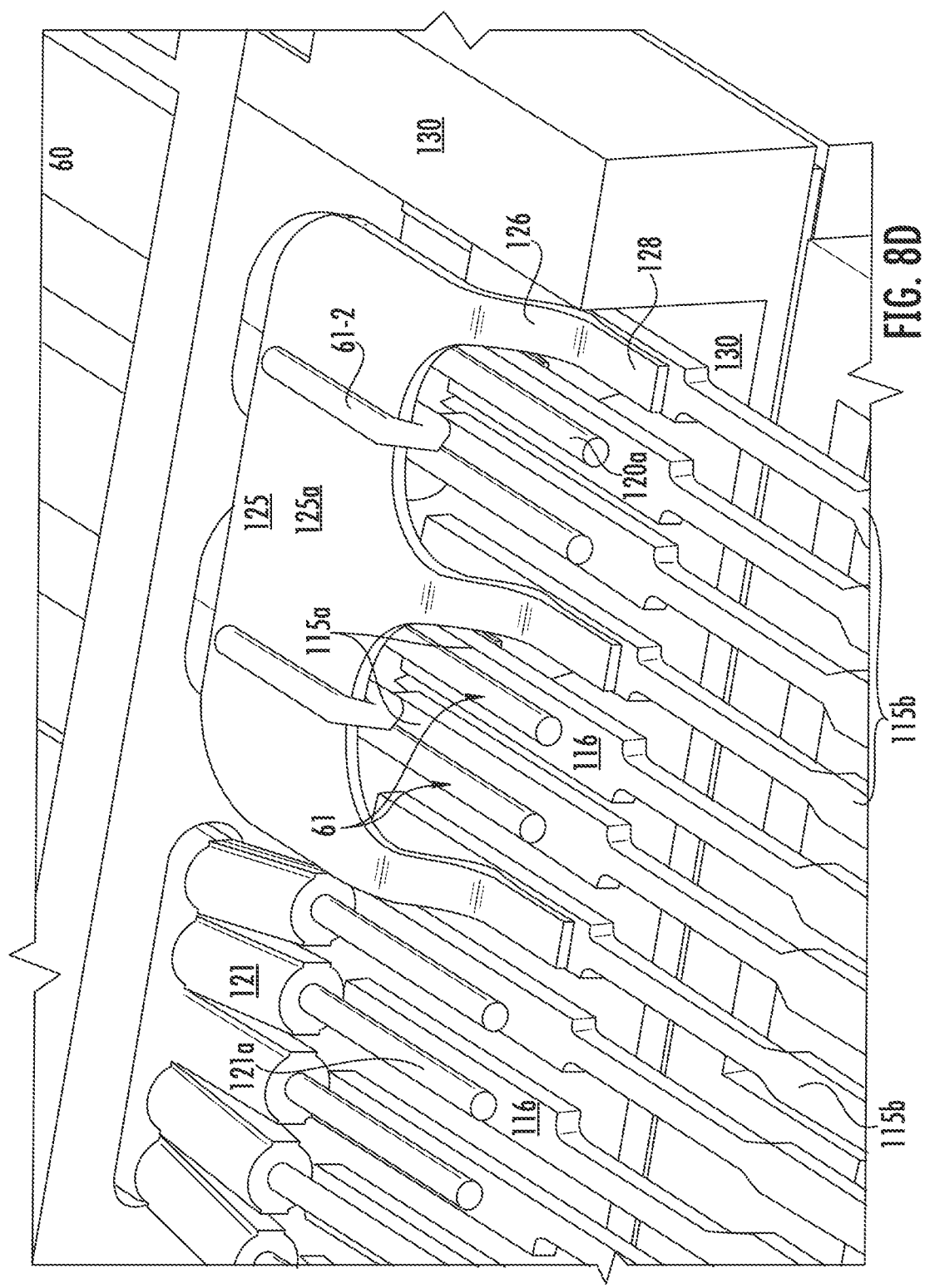

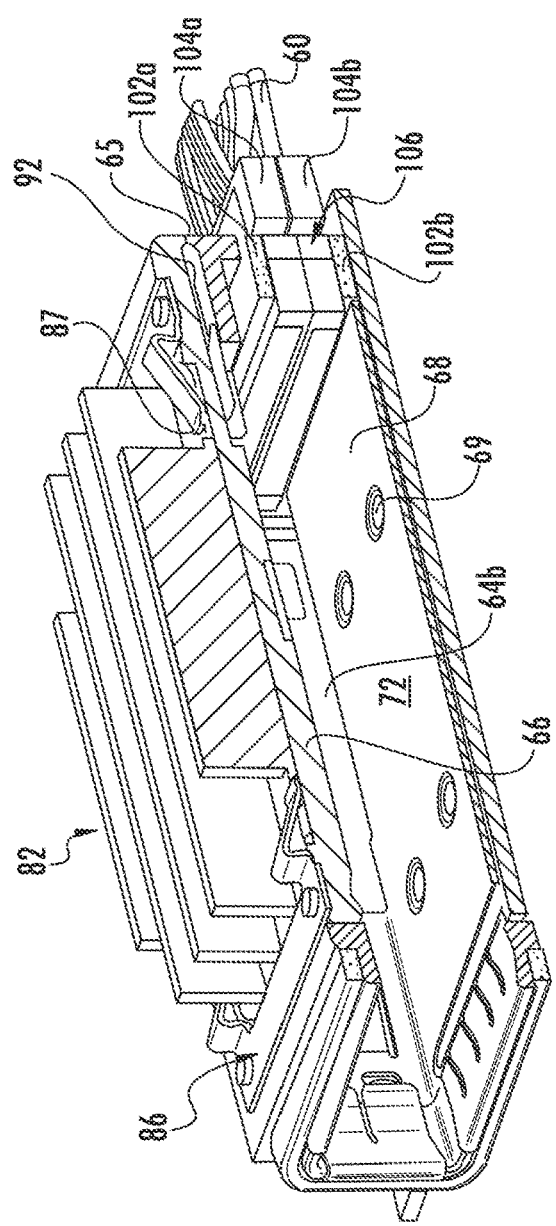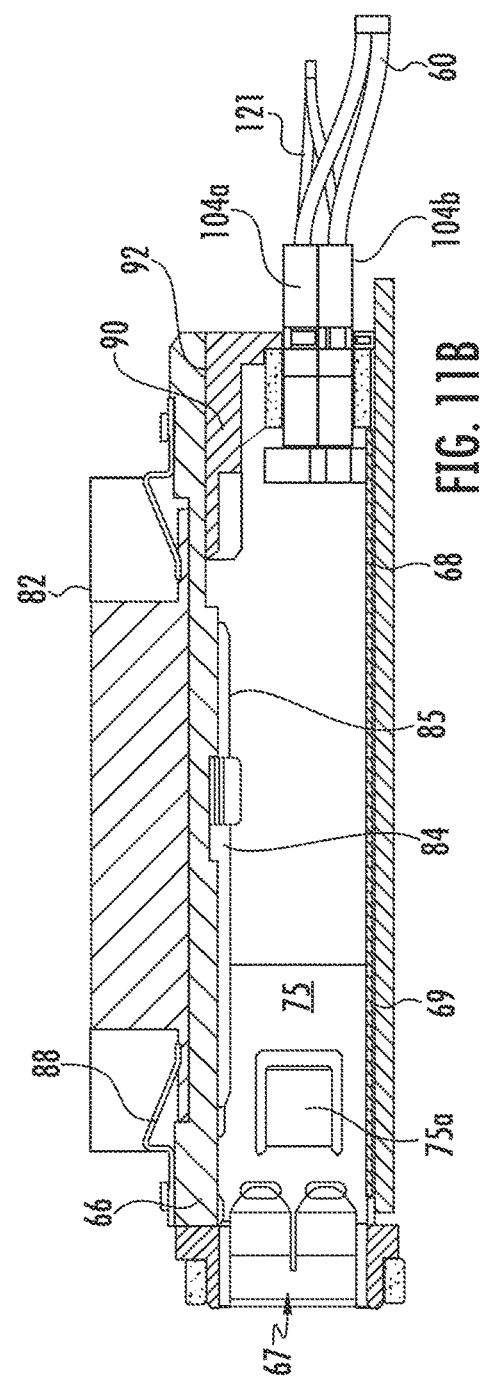

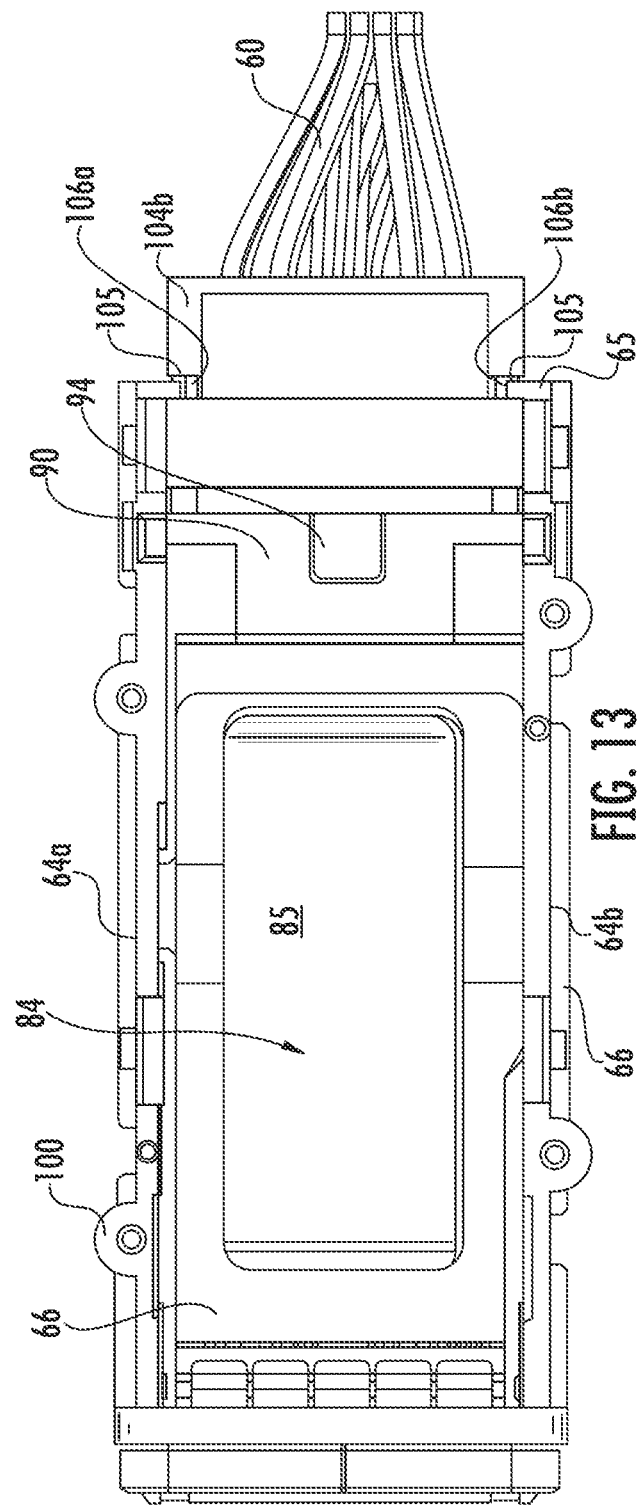

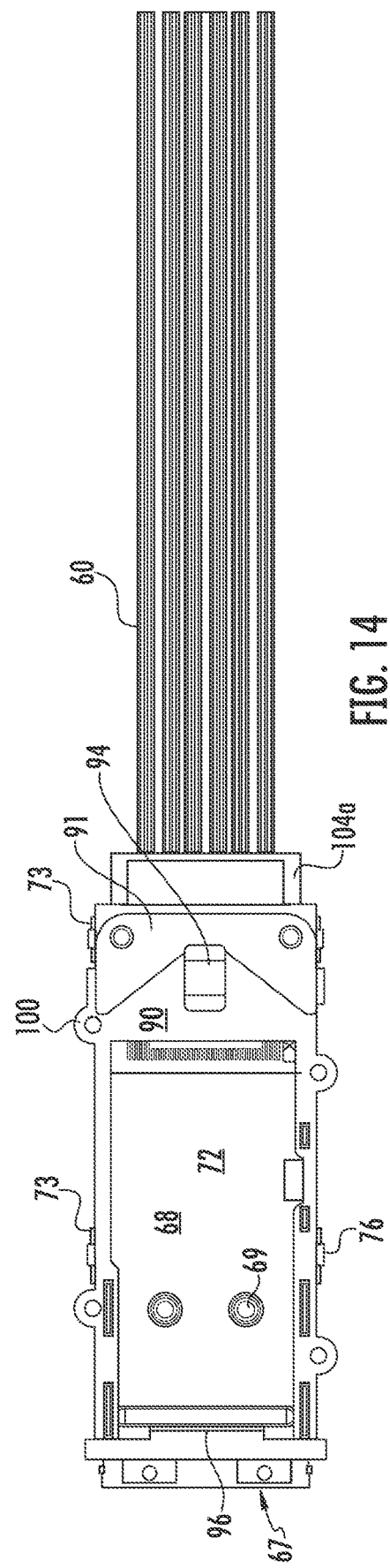

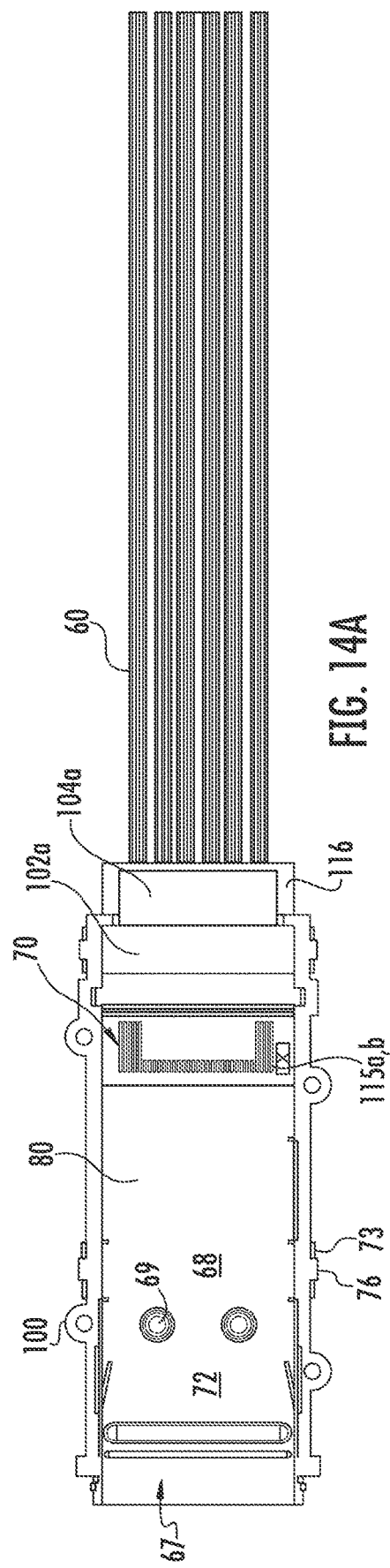

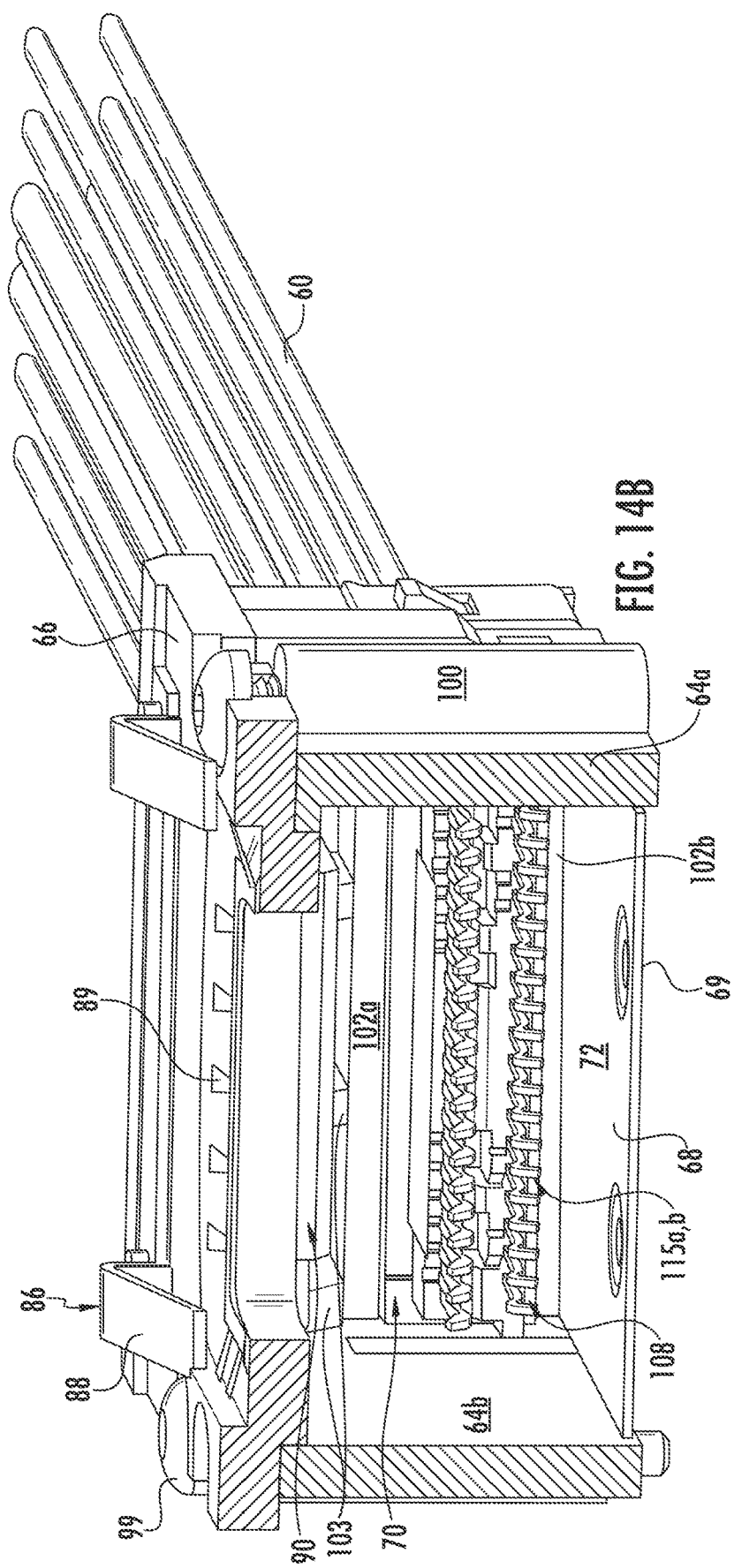

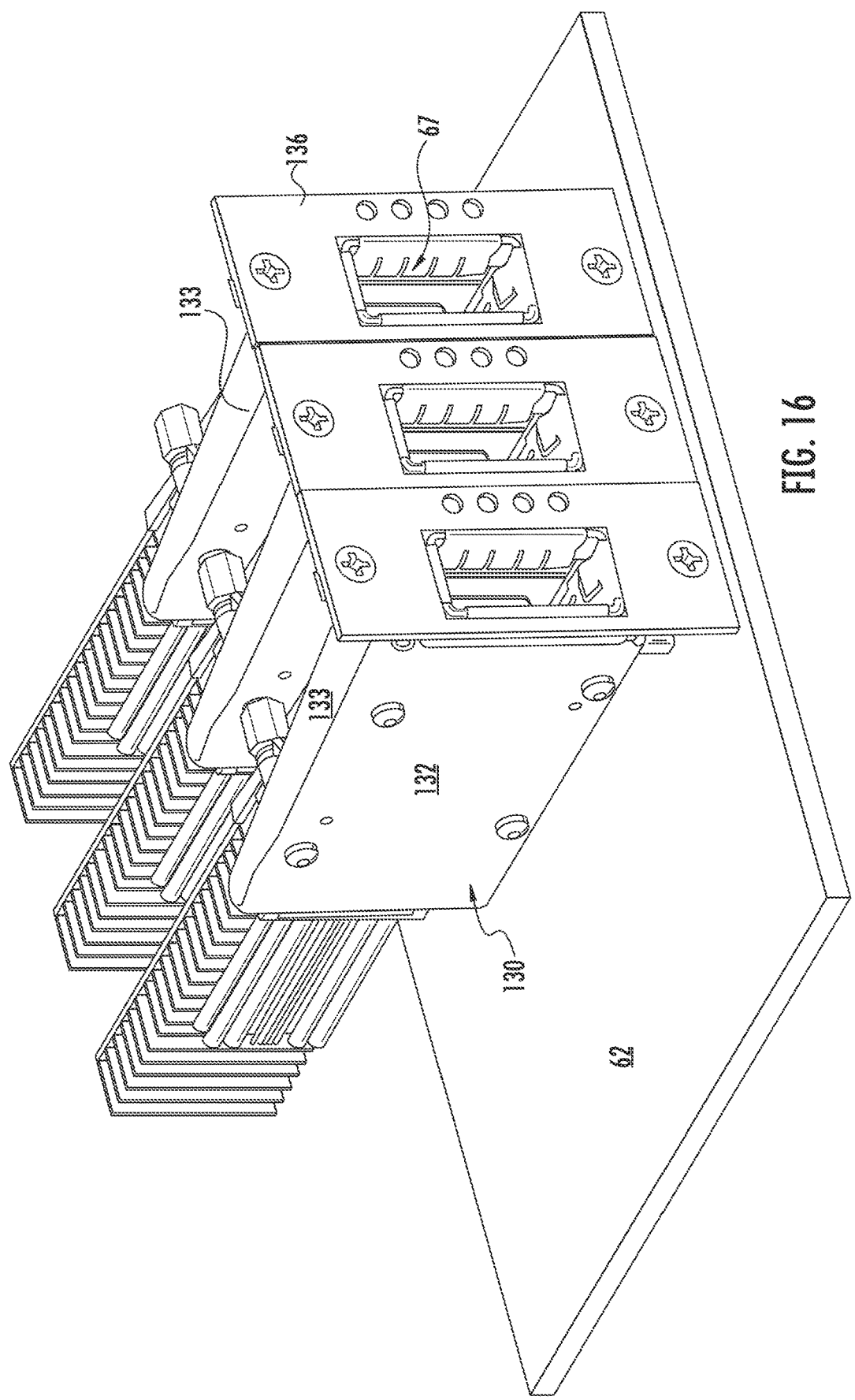

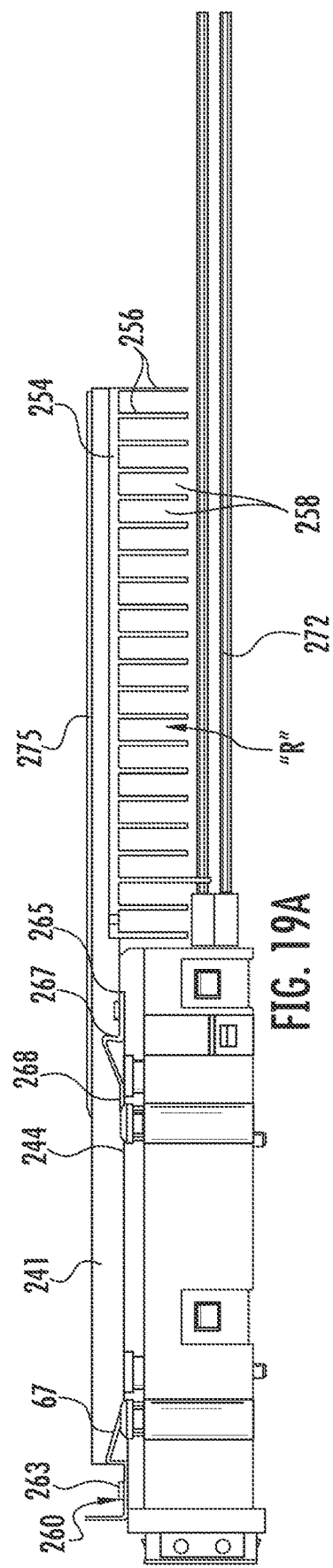

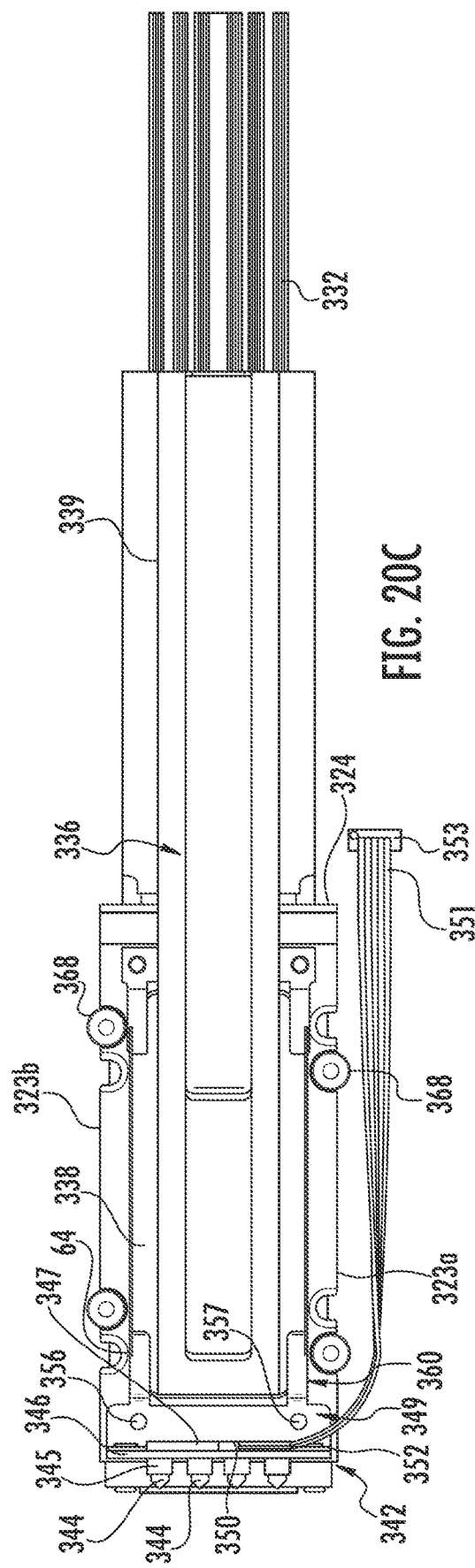

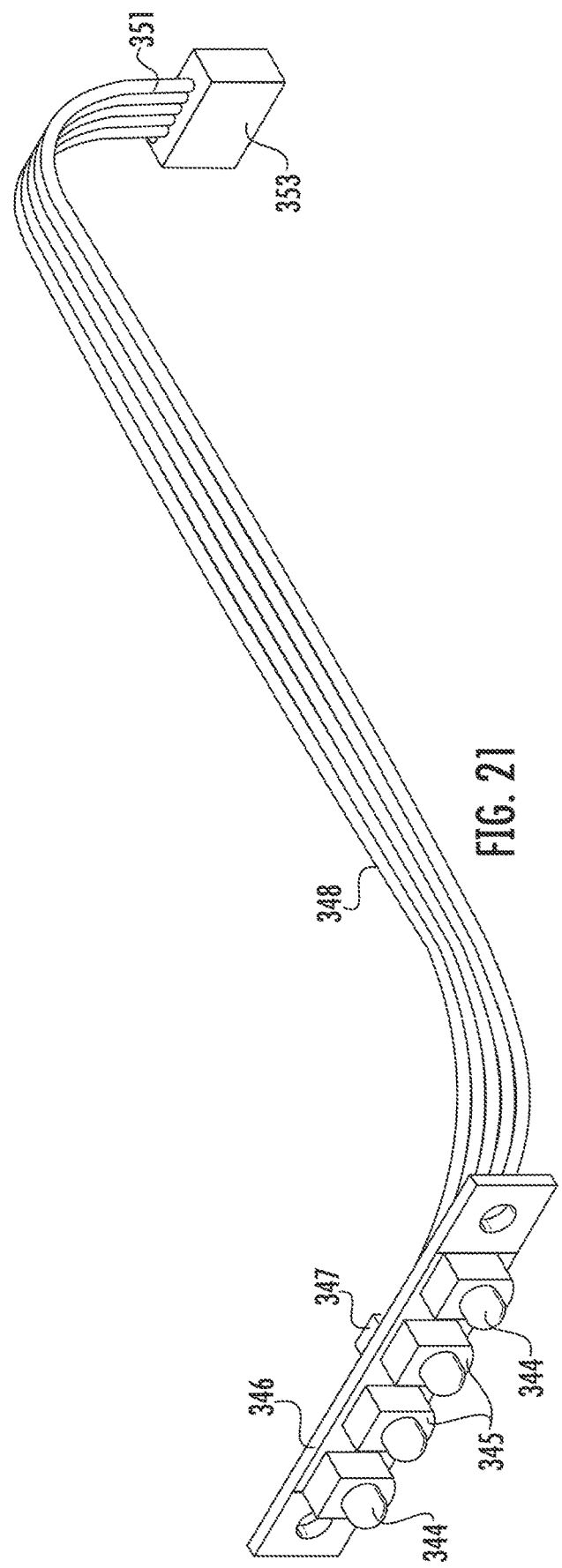

CIRCUIT BOARD BYPASS ASSEMBLIES AND COMPONENTS THEREFOR

RELATED APPLICATIONS

This application claims priority to U.S. Ser. No. 16/110,727, filed Aug. 23, 2018, now U.S. Pat. No. 10,637,200, which in turn claims priority to U.S. Ser. No. 15/541,775, filed Jul. 6, 2017, now U.S. Pat. No. 10,135,211, which in turn claims priority to International Application No. PCT/US2016/012848, filed Jan. 11, 2016, which in turn claims priority to prior U.S. provisional patent application No. 62/102,045, filed Jan. 11, 2015 entitled "The Molex Channel"; prior U.S. provisional patent application No. 62/102,046, filed Jan. 11, 2015 entitled "The Molex Channel"; prior U.S. provisional patent application No. 62/102,047, filed Jan. 11, 2015 entitled "The Molex Channel"; prior U.S. provisional patent application No. 62/102,048 filed Jan. 11, 2015 entitled "High Speed Data Transmission Channel Between Chip And External Interfaces Bypassing Circuit Boards"; prior U.S. provisional patent application No. 62/156,602, filed May 4, 2015, entitled "Free-Standing Module Port And Bypass Assemblies Using Same", prior U.S. provisional patent application No. 62/156,708, filed May 4, 2015, entitled "Improved Cable-Direct Connector"; prior U.S. provisional patent application No. 62/156,587, filed May 4, 2015 entitled "LED Indicator Light Assembly for Module Ports and Ports Incorporating Same"; prior U.S. provisional patent application No. 62/167,036, filed May 27, 2015 entitled "Wire to Board Connector with Wiping Feature and Bypass Assemblies Incorporating Same"; and, prior U.S. provisional patent application No. 62/182,161, filed Jun. 19, 2015 entitled "Wire to Board Connector with Compliant Contacts and Bypass Assemblies Incorporating Same", all of which are incorporated herein by reference in their entirety.

TECHNICAL FIELD

This disclosure relates to field of high frequency signaling

DESCRIPTION OF RELATED ART

The Present Disclosure relates generally to high speed data signal transmission line systems suitable for use in transmitting high speed signals at low losses from chips, or processors and the like to backplanes, mother boards and other circuit boards, and more particularly to an assembly that interconnects the chip package of a device to entry and exit connectors without utilizing traces on a circuit board, shielded connector ports for the entry and/or exit connectors, heat sinks for the connector ports, cable-direct connectors utilized in the shielded connector ports and indicator light assemblies utilized with the connectors and connector ports.

Electronic devices such as routers, servers, switches and the like need to operate at high data transmission speeds in order to serve the rising need for bandwidth and delivery of streaming audio and video in many end user devices. These devices use signal transmission lines that extend between a primary chip member mounted on a printed circuit board (mother board) of the device, such as an ASIC, FPGA, etc. and connectors mounted to the circuit board. These transmission lines are formed as conductive traces on or in the mother board and extend between the chip member(s) to external connectors or circuitry of the device.

Typical circuit boards are usually formed from an inexpensive material known as FR4, which is inexpensive. Although inexpensive, FR4 is known to be lossy in high speed signal transmission lines which transfer data at rates of about 6 Gbps and greater (e.g., above 3 GHz signaling frequencies). These losses increase as the frequency increases and therefore make FR4 material undesirable for the high speed data transfer applications at signaling frequencies of about 10 GHz and greater. In order to use FR4 as a circuit board material for high frequency signal transmission lines, a designer may have to utilize amplifiers and equalizers, which increase the final cost of the device.

The overall length of the signal transmission lines in FR4 circuit boards can exceed threshold lengths, about 10 inches, and may include bends and turns that can create signal reflection and noise problems as well as additional losses. Losses can sometimes be corrected by the use of amplifiers, repeaters and equalizers but these elements also increase the cost of manufacturing the final circuit board. This complicates the layout of the circuit board as additional board space is needed to accommodate these amplifiers and repeaters. In addition, the routing of signal transmission lines in the FR-4 material may require multiple turns. These turns and the transitions which occur at termination points along the signal transmission lines may negatively affect the integrity of the signals transmitted thereby. It then becomes difficult to route transmission line traces in a manner to achieve a consistent impedance and a low signal loss therethrough. Custom materials, such as Megtron, are available for circuit board construction which that reduce such losses, but the prices of these materials severely increase the cost of the circuit board and, consequently, the electronic devices in which they are used.

Integrated circuits (often referred to as chips) are the heart of these electronic devices. These chips typically include a processor such as an application specific integrated circuit (ASIC) chip and this ASIC chip has a die that can be connected to a substrate (its package) by way of conductive solder bumps. The package may include micro-vias or plated through holes which extend through the substrate to solder balls. These solder balls can comprise a ball grid array by which the package is attached to the motherboard. The motherboard includes numerous traces which designated define transmission lines that include differential signal pairs, ground paths associated with the differential signal pairs, and a variety of low speed transmission lines for power, clock signals and other functions. These traces are routed from the ASIC to the I/O connectors of the device into which external connectors are connected, as well as others that are routed from the ASIC to backplane connectors that permit the device to be connected to an overall system such as a network server or the like, or still others that are routed from the ASIC to components and circuitry on the motherboard or another circuit board of the device.

FR4 circuit board materials can handle data transmission speeds of 10 Gbits/sec, but this handling comes with disadvantages. Increased power is required to transmit signals over longer trace lengths, so designers find it difficult to provide "green" designs, as low power chips cannot effectively drive signals for such lengths. The higher power needed to drive the high speed signals over these lengths consumes more electricity and generates more heat that must be dissipated. Accordingly, these disadvantages further complicate the use of FR4 as a motherboard material used in electronic devices. Using more expensive, and exotic motherboard materials, such as Megtron, to handle the high speed signals at more acceptable losses increases the overall cost of electronic devices. Notwithstanding the low losses experienced with these expensive materials, they still require increased power to transmit their signals and incurred, and the turns and crossovers required in the design of lengthy board traces create areas of signal reflection and potential increased noise. Consequentially, certain individuals would appreciate further improvements.

SUMMARY

In accordance with the Present Disclosure, a bypass assembly is used to provide a high speed data transmission line extending between a device chip or chip set and backplanes or circuit boards. The bypass cable assemblies include cables which contain signal transmission lines that avoid, or bypass, the disadvantages of circuit board construction, no matter the material of construction, and which provide independent signal paths which have a consistent geometry and structure which resists signal loss and maintains impedances at acceptable levels.

In such applications, an integrated circuit having the form of a chip, such as an ASIC or FPGA, is provided as part of an overall chip package. The chip is mounted to a package substrate by way of conventional solder bumps or the like and may be enclosed within and integrated to the substrate by way of an encapsulating material that overlies the chip and a portion of the substrate. The package substrate has traces, or leads, that extend from the solder bumps on the chip bottom to a termination area on the substrate. Cables which are terminated to the substrate at their near ends, are used to connect the chip circuits to external interfaces of the device in which the chip is used, such as I/O connectors, backplane connectors and circuit board circuitry.

The chip package may include a plurality of contacts in the form of solder balls disposed on the underside of a chip package for providing connections to and from logic, clock, power and low-speed and high speed signal circuits to traces on the motherboard of a device in which the chip package is used. The contacts associated with the high speed signal circuits of the chip are removed from the bottom of the chip package inasmuch as the high speed traces are no longer routed to the bottom of the chip package. Some traces of the chip package may continue to be routed to the bottom of the package such as clock signals, logic signals, low speed signals and power. The termination locations for these traces are easily routed on the top of the chip package substrate where they can be easily connected to cables in a manner that maintains the geometry of the cable signal transmission lines. The high speed signal traces of the chip package are no longer routed through plated through holes, micro-vias, solder balls or a multilayer circuit board. Such a bypass assembly removes the signal transmission lines from the motherboard, not only alleviating the loss and noise problems referred to above, but also freeing up considerable space (i.e., real estate) on the motherboard, while permitting low cost circuit board materials, such as FR4, to be used for its construction.

Cables utilized for such assemblies are designed for differential signal transmission and preferably are twin-ax style cables that utilize pairs of signal conductors encased within dielectric coverings to form two wires, or a signal wire pair. The wire pairs may include associated drain wires and the three constituent wires of each such signal pair may further be enclosed within an outer shield in the form of a conductive wrap, braided shield or the like. In some instances, the two conductors may be encased in a single dielectric covering. The spacing and orientation of the wires that make up each such wire pair can be easily controlled in a manner such that the cable provides a transmission line separate and apart from the circuit board, and which may extend between a chip, chip set, component and a connector location on the circuit board or between two locations on the circuit board. The ordered geometry of the cables as signal transmission lines components is very easy to maintain and with acceptable losses and noise as compared to the difficulties encountered with circuit board signal transmission lines, no matter what the material of construction.

First ends of the wire pairs are typically terminated to corresponding chip packages and second ends these wire pairs are terminated directly to terminals of entry or exit port connectors, such as I/O and backplane connectors. In at least the terminations to one set of the connectors, the second ends of the wire pairs are terminated in a manner and spacing that emulates the ordered geometry of the cable so that crosstalk and other deleterious factors are kept to a minimum at the connector location and all of the connector terminals have the same length. The free ends of the signal terminal pairs are arranged in desired spacings and include associated grounds so that the ground associated with each wire pair may be terminated to a corresponding ground of the connector to define an associated ground that extends the entire length of the cable and its connector. This arrangement will provide shielding, and reduction of cross talk, by defining a ground plane to which the signal terminals can couple in common mode, while pairs of signal terminals can couple together in differential mode. The termination of the cable wires to the connectors is done in a manner such that to the extent possible, a specific desired geometry of the signal and ground conductors in the cable is maintained through the termination of the cable to the connector.

A single chip package may be provided that includes an integrated circuit mounted to a substrate. The substrate has termination areas to which first ends of a plurality of twin-ax cables are terminated. The lengths of the cables may vary and will be long enough for some of the cables to be easily and reliably terminated to first external interfaces in the form of a single or multiple I/O style connectors of the present disclosure which are part of an external connector port of either, or both of the entry and exit connectors. These connectors may be preferably mounted to a panel of the host device in a fashion that permits external connectors, such as plug connectors or pluggable modules to be mated therewith. The assemblies of the present disclosure may have their cables extend between entry connectors of the device and the chip package formed as an integrated assembly, or they may further include additional cables that extend between the chip package and exit connectors of the device. The first ends of the bypass cables may be configured so that they may be inserted into connectors on the chip packages so as to have "plug and play" capability. In this manner, the external connector ports can be inserted into the host device as single or ganged elements, each containing one or more signal transmission channels. The chip package may be supported within the housing of the device either solely or by way of standoffs or other similar attachments to a low cost, low speed motherboard.

Removing the signal transmission lines from the chip to the external connector ports off of the motherboard in this manner frees up space on the motherboard which can accommodate additional functional components to provide added value and function to the device, while maintaining a cost that is lower than a comparable device that utilizes the motherboard for signal transmission lines. Furthermore, incorporating the signal transmission lines in the cables of the bypass assembly reduces the amount of power needed to transmit high speed signals from the chip packages to the external connectors, thereby increasing the "green" value of the bypass assembly and reducing the operating cost of devices that use such bypass assemblies.

The cables extending between connectors of the present disclosure and the chip packages are of the "twin-ax" style, with two wires each with a signal conductor running lengthwise of the wire, enclosed in a dielectric covering. The pairs of wires are preferably terminated to receptacle connectors at the proximal ends of the cables and at their distal ends directly to the chip packages. The receptacle connectors are preferably contained within a port structure, such as a cage, adapter frame or the like and cooperate with the port structure to define a shielded module housing configured to receive an external connector, such as a pluggable module. The second ends of the cable wires are terminated directly to the terminals and grounds of the receptacle connectors, and the cables are preferable held in wafer-like supports to define terminal rows on opposing sides of card-receiving slots of the receptacle connectors. The cables exit the port structure through the rear wall thereof. By using this direct connection between the cable wires and receptacle connectors, a designer can avoid using connectors with right angle board connectors, which are known to create noise and impedance problems. The signal and ground terminals of this cable-direct connector all extend horizontally and are of the same length. This substantially removes the signal integrity and impedance discontinuity problems associated with right-angle connectors, which include terminals of different lengths.

Because the receptacle connectors are contained entirely within the port structure and not directly connected to a circuit board, the bottom wall of the housing can be continuous in its extent completely seal off the bottom of the housing which greatly improves the EMI performance of the connector port. The use of press-fit pins to mount the connector ports are also eliminated. Pairs of connector elements in the form of wafers are provided which fit into an opening in the rear of the receptacle connector. A primary ground plane is provided between the connector elements to block signal interference, such as crosstalk, between the signal terminals of the two connector elements. Accordingly, the connector ports of the present disclosure may be mounted individually to a face panel or a wall of the host device, or even interconnected with other ports to form an integrated assembly of ports that are suitable for vertical or horizontal stacking. Furthermore, if desired, the connector port can be positioned within the host device as an internal transition connector that can be supported on a circuit board, on standoffs or other supports or stand alone. This structure defines connector ports with high speed connectors that form signal transmission lines useful for high speed data applications at 10 Gbps or above and with low loss characteristics which bypasses circuit traces on the host device circuit board.

The operational speeds of the devices in which the above-described assemblies are use operate at high data transmission speeds and accordingly, generate heat during data transmission. The shielded connector port of the present disclosure may further include a heat sink assembly that extends into an interior portion of the housing and which is configured to make contact with the mating module inserted into the housing. The housing includes walls that cooperatively define the interior which houses a receptacle connector. Inasmuch as these housings may often be mounted along a face panel of the host device, a heat sink assembly is provided that includes a transfer portion which makes contact with the mating module inserted into the housing, and a dissipating portion connected thereto, which is uniquely spaced apart from the transfer portion in a horizontal direction. In this manner, the heat-dissipating portion extends rearwardly of the shielded housing and will include downward facing fins. This structure takes advantage of the open space behind the housing and may provide a reduction in overall height of the host device.

In order to provide indicator lights for use in association with the above described connectors ports that utilize the aforementioned heat sinks, an indicator light arrangement may be utilized that has a plurality of LEDs, either free standing or aggregated together in the form of a light bar which is mounted to the connector port proximate to the face panel or bezel of the host device. The LEDs are connected by flexible wires to circuits in the circuit board, and the wires permit flexibility in connecting the LEDs to circuitry which does not require ancillary structural supports as is the case with light pipes. The light bar may include one or more retaining clips, or arms, which are used to hold the heat transfer member of the heat sink, saving manufacturing cost by integrating the two members together.

This type of connection permits unobstructed airflow through an associated heat sink supported by the housing, furthers frees up space in the circuit board behind the housing, and saves cost in routing the mother board as the LEDs are no longer positioned behind, underneath or alongside the housing. This structure does away with the need for support members that attach to the cage to support conventional light pipes and thereby opens up the areas above and alongside the connector ports so that they can be stacked vertically or horizontally more easily. Still further such a structure permits the connector port to be used as a free-standing housing not supported by a circuit board as the internal receptacle connector has directly connected to its terminals, thereby eliminating impedance discontinuities normally associated with connector terminations to circuit board. The placement of the LEDs without using light pipes or any sort of elongated light transmission member also reduces the likelihood of crosstalk from occurring.

All of the components can be combined together in a manner so that the cables, cable-direct connector, connector housing, heat transfer member and indicator light bar all cooperatively form an integrated assembly that may be connected directly to a chip package to define a high speed transmission channel assembly that does not utilize lossy traces on a circuit board. Such a transmission channel assembly may also include a preselected chip in the chip package so that the entire assembly can be plugged into a host device after the bulk of the device has been fabricated. The use of integrated assemblies such as those described herein reduces the number of assembly steps and the cost of manufacturing of the host devices.

BRIEF DESCRIPTION OF THE DRAWINGS

The present invention is illustrated by way of example and not limited in the accompanying figures in which like reference numerals indicate similar elements and in which:

FIG. 8A is an exploded view of one terminal array of the connector assembly, its associated ground plates and a set of corresponding cables and wires used in the connector assembly of FIG. 4;

FIG. 8B is the same view as FIG. 8A, but illustrating the components thereof in an assembled state to form a basic connector element;

FIG. 8C is a perspective view of two basic connector elements assembled together to form a receptacle connector terminal array;

FIG. 8D is an enlarged detail view of two of the cables in a connector element, illustrating the elevated ground plate structure utilized therewith;

FIG. 11A is a sectional view of the connector port of FIG. 11, taken along lines A-A thereof;

FIG. 11B is a side elevational view of FIG. 11A;

FIG. 13 is a bottom plan view of the connector port of FIG. 6A, with the bottom removed for clarity;

FIG. 14 is a top plan view of the connector housing with the top wall removed from the housing body and a portion of an edge card engaged with the internal connector;

FIG. 14A is the same view as FIG. 14, but sectioned at a level beneath the rear cover plate to illustrate the internal connector and the manner in which it engages the body of the connector housing;

FIG. 14B is a vertical sectional view taken through the housing body proximate to the front of the internal connector, with a portion of the internal connector housing removed for clarity to illustrate the hollow interior space of the module housing and the internal ribs thereof which contact the connector elements and hold an EMI absorbing pad in place thereof;

FIG. 16 is a perspective view of three module housings arranged vertically in a horizontal row on face plates of a device;

FIG. 19A is a side elevational of the module housing-heat sink assembly of FIG. 17, taken along the right side thereof;

FIG. 20C is a top plan view of the assembly of FIG. 20;

FIG. 21 is a perspective view of the indicator light assembly of FIG. 20, oriented as if it were attached to a connector port;

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

Accordingly, there is provided herein, an improved connector for use in a connector port that is connected directly to cables or wires, rather than traces on circuit boards to define signal transmission lines from the connector and directly to chips and processors of the host device, which are useful for high speed data applications at 10 Gbps and above and with low loss characteristics. Accordingly, the Present Disclosure is therefore directed to connectors and connector assemblies that are suitable for use in free standing external connector ports and which are directly connected to device components by cables, rather than use traces on circuit boards. The connectors have terminals and cables of equal length and the cables terminated to the connector bypass the circuit board traces and define high speed transmission lines for transmitting data signals, at 10 Gbps and greater, which have low loss characteristics and which are directly connected to the chips and processors of the host device.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
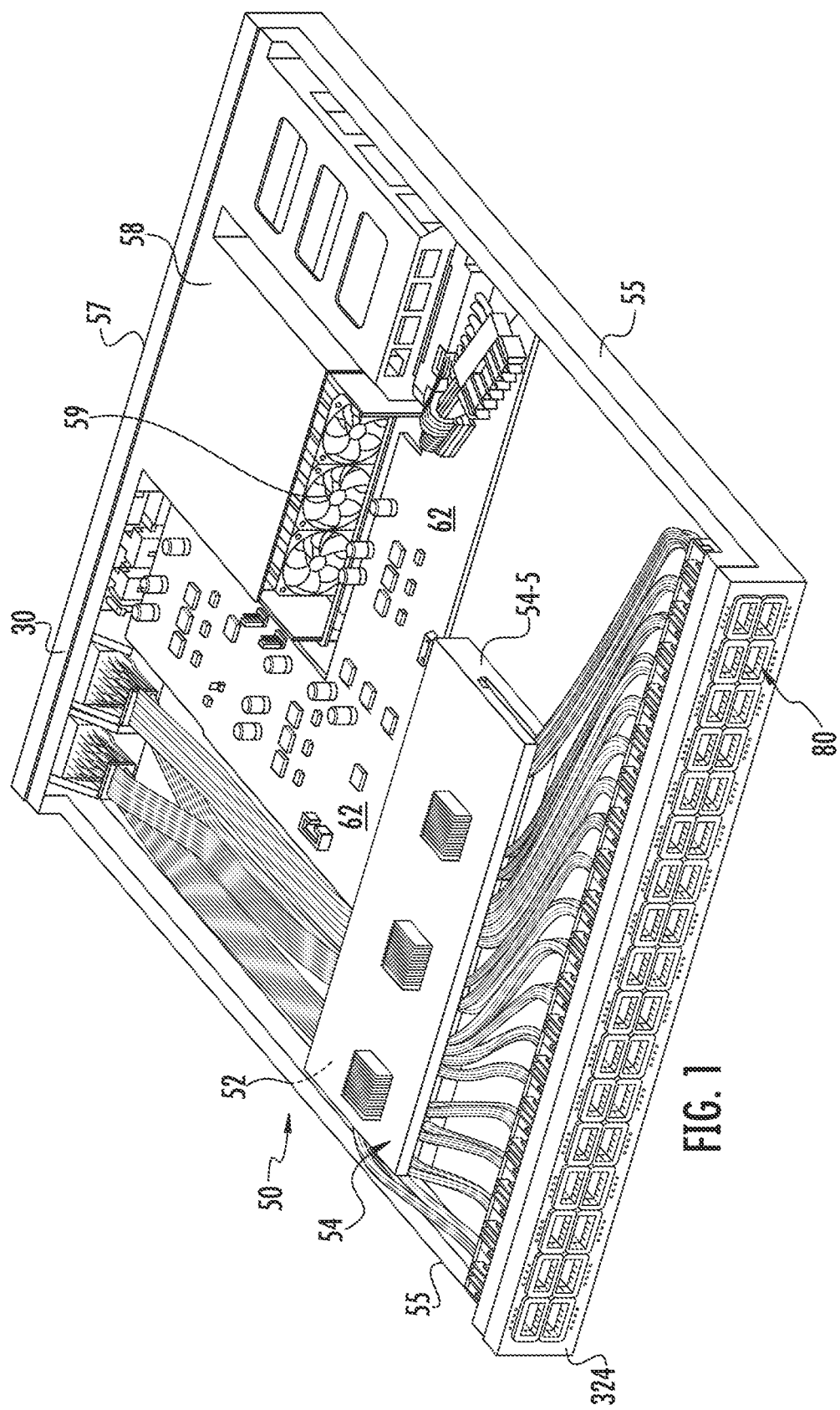
FIG. 1 is a perspective view of an electronic device, such as a switch, router or the like with its top cover removed, and illustrating the general layout of the device components and a bypass cable assembly in place therein.

FIG. 1 is a perspective view of a host electronic device 50 such as a switch, router, server or the like, and with the cover of the host device removed. The device 50 is governed by one or more processors, or integrated circuits, in the form of chips 52 that may be part of an overall chip package 54. The device 50 has a pair of side walls 55 and first and second walls, 374, 57. External connector ports 80 are provided in the first wall 374 (which can be a front wall) of the host device so that opposing mating connectors in the form of pluggable modules and the like may be inserted in order to connect to circuits of the device 50. Backplane connectors 30 may be provided in a second wall 57 (which can be a back wall) for connecting the device 50 to a larger device, such as a server or the like, including backplanes utilized in such devices. The device 50 includes a power supply 58 and cooling assembly 59 as well as a motherboard 62 with various electronic components thereupon such as capacitors, switches, smaller chips, etc.

Figure 3A:
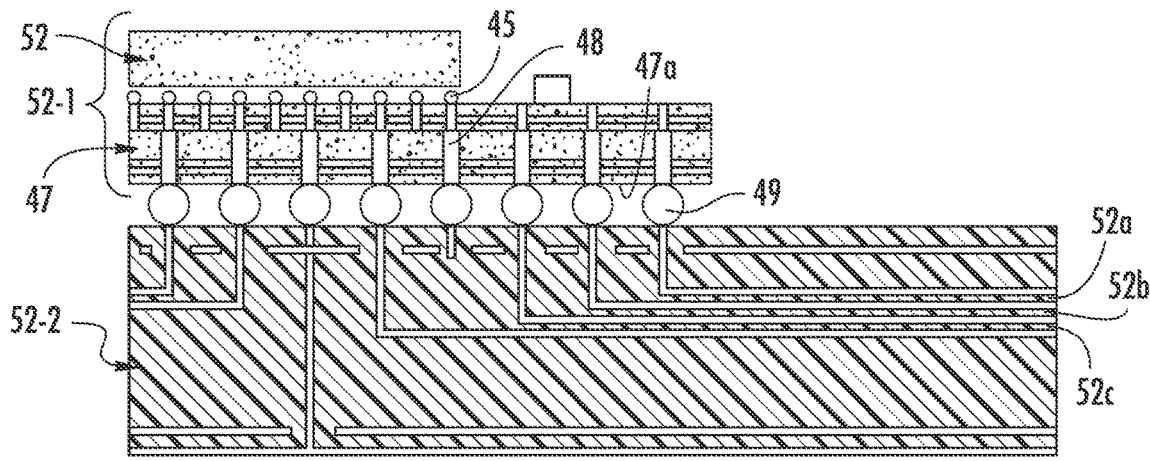
FIG. 3A is a schematic cross-sectional view of a known structure traditionally used to connect a chip package to a motherboard in an electronic device such as a router, switch or the like, by way of traces routed through or on the motherboard.

FIG. 3A is a cross-sectional view of a prior art conventional chip package and motherboard assembly that is used in conventional devices. The chip 52 may be an ASIC or any another type of processor or integrated circuit, such as a FPGA and may be one or more separate integrated circuits positioned together. Accordingly, the term chip will be used herein as a generic term for any suitable integrated circuit. As shown in FIG. 3A, the chip 52 has contacts on its underside in the form of solder bumps 45 that connect it to associated contact pads of a supporting substrate 47. The substrate 47 typically includes plated through-holes, microvias or traces 48 that extend through the body of the substrate 47 to its underside. These elements 48 connect with contacts 49 disposed on the underside 47a of the substrate 47 and these contacts 49 typically may take the form of a BGA, PGA or LGA and the like. The chip 52, solder bumps 45, substrate 47 and contacts 49 all cooperatively define a chip package 52-1. The chip package 52-1 is mated, by way of a socket (not shown) to a motherboard 52-2 made of FR4 material and used in a device. The motherboard 62 has a plurality of lengthy conductive traces 52a-c that extend from the chip package contacts 49 through the motherboard to other connectors, components or the like of the device. For example, a pair of conductive traces 52a, 52b are required to define differential signal transmission line and a third conductive trace 52c provides an associated ground that follows the path of the signal transmission line. Each such signal transmission line is routed through or on the motherboard and such routing has certain disadvantages.

FR4 circuit board material becomes increasing lossy and at frequencies above 10 Ghz this starts to become problematic. Additionally, turns, bends and crossovers of these signal transmission line traces 52a-c are usually required to route the transmission line from the chip package contacts 49 to connectors or other components mounted on the motherboard 52-2. These directional changes in the traces 52a-c can create signal reflection and noise problems as well as additional losses. Losses can sometimes be corrected by the use of amplifiers, repeaters and equalizers but these elements also increase the cost of manufacturing the final circuit board 52-2. This complicates the layout of the circuit board 52-2 because additional board space will be needed to accommodate such amplifiers and repeaters and this additional board space may not be available in the intended size of the device. Custom materials for circuit boards are available that reduce such losses, but the prices of these materials severely increase the cost of the circuit board and, consequently, the electronic devices in which they are used. Still further, lengthy circuit traces require increased power to drive high speed signals through them and, as such, they hamper efforts by designers to develop "green" (energy-saving) devices.

Figure 3B:
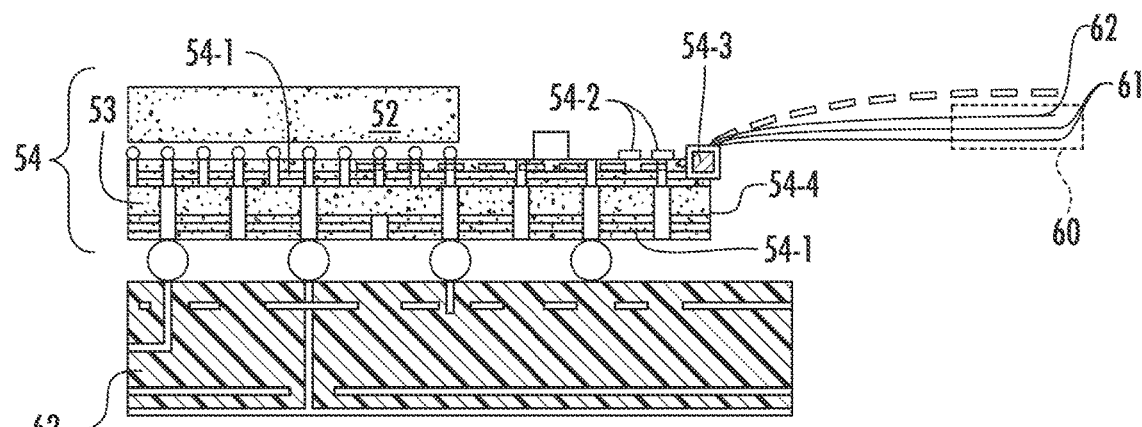
FIG. 3B is a schematic cross-sectional view, similar to FIG. 1A, but illustrating the structure of bypass assemblies such as that illustrated in FIG. 1, which are used to connect a chip package to connector ports or other connectors of the device of FIG. 1, utilizing cables and consequently eliminating the use of conductive traces as signal transmission lines on the motherboard as illustrated in the device of FIG. 1.

FIG. 3B is a cross sectional view of the chip package 54 of the device 50 of FIG. 1. The chip 52 contains high speed, low speed, clock, logic, power and other circuits which are connected to the chip package substrate 53. Traces 54-1 of the package 54 lead to associated contact pads 54-2 arranged in termination areas 54-3, that are preferably disposed at or proximate to edges 54-4 of the substrate 53. The chip package 54 may further include an encapsulant 54-5, such as an epoxy, that fixes the chip 52 in place within the package 54 as an integrated assembly along with associated cable connectors and other components. The chip package 54, as illustrated, be connected in part, to the motherboard by way of solder bumps 49, but such connections do not include high speed signal transmission lines in place on the motherboard 62.

Cables 60 are terminated to the package contact pads 54-2 by suitable wire-to-board connectors and the like, and these cables 60 are preferably of the twin-ax construction with two signal conductors 61 surrounded by a dielectric covering 61-1 with an associated drain wire 61-2 and an outer conductive covering 61-3 and a finished insulative outer jacket 61-4. (FIG. 2D.) As noted above, the cables 60 and their signal conductor pairs define high speed signal transmission lines that lead from the chip package 54 to the first (entry) or second (exit) connectors 80, 30. The ordered geometry of the cables maintains the signal conductors as pairs in a preselected spacing to control the impedance therethrough. Utilizing the cables as signal transmission lines eliminates the need to lay down high speed signal transmission lines in the form of traces on the motherboard, thereby avoiding high costs of exotic board materials and the losses associated with cheaper board materials such as FR4.

Figure 2:
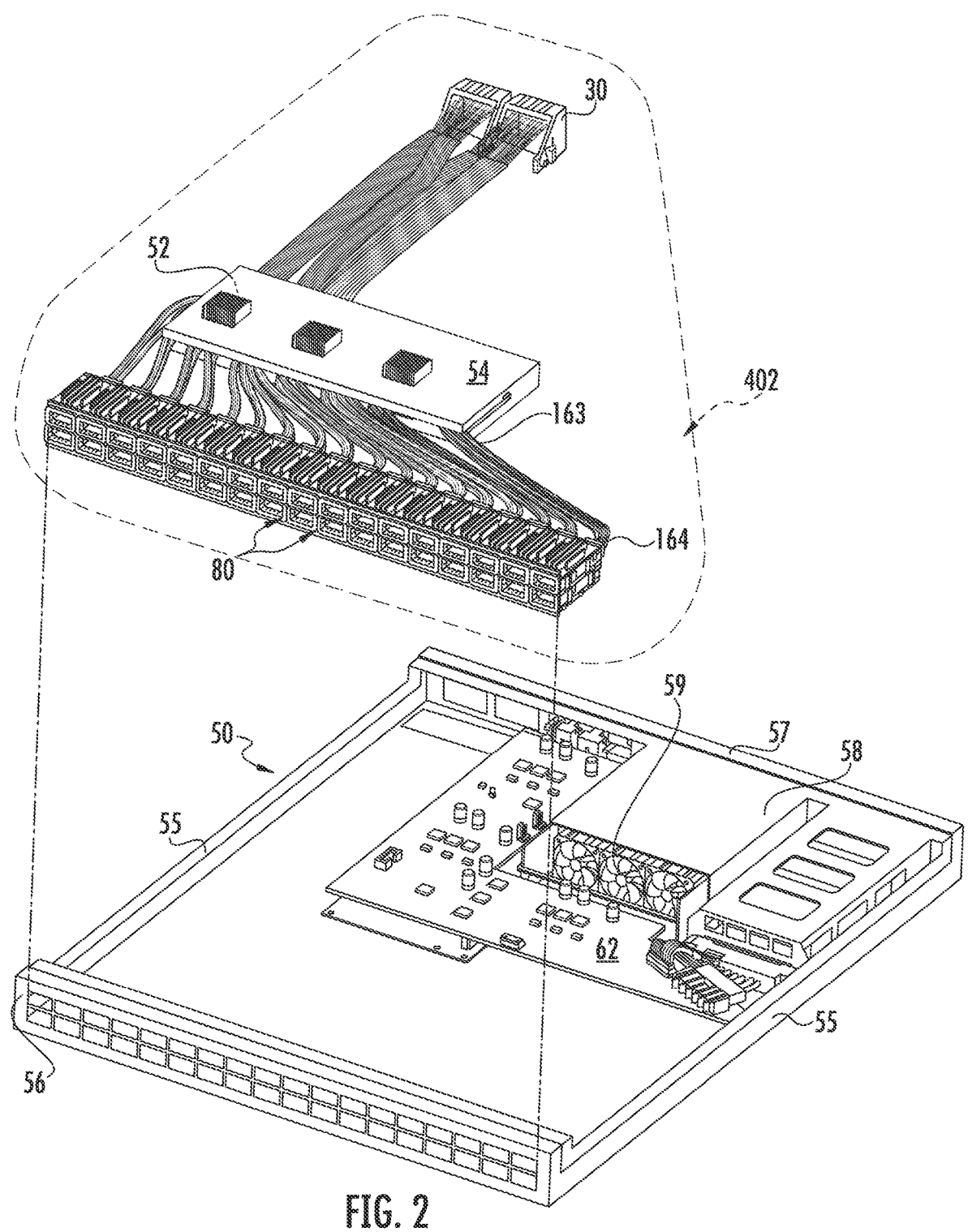
FIG. 2 is the same view as FIG. 1, with the bypass assembly removed from within the device for clarity.
Figure 2A:
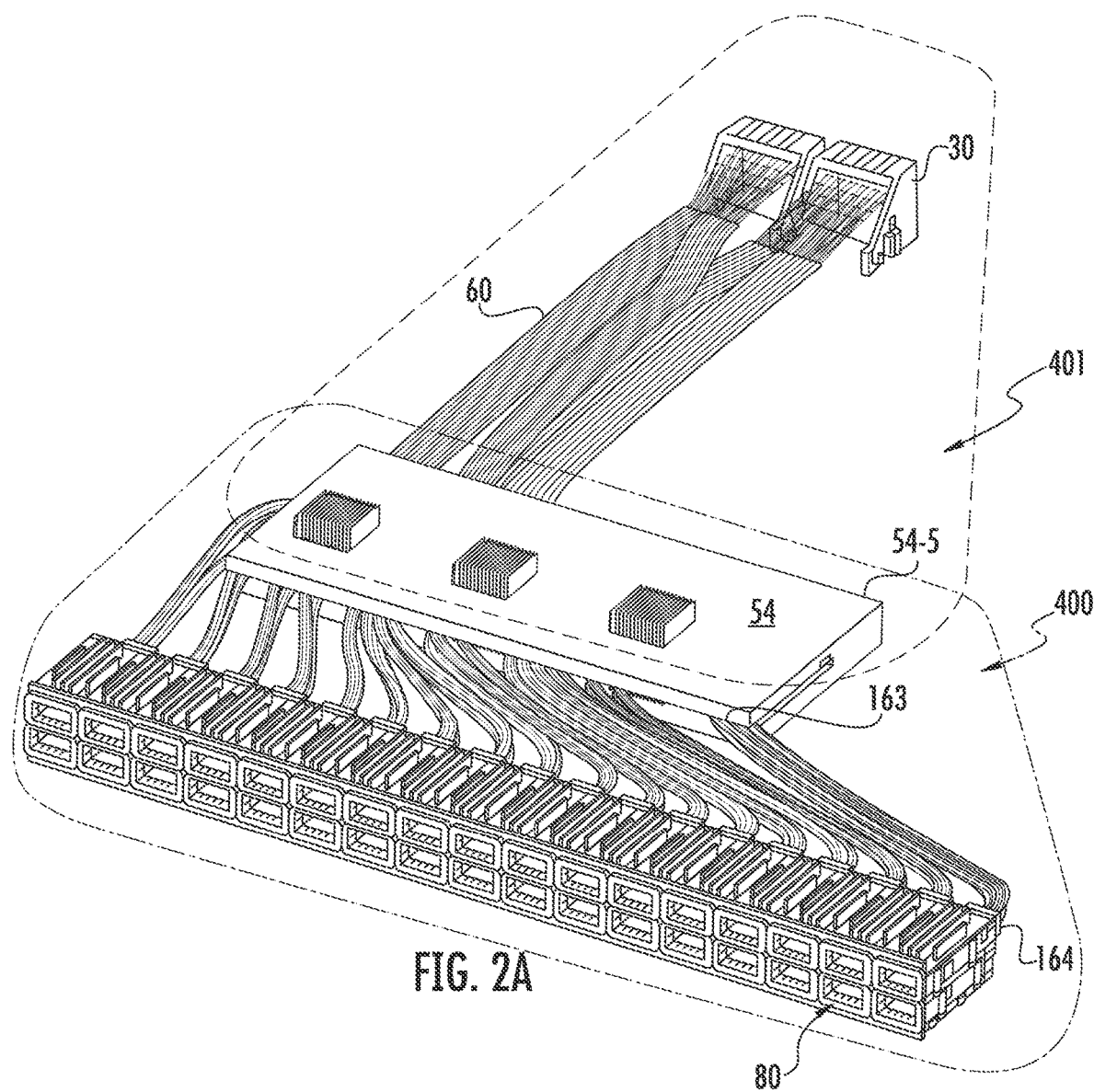
FIG. 2A is a perspective view of only the bypass assembly of FIG. 2.
Figure 2B:
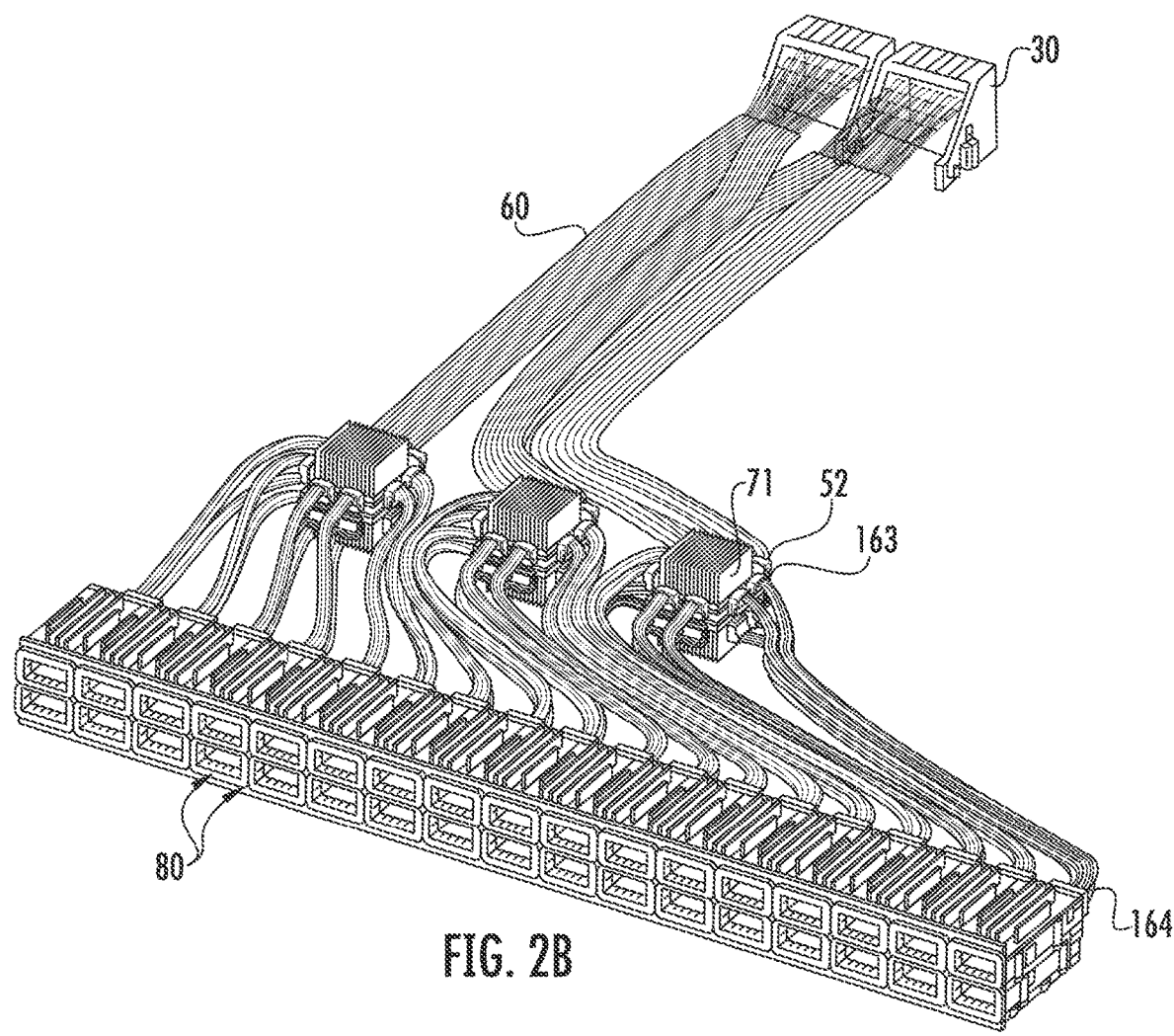
FIG. 2B is the same as FIG. 2A, but with the chip package substrate and/or encapsulant removed for clarity.
Figure 2C:
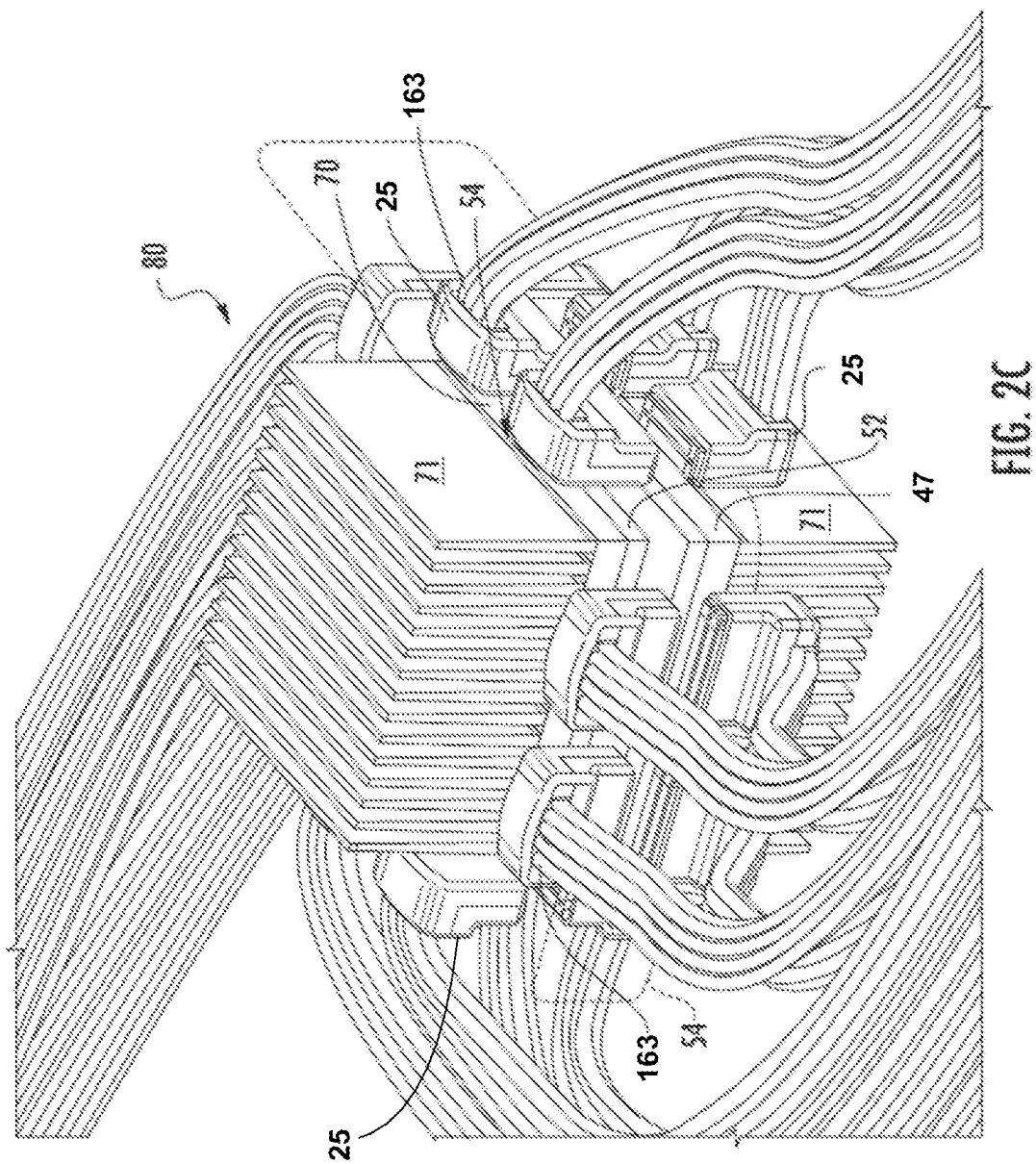
FIG. 2C is an enlarged detail view of the termination area surrounding one chip used in the bypass assembly of FIG. 1.
Figure 2D:
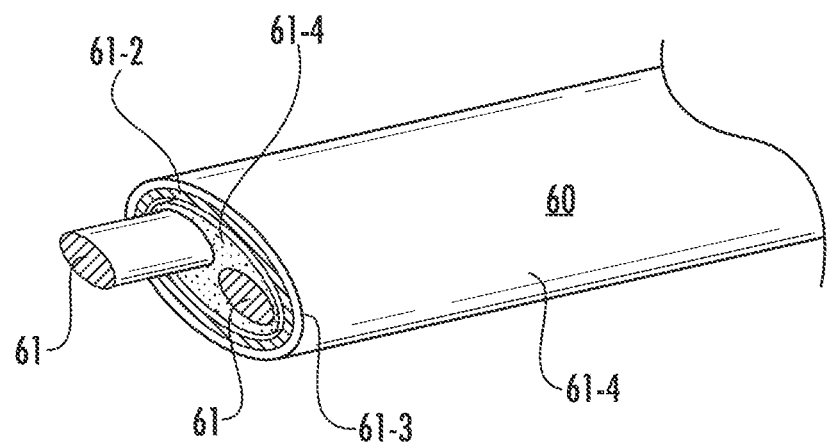
FIG. 2D is a perspective view of the end of a twin-ax cable used in the bypass assemblies of the present disclosure.

As illustrated in FIGS. 2-2C, the cables 60 have opposing first and second, or near and far ends 163, 164 that are respectively connected to the chip package 54 and the I/O connector ports 80 or backplane connectors 30 to define high speed signal transmission lines that bypass the motherboard. These connectors can be considered as "entry" and "exit" connectors of the host device in that they provide external interfaces for signals that first "enter" the device through, for example, the I/O connector ports 80 at the front of the device 50 and for signals that "exit" the device through the backplane connectors 30 shown at the rear of the device. The cables 60 maintain the ordered geometry of the signal conductors throughout the lengths they traverse to and from the chip via the external interfaces. The ordered geometry of the cables permits the cables to be turned, bent or crossed in their paths without introducing problematic signal reflection or impedance discontinuities into the transmission lines which can occur in circuit board signal transmission lines. The cables 60 are arranged in first and second sets of cables, with the first cable set extending between the entry connector ports and the chip package 54, and the second set of cables extending between the chip package 54 and the exit connectors 30 in the second wall 57 of the device. The manner in which the signal conductors of the cables 60 may be terminated to the chip substrate can vary. As illustrated in FIG. 2C, the cables 60 may be terminated by way of wire-to-board connectors 25, which mate with contacts on the chip package substrate 54, either on the surface thereof or in mating connectors. Heat sinks 71 may be attached to surfaces of the chips 52 as shown to dissipate heat, or integrated into the assembly by way of the encapsulant.

The chips, substrate, heat sink and cable connectors 25 may integrated together by way of an encapsulant or other means that holds them together as a single assembly as shown in FIGS. 2-2C. This structure permits a device designer to fully utilize the space available on the motherboard 62 for additional components and circuit which add value to the host device without the need for complex circuit board designs. These integrated assemblies can be inserted into devices by merely inserting the entry and exit connectors into respective openings in the front and back walls 374, 57 of the host device 50. Ancillary connectors may be provided for connecting the chip package to other circuits of the device as shown in FIG. 3B. The assemblies may also be provided in other forms, such as, for example: 1) without the chip package, but with the chip package substrate; 2) with the chip package and either the entry or exit connectors, shown respectively at 400 and 401 in FIG. 2A; and, 3) with both the entry and exit connectors arranged to extend to openings in the front wall of the device, as shown at 402 in FIG. 2. In this manner the assemblies 400, 401 and 402 may be inserted into a basic device to provide the device with its functionality without the need to design such functionality into the motherboard 62 of the hose device 50.

Figure 4:
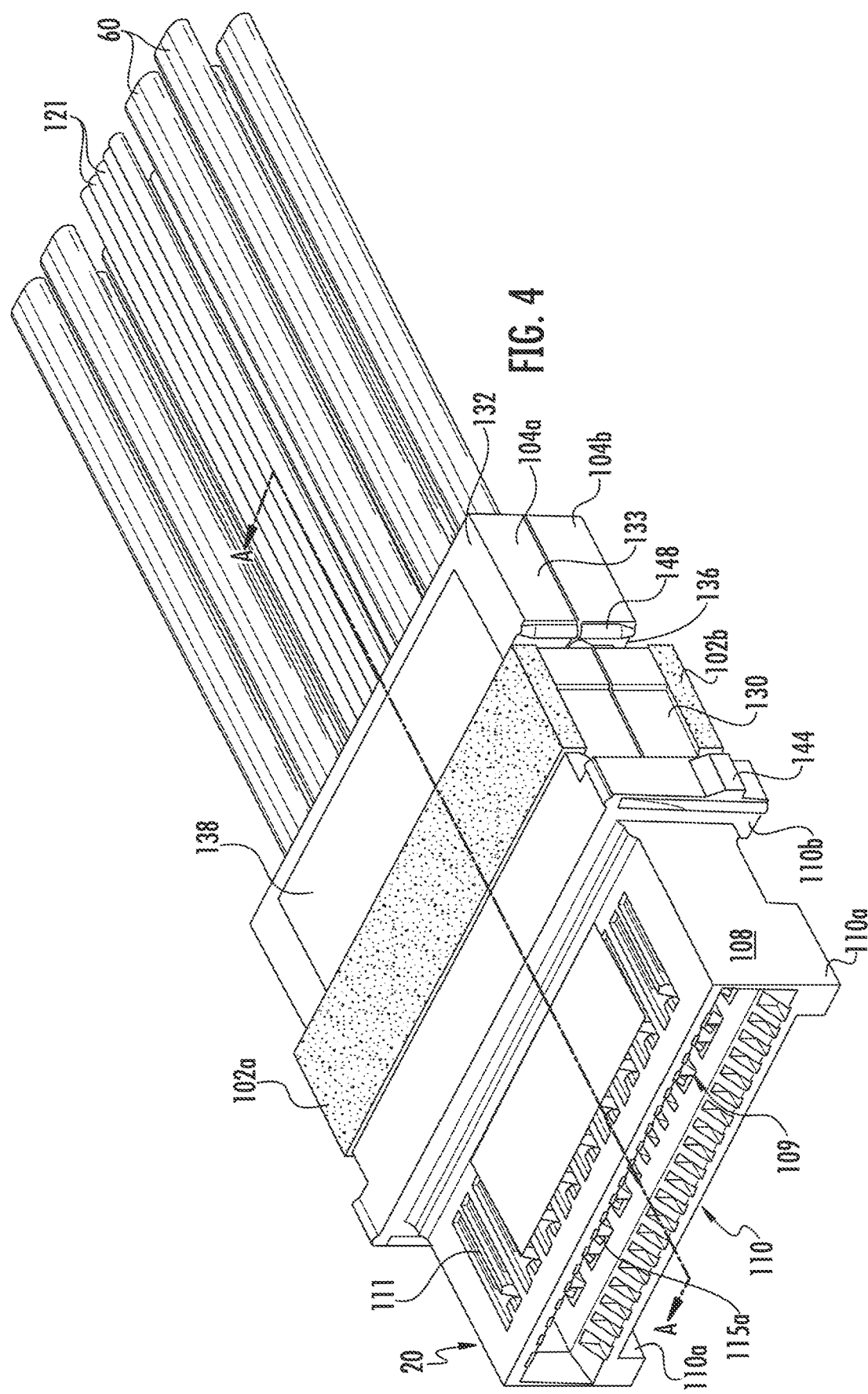
FIG. 4 is a perspective view of a cable-direct connector assembly constructed in accordance with the principles of the present disclosure.
Figure 4A:
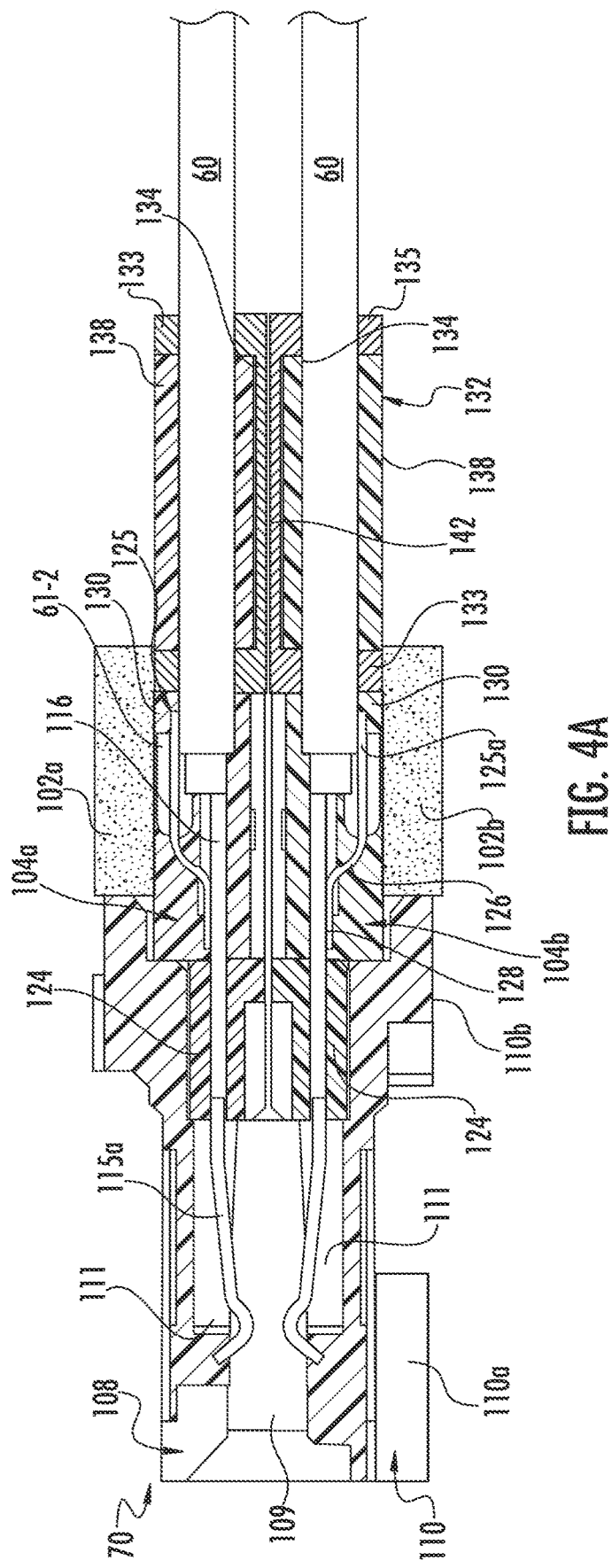
FIG. 4A is a sectional view of the connector assembly of FIG. 4, taken along lines A-A thereof.
Figure 7:
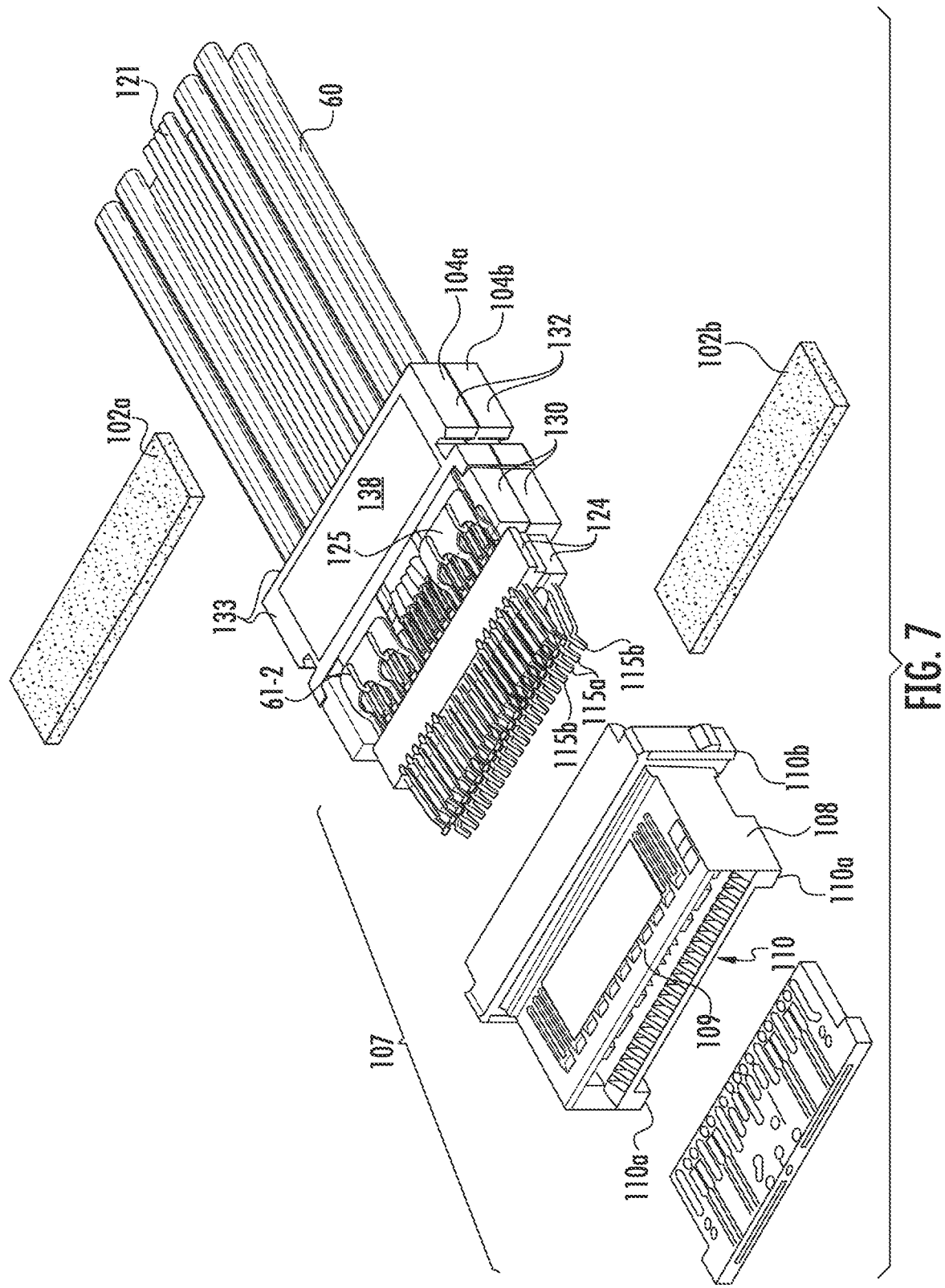
FIG. 7 is a partially exploded view of the connector assembly of FIG. 4.
Figure 8:
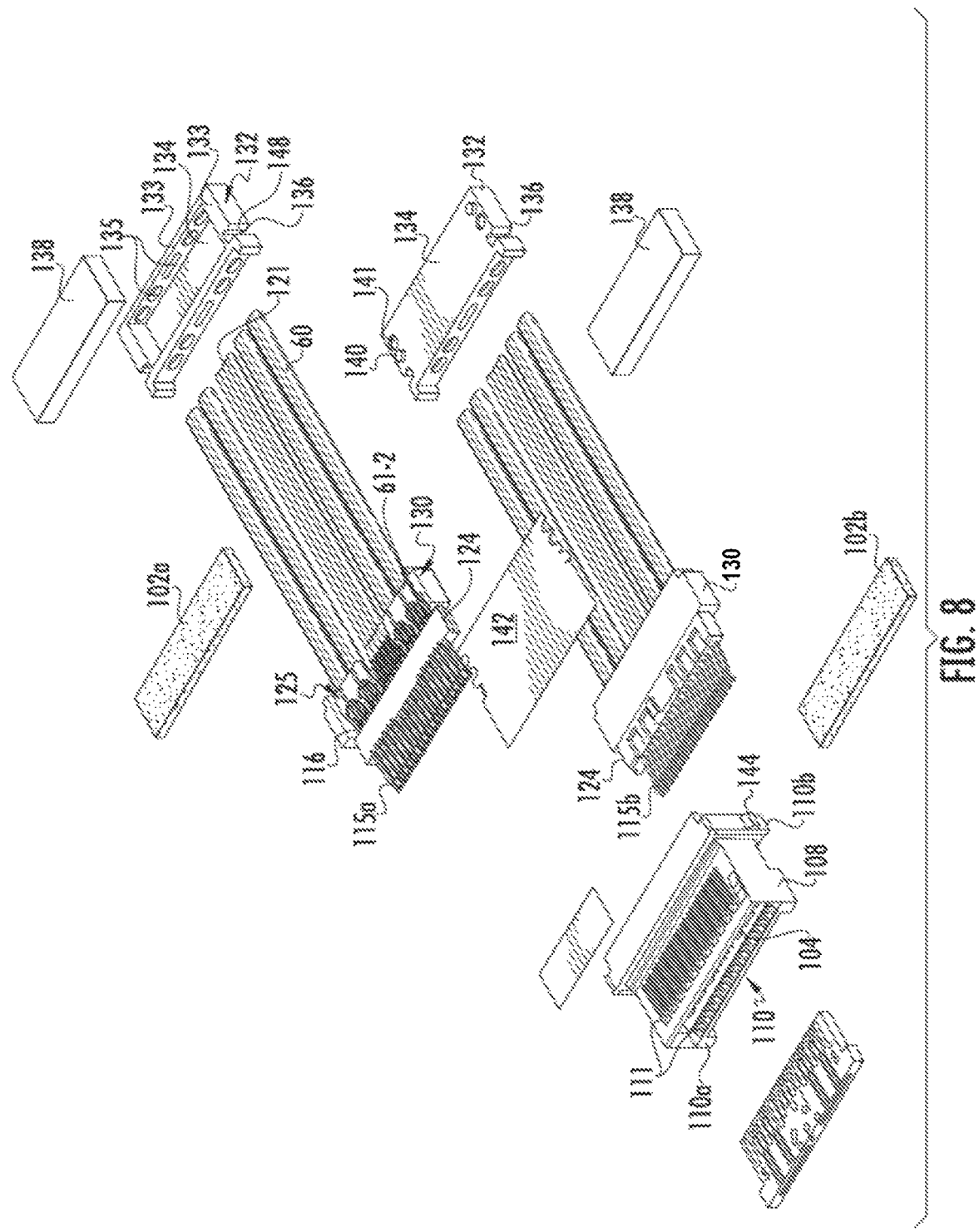
FIG. 8 is a more fully exploded view of the connector assembly of FIG. 7.
Figure 9:
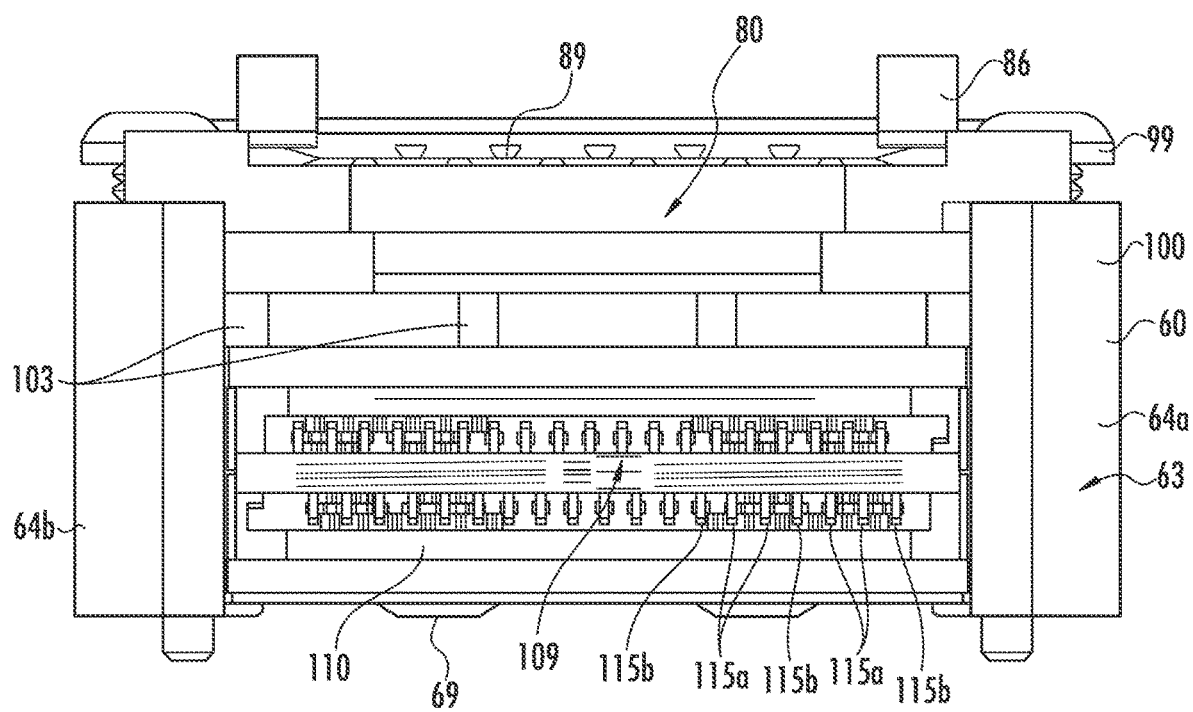
FIG. 9 is a front elevational view of the connector housing illustrating a portion of an edge card contacting the terminal contact portions of the connector assembly.

Turning to FIGS. 4, 7 & 8, an internal connector 70 constructed in accordance with the principles of the present disclosure is received within the connector ports 80 and includes an insulative body 108 that includes a card-receiving slot 109 that opens to the front of the connector 70 and to the entrance 67 of the port 80. The card-receiving slot 109 is positioned above a polarizing channel 110 formed by legs 110a, 110b that support the card-receiving slot 109 off of the bottom wall 68 of the port 80 and prevent incorrectly positioned opposing mating connectors from being inserted into the card slot 109. The connector body 108 has a plurality of terminal-receiving cavities 111 aligned on opposite sides of the card slot 109 which receive contact portions of cantilevered terminals 115a, 115b of two connector elements 104a, 104b. The connector elements 104a, 104b support the terminals 115a, 115b in respective single rows of terminals as illustrated in FIGS. 4A and 8C. The two connector elements 104a, 104b each have wafer-like configurations and are inserted into the connector body 108 from the rear to complete the internal connector assembly. The terminal arrays of each connector element 104a, 104b are thereby positioned on opposite sides of the card-receiving slot 109 as shown.

FIG. 8A illustrates the basic construction of a connector element 104 that is used in the connectors 70 of the present disclosure. A plurality of twin-ax cables 60 and regular wires 121 are arranged in an array extending widthwise of the connector 70. The ends of the wires 121 and cables 60 are stripped to expose the signal conductors 61 of the cables 60 as well as define free ends 121a, 120a of the wires and cables, respectively, for terminating to corresponding tail portions 116 of the connector terminals 115a, 115b. (FIG. 4A.) In the embodiment illustrated, pairs of the twin-ax cables 60 are located at the outer ends of the array, and the drain wires 61-2 of the twin-ax cables 120 are bent simply upwardly and then bent again to lie flat on their associated ground plates 125. The terminals 115a, 115b are held together in their own spaced apart widthwise array by a support bar 124. This largely maintains the geometry of the cable in the connector termination.

The receptacle connector 70 has a structure that promotes the signal integrity of data signals passing therethrough and which provides an impedance transition from the bypass cable wire pairs and the circuits of a circuit card of an opposing mating connector. This transition is from 85 to 100 ohms within a preselected tolerance level and is done in stages, or three zones so that the transition occurs in a gradual manner from an entry level impedance to a first transition impedance and then a second transition impedance and then finally to the final or third transition impedance. In this manner, the impedance transition occurs in a somewhat gradual manner over the entire length of the receptacle connector rather than occurring in the tail or the contact portions of that connector.

This gradual transition is provided by presenting three different dielectric mediums through which the receptacle connector terminals extend. The first zone medium is preferably a hot melt adhesive in which the impedance rises by about 6 ohms from the incoming impedance of about 85 ohms, and the second zone medium preferably includes LCP (liquid crystal polymer) where the impedance rises by about another 6 ohms, and finally the third zone medium includes air in which the impedance rises to about 105 ohms, thereby transition the impedance with a tolerance level of about 5%. The changes in surrounding medium are also accompanied by changes in the width of the terminals becoming wider or narrower in different zones. The distances between the terminals and associated ground planes can also contribute to this selected tuning of the impedance. The transition occurs over the length of the connector from the tails to the contact ends to present a gradual increase over a unit length rather than sole in either the tail or the contact portions of the terminals.

The termination areas of the cables/wires 120, 121 to the terminals 115a, 115b are disposed in a nest, or cradle 130, that extends widthwise and which is formed from an insulative material having a desired dielectric constant. (FIGS. 8A-8D.) The termination nest 130 has a U-shaped configuration and it is located adjacent the terminal support bar 124. In this area, the drain wires 61-2 of the cables 60 are joined to buss bars in the form of ground plates 125 that are positioned above the cables 60 and are spaced vertically apart from and above the terminal tail portions 116. The ground plates 125 have a plate body 125a with at least a partially planar surface which the drain wires 61-2 contact and to which the drain wires may be soldered, or otherwise connected.

Contact legs 126 are provided as part of the ground plates 125 in order to form contact portions 128 of the ground plates 125 that are preferably attached to the tail portions 116 of ground terminals of the connector 70. The contact legs 126 are vertically offset so that the ground plates 125 are spaced apart from and extend over at least a portion of the termination of the signal conductors to the signal terminal tail portions in the row of terminals associated with a corresponding connector element. As shown in FIGS. 8B-8D, each of the ground plates 125 preferably include three legs 126 which contact the ground terminals of the connector 70 in a manner such that any two signal terminal tail portions are flanked by two of the contact legs 126. This arrangement permits the spacing of the signal terminals to approximately match that of the signal conductors of the twin-ax cables 60 from an impedance perspective. In this manner, a G-S-S-G pattern of the terminals 115a, 115b is maintained for the internal connector 70 within the two rows of terminals on opposite sides of the card-receiving slot 109.

A rectangular frame 132 is provided along the rear of each connector element 104a, 104b and includes four walls 133 (FIG. 8) joined together around a bottom wall 134 to at least partially define a hollow interior recess 138. The front and rear walls 133 of the frame 132 are perforated as shown with openings 135 that are configured to accommodate the twin-ax cables 120 and the low power and logic control wires 121 in their longitudinal extent through the frame 132. The frame 132 is joined to the cradle 130, along its rear face, by an overmolded portion that fills the termination area. The connector element frame 132 is formed of a conductive material, such as metal, or may have an outer conductive coating, so that when in place within the connector port 80, the connector elements 104a, 104b make electrical grounding contact therewith. The connector element frames 132 are positioned adjacent to and rearward of the termination nest (FIG. 8C) and may be fixed to it as noted below.

The sidewalls 133 of the frame 132 may be slotted as shown with vertical slots 136. These slots 136 will engage the sidewalls 106a. 106b of the rear opening, or exit 106, of the connector port 80 and, because the frames are conductive, they can also alleviate EMI leakage out of the rear opening 106 of the connector port 80. The open recess 138 of the connector element frame 132 through which the cables and wires extend is filled with a dielectric material, such as a liquid crystal polymer ("LCP") that fixes the cables/wires in place in the recess 138 with respect to the connector element frames 132 and to the termination nest, which also receives some of the LCP. In this manner, the wafer-like configuration of the connector elements 104a, 104b is defined and this overall structure provides a measure of strain relief to the twin-ax cables 60.

Figure 6:
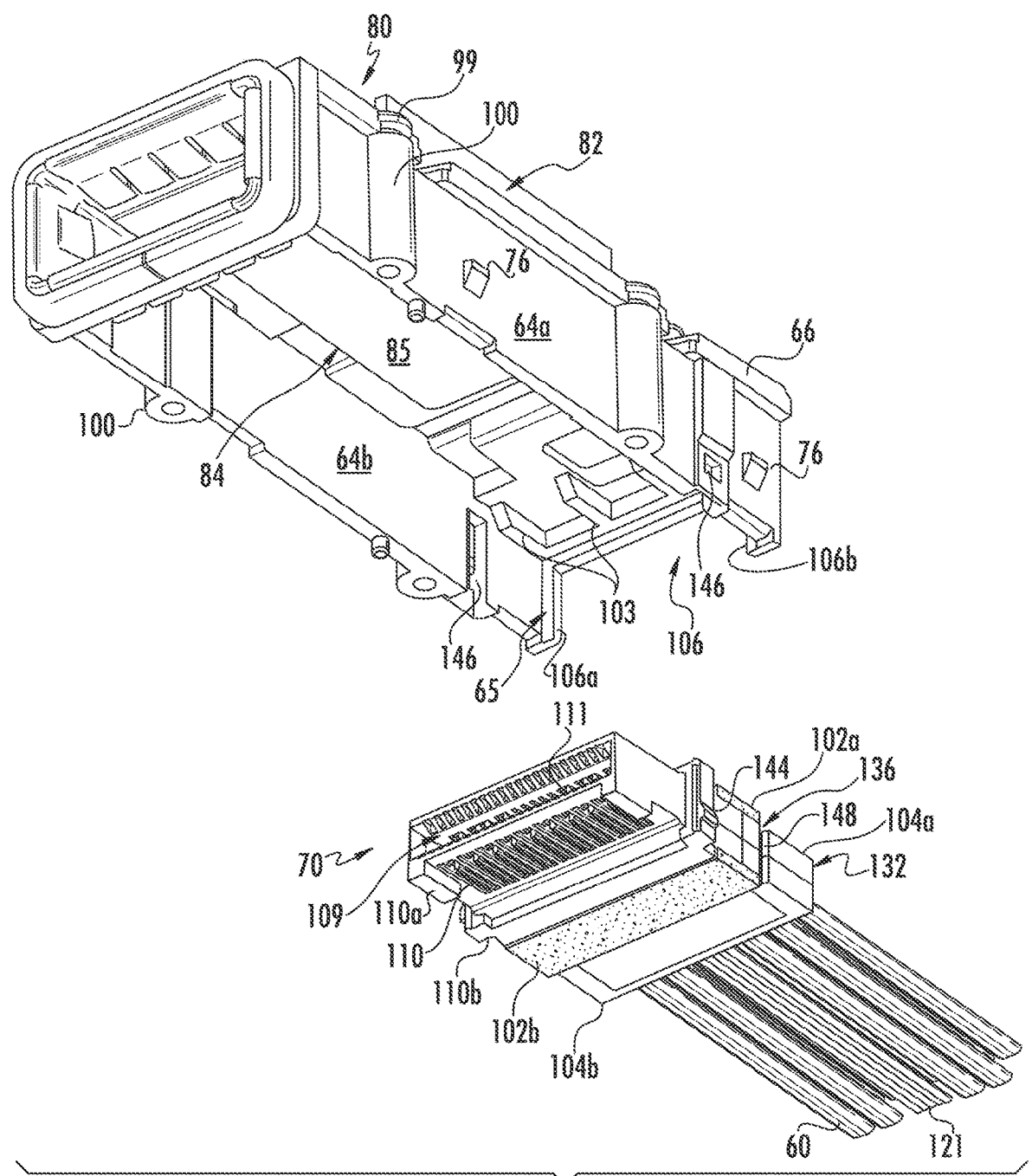
FIG. 6 is a perspective view taken from the bottom, of the connector housing of FIG. 5, with the bottom wall removed and the connector assembly removed out from inside of the housing.
Figure 6A:
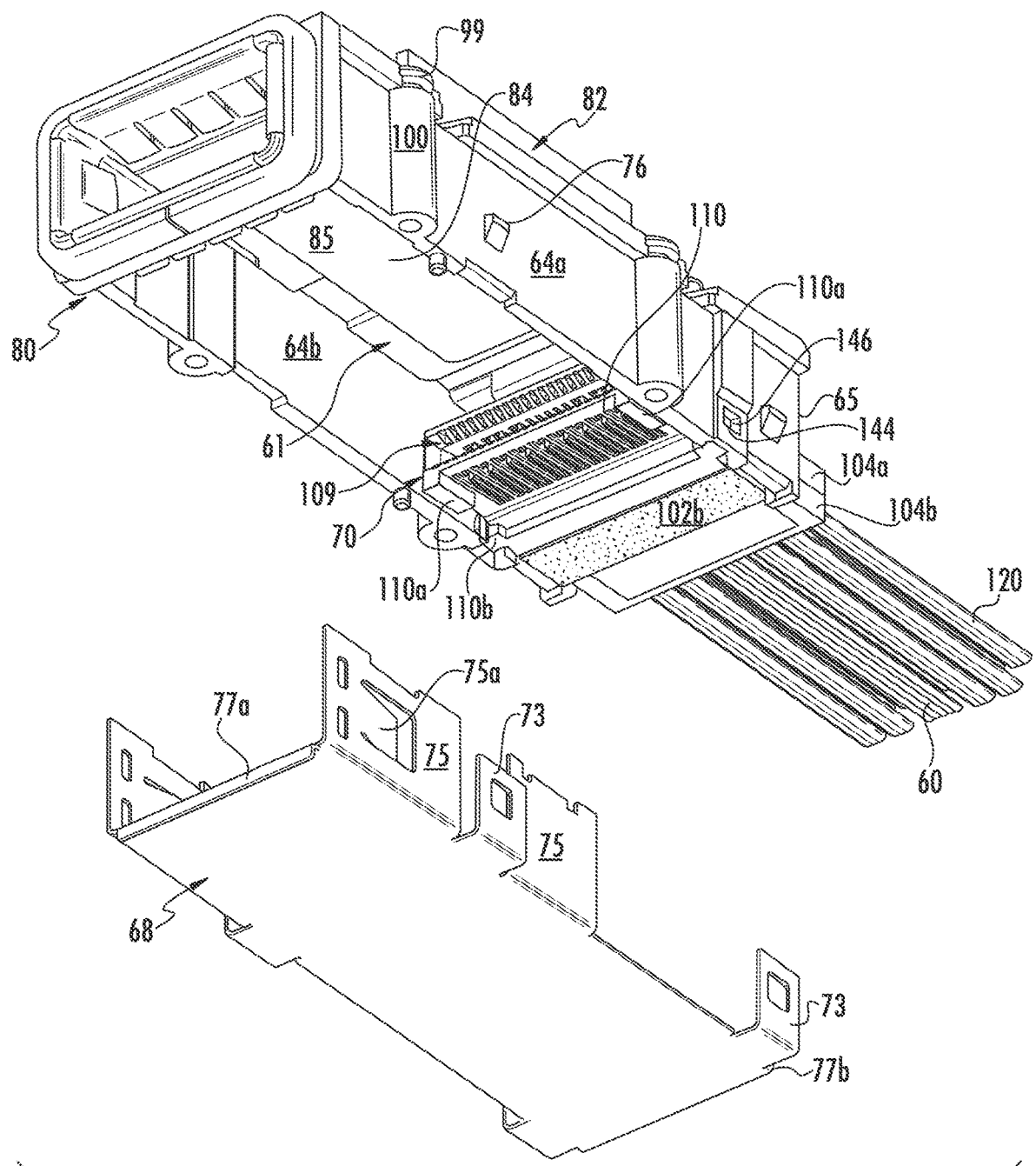
FIG. 6A is the same view as FIG. 6, but with the connector assembly in place within the connector housing.

The bottoms 134 of the two connector elements 104a, 104b abut each other and may engage each other through a post 140 and hole 141 manner of engagement as shown in FIG. 6. In this manner, the two connector elements 104a, 104b may be inserted into a rear opening of the connector body 108 so that the terminal contact portions are aligned with each other and are received in the terminal-receiving cavities 111 of the connector body 108 to form an integrated connector assembly. As illustrated in FIG. 6, the connector assembly is pressed into the hollow interior space of the connector port 60 from below. An internal ground plane 142 is provided in the form of a flat, conductive plate that is located between the two connecting elements 104a, 104b. It extends from the rear end of the connector element frame 132 to the forward edge of the termination nest 130. This ground plane 142 acts as a primary ground plane that serves to block crosstalk between the signal conductor pairs in one connector element and the signal conductor pairs in another connector element. The ground plates 125, act as secondary ground plates, or busses to the signal conductors of the cables 120 and their termination to the signal terminals 115a.

Figure 10:
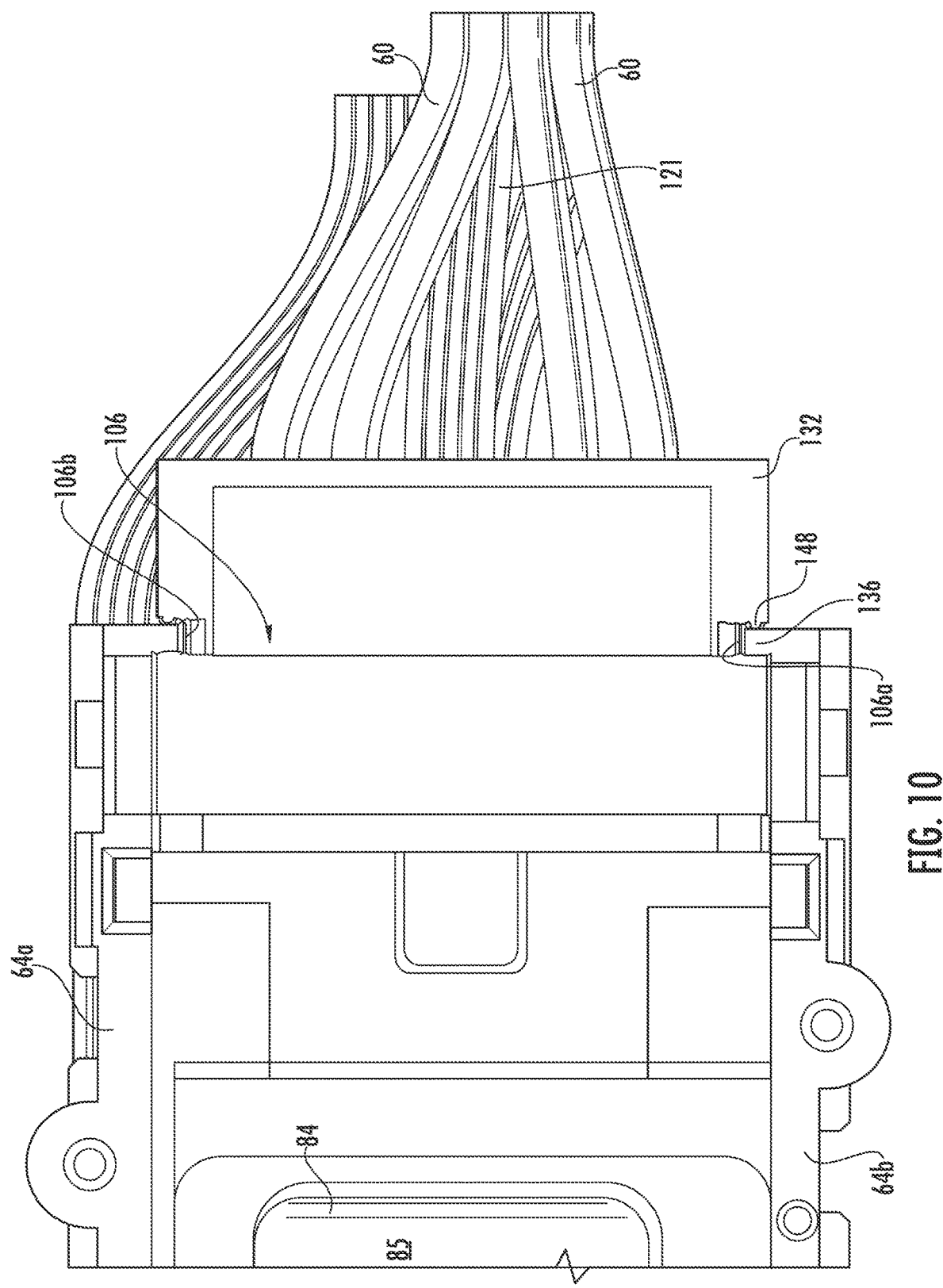
FIG. 10 is an enlarged detail view, of the bottom of the rear end of a connector housing with the connector assembly in place.

The slots 136 on the sides of the connector elements 104a, 104b engage the sides 106a, 106b of the connector port rear opening 106, while two catches 144 disposed on opposite exterior sides of the connector body 108 are received in corresponding openings 146 in the sidewalls 64a, 64b of the port 80. The catches 144 may be oversized so as to deform when the connector assembly is inserted into place in the housing body 63. The slots 136 may be rounded in configuration with tips 148 pointing inwardly or at each other, in order to ensure reliable contact with the connector port 80. (FIG. 10.)

The two EMI absorbing pads 102a, 102b may be applied to opposing surfaces of the connector elements 104a, 104b of the connector assembly prior to the connector assembly being pressed into the interior 61 of the port 80 from the bottom. The connector elements are vertically slotted, as previously noted, so they can engage the sides 106a, 106b of the rear wall opening 106 of the port and this contact provides in cooperation with the EMI-absorbing pads, four-sided EMI leakage protection around the connector elements. The rear wall of the port 80 and the conductive connector elements 104a, 104b combine to form, in effect, a fifth wall that prevents EMI leakage. The pads 102a, 102b seal off the spaces between the connector elements 104a, 104b and opposing surfaces of the housing body 63. These pads 102a, 102b occupy the open spaces above and below the connector elements 104a, 104, which are normally empty in conventional ports.

The EMI pads 102a, 102b are preferably aligned with and positioned above the areas of the connector elements where the cable wires are terminated to the terminal tails of the internal connector 70. The bottom pad 102b is held between the bottom wall 68 and the bottom connector element 104b, while the top pad 102a is held in place between the top connector element 104a and the module housing rear cover 90. This is accomplished by ribs 103 that are formed on the bottom of the rear cover 90 which extend down into contact with the pad 102a, as illustrated in FIG. 14B. The connector elements, EMI-absorbing pads are thereby sandwiched between the housing body top and bottom walls 66, 68 and the pads 102a, 102b ensure that EMI leakage is reduced along the housing body rear wall opening 106.

With the twin-ax cables 60 directly terminated to the terminals of the connector 70, the ports 80 are configured for mounting off of a circuit board and onto a panel or in a manner so as to be a free-standing connector within a host device. The ports 80 need not be mounted to a circuit board 62 in a termination manner, but can be by way of fasteners extending through openings in the circuit board and into the screw bosses. The sealing off of the bottom of the port and elimination of the need for a right-angle connector not only eliminates the need to mount the connector port on the motherboard 62, but also facilitates stacking of the ports in both vertical and horizontal arrangements.

Accordingly, the wires of the connector may be directly connected to components of the host device, such as a processor or a chip package and the like bypassing the traces on the circuit board. As the connection now may be direct, the connector does not have to be mounted on a circuit board, but may be enclosed within a structure such as the connector ports 80 disclosed and panel mounted. The connector ports 80 may take the form of an adapter frame, a shielding cage of similar type of housing. Still further, the connector port may be used an as internal connecting sleeve to provide an internal connector port that is positioned within the host device and which receives a plug-style connector. The connector port cables are terminated to the connector element terminal tails at one ends of the cables so the cables can be terminated at their second ends to the chip packages or processors of the host device. An integrated bypass assembly such as this can be installed and removed or replaced as a unit, which bypasses the circuit board and the associated loss problems which occur in FR4 materials, thereby simplifying the design and reducing the cost of the circuit board.

Figure 5:
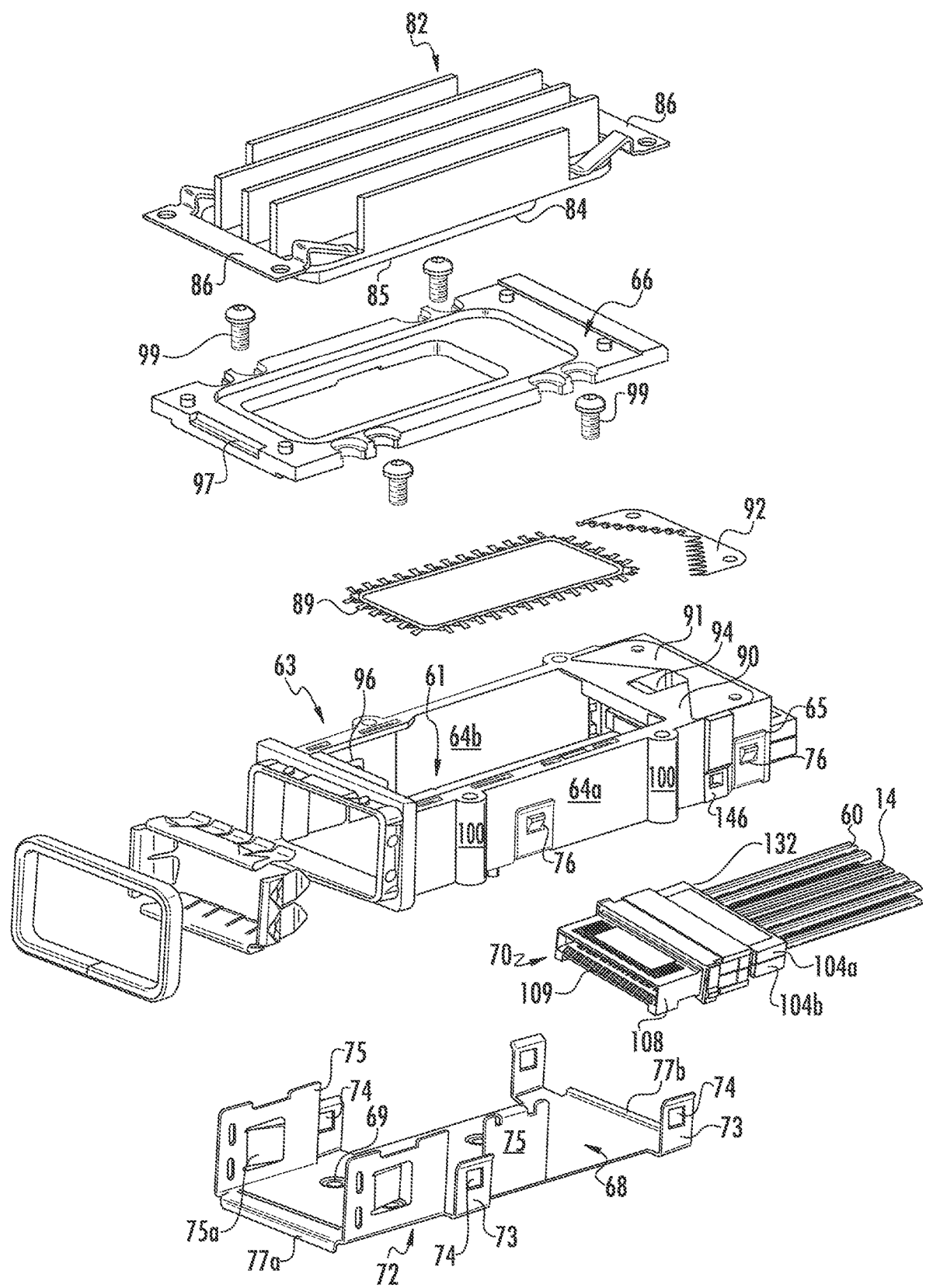
FIG. 5 is an exploded view of a connector housing and the cable-direct connector assembly of FIG. 4.
Figure 5A:
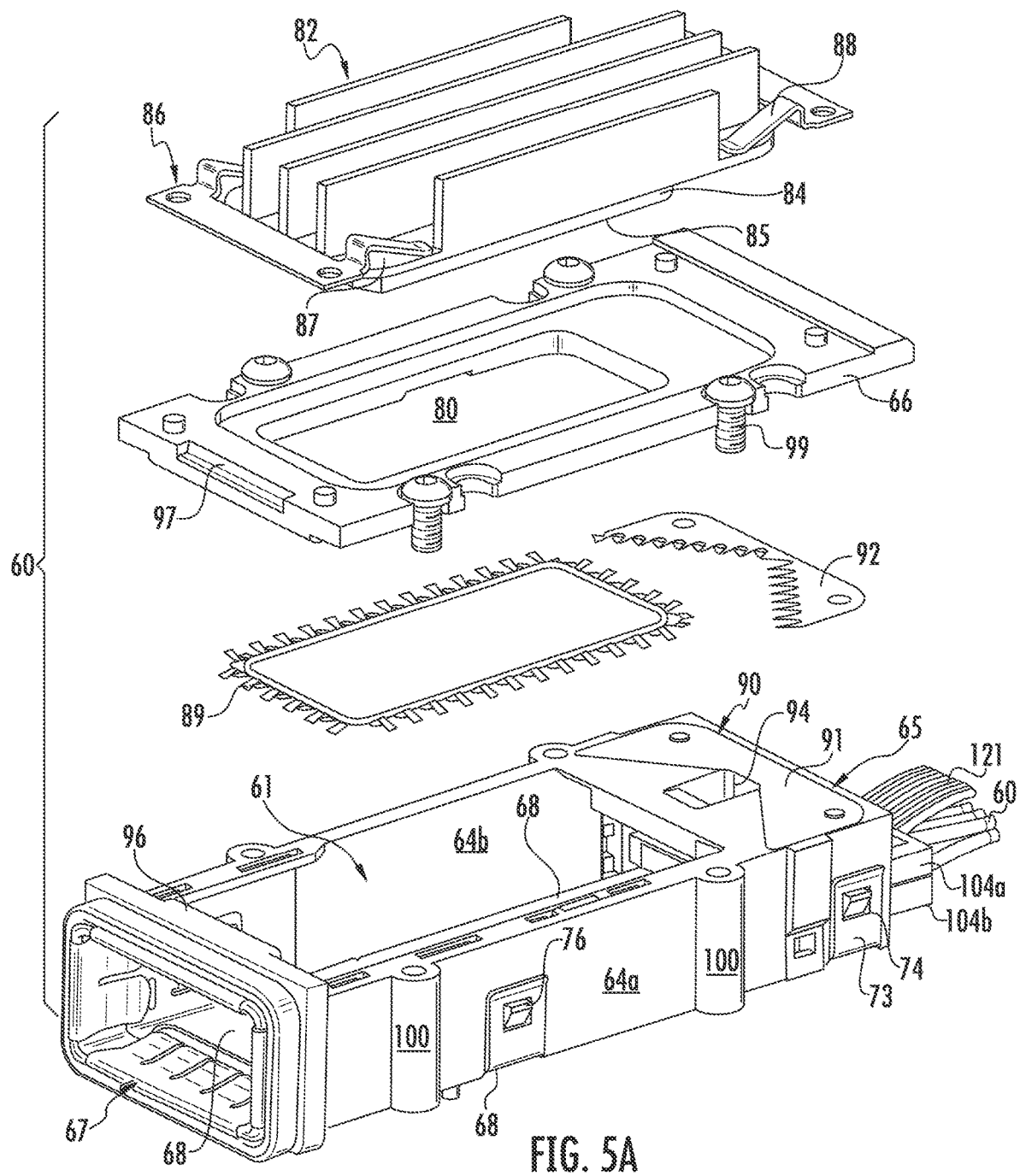
FIG. 5A is the same as FIG. 5, but with the receptacle connector in place within the housing and the bottom fixed to the sidewalls of the housing.

Turning now to FIGS. 4-9, a connector port/housing is illustrated in FIGS. 5 and 5A at 80 which is used as an external interface that accommodates entry connectors of the host device. The port 80 is disposed in the first wall 374 of the device 50 and receives opposing mating connectors in the form of plug connectors, such as pluggable electronic modules and the like. The connector port 80 includes a conductive housing body 63 that includes two sidewalls 64a, 64b, a rear wall 65 and top and bottom walls 66 and 68. All of the walls cooperatively define a hollow interior 61 that receives a corresponding opposing external mating connector that mates with an internal connector 70. The walls of the port 80 may be formed together as one piece as in an adapter frame, or they may be utilize separate elements that are joined together to form an integrated assembly. The connector port 80 may be referred interchangeably herein as a "module housing" or a "housing," but it will be understood that the port 80 is not limited in its operation to accommodating only pluggable modules, but will accommodate any suitable connector.

The housing walls 64-66 & 68 are all conductive and provide shielding for connections made within the port 80. In this regard, the port 80 is provided with a conductive bottom wall 68 that completely seals off the bottom of the housing body 63 in contrast to known cages and frames that are open at their bottoms to the circuit board upon which they are mounted. The housing 80 contains an internal, cable-direct connector 70 (FIG. 4) that has direct wire connections made to its terminals 115a, 115b and therefore does not require termination to traces on the motherboard 62 of the host device 50. Prior art connectors enclosed by cages or frames are of the right angle type, meaning the connector extends at a right angle from its mating face to the circuit board and the traces to which the connector is terminated. Right angle connector terminations to circuit boards create signal integrity problems in high speed operation, due to the varying lengths of the terminals and the bending thereof, such as increased capacitance in the corners of the bends and jumps or dips in the characteristic impedance of the system at the connector and its interface with the circuit board. Similarly, the exiting of the cables out of the rear of the housing eliminates the need to use press-fit pins as a means to mount the connector port to the circuit board, as ordinary mounting holes can be used for threaded fasteners, thereby simplifying the overall design of a host device motherboard. The internal connectors 70 are terminated to wires of cables 60 and exit out of the rear wall 65 of the housing 80, thereby avoiding the aforementioned problems.

Figure 6B:
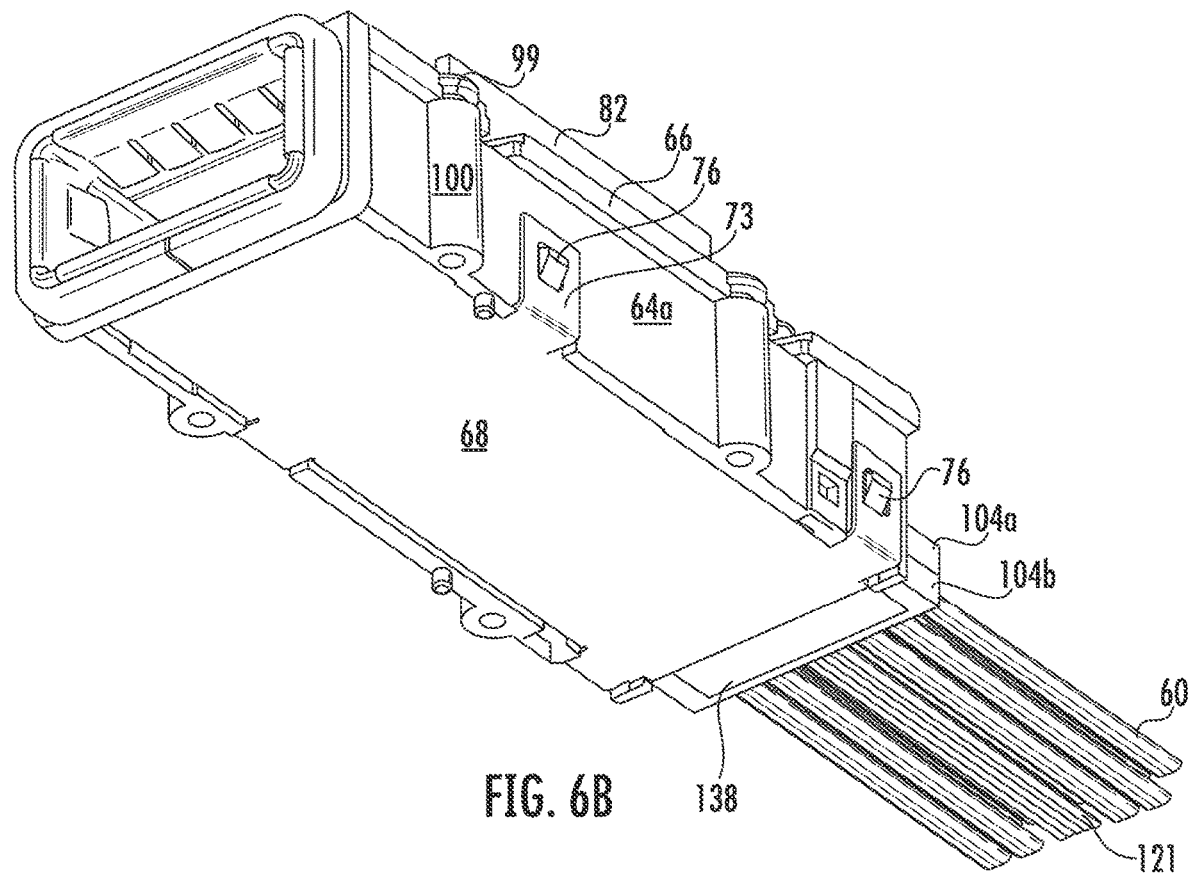
FIG. 6B is the same view as FIG. 6A, but with the bottom wall in place to seal the cable direct connector assembly in the connector housing.
Figure 11:
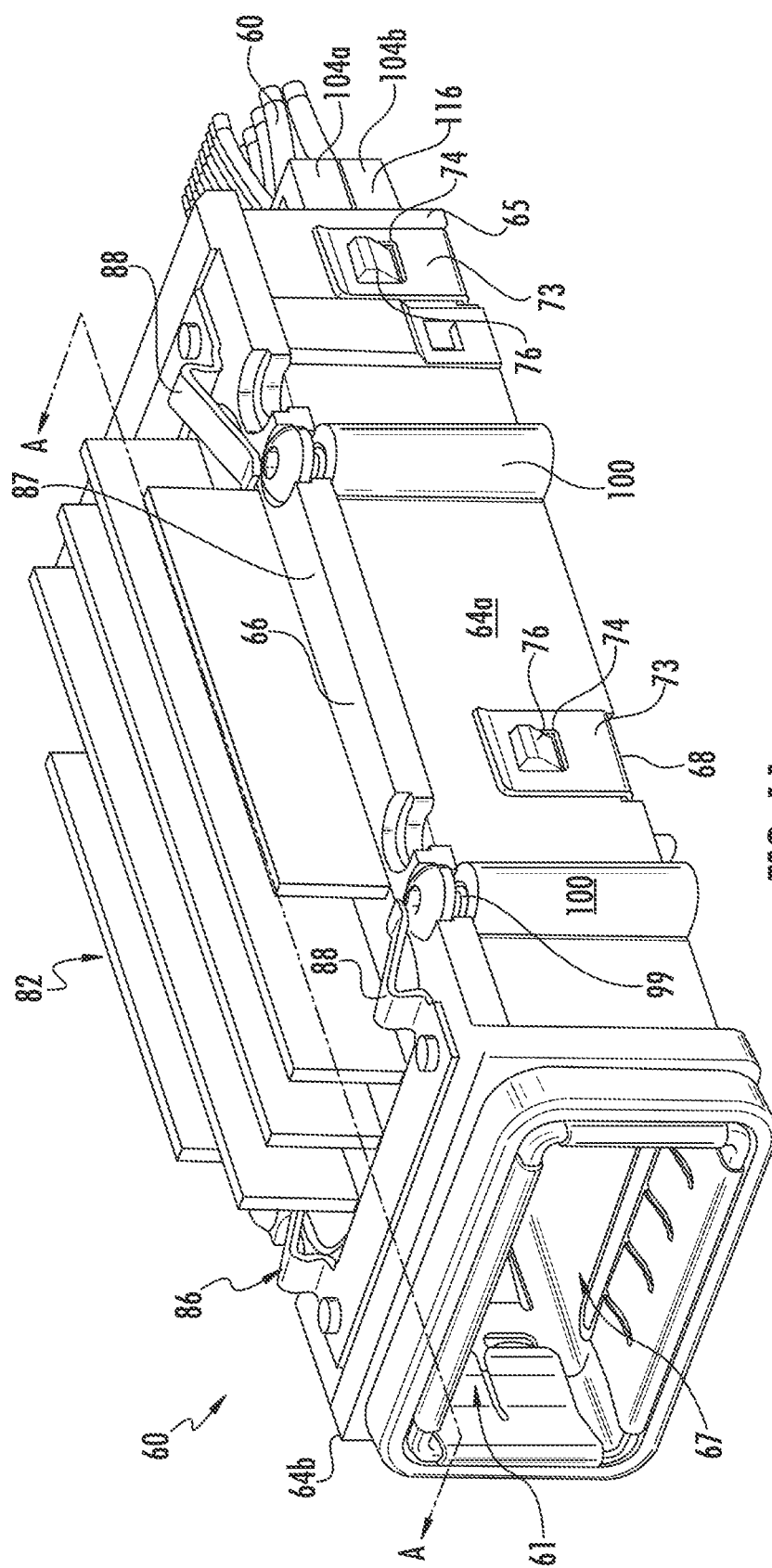
FIG. 11 is a perspective view of a connector housing of the present disclosure which is utilized in the bypass assemblies thereof.
Figure 12:
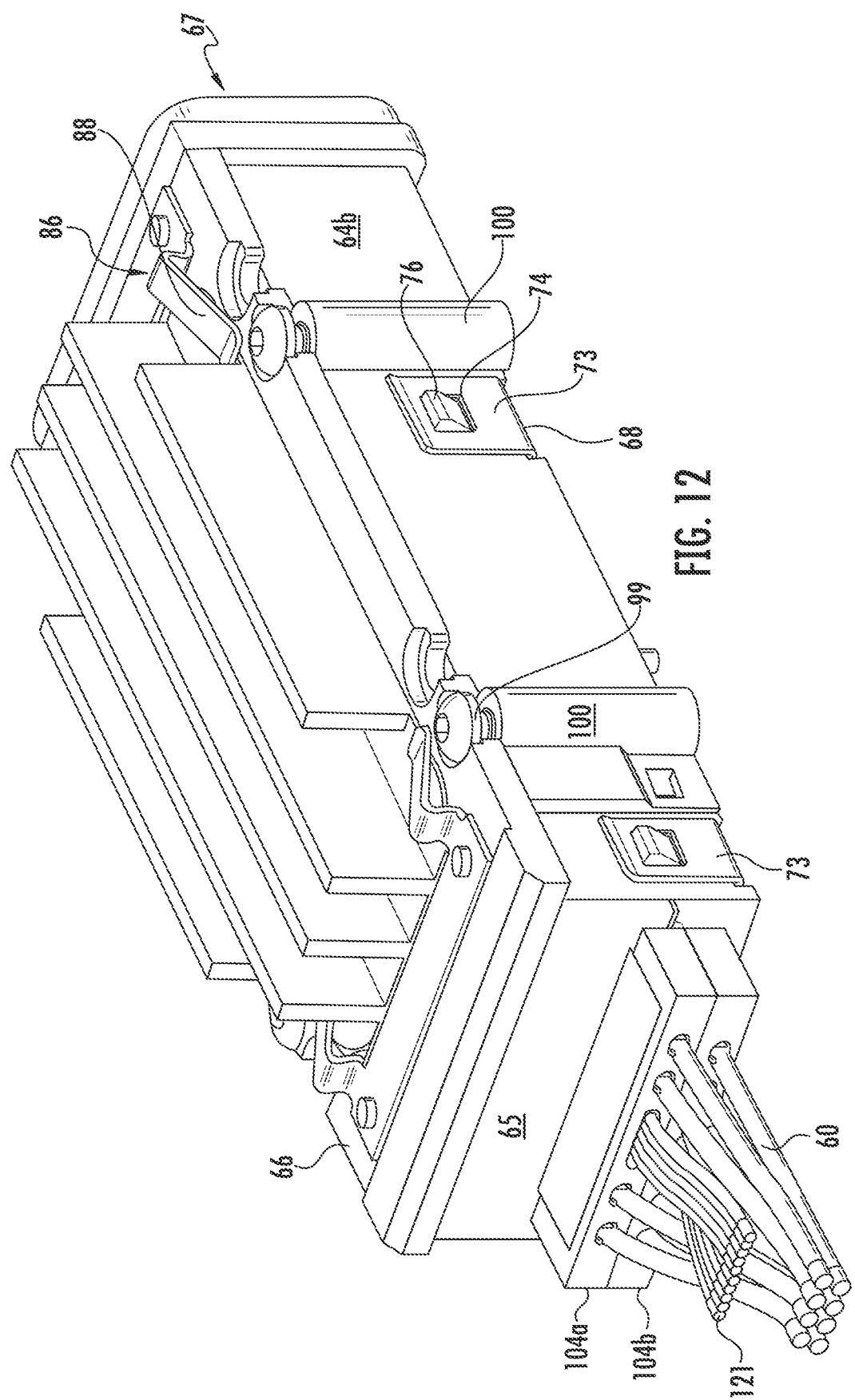
FIG. 12 is a perspective view of the connector port of FIG. 11, but taken from the rear of the opposite side.
Figure 13A:
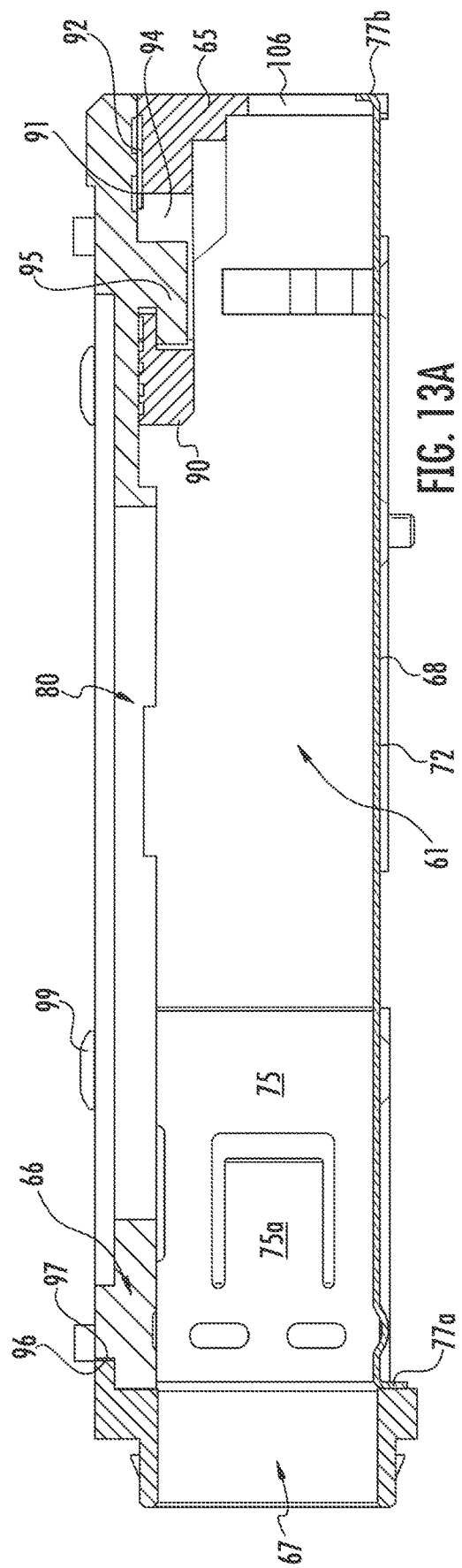
FIG. 13A is a sectional view of an empty connector housing without the internal connector and heat transfer member in place.

The bottom wall 68 of the housing, as shown in FIGS. 5-6B, seals off the bottom of the housing 80. The bottom wall 68 is shown as formed from a piece of sheet metal with a bottom plate 72, and side attachment flaps 73 that extend along the outer surfaces of the housing sidewalls 64a, 64b. Openings 74 in the attachment flaps 73 engage catches, or tabs 76 which are located on the sidewalls 64a, 64b and retain the bottom plate 72 in place. Additional means of attachment may include inner flaps 75 that are also bent up from the bottom plate 68 but are positioned along the edges of the bottom plate 68 to extend into the interior hollow space 61 along the inner surfaces of the sidewalls 64a, 64b. Two such inner flaps 75 are illustrated in FIGS. 11 & 13A and include contact tabs 75a that extend inwardly for contacting opposite sides of an opposing connector inserted into the interior channel 61. Two rims, or flanges 77a, 77b, may also be provided at opposite ends of the bottom plate 68 which extend at an angle thereto in order to engage the front and back wall 65 of the housing 80 to make conductive contact and provide EMI shielding at those locations. The use of a bottom wall 68 that covers the entire bottom significantly reduces EMI in this area. Standoffs 69 may be formed in the bottom wall 68 if desired. The many points of contact between the bottom wall 68 and the housing body 63 provide a reliable EMI shielding gasket along the entire bottom of the port 80 for the internal connector 70.

Turning now to FIG. 5, the top wall 66 preferably includes an access opening 81 which communicates with the hollow interior 61 and which is aligned with the internal connector 70 and primarily the area in front of the internal connector 70. A heat transfer member 82 shown as a finned heat sink may be provided which has a base 84 that extends at least partially into the access opening 81. The base 84 has a flat bottom contact surface 85 that contacts an opposing surface of a module inserted into the housing interior 61. Two retainers 86 are shown as joined to the top wall 66 and each retainer 86 has a pair of preloaded contact arms 88 that exert a downward retention force on a top plate 87 of the heat sink. An EMI gasket 89 is provided that extends around the periphery of the opening 81 and is interposed between the top wall 66 and the heat transfer member 82.

The housing 80 further includes a rear cover portion 90 that extends over a rear portion of the interior 61 to cover part of the internal connector 70. A recess 91 may be formed in the rear cover 90 to accommodate a chevron-shaped EMI gasket 92 interposed between opposing surfaces of the rear cover 90 and the top wall 66. The rear cover 90 can be seen to include an opening in the form of a slot 94. The top wall 66 (FIG. 13A) may include an engagement hook 95 as shown that is received within the slot 94 to engage the top wall 66 to the housing body 63 in a manner such that the top wall 66 can be slid forward so that its leading edge abuts the front flange of the housing 80, which may include a projecting tab 96 formed therewith which engages a corresponding slot 97 of the top wall 66. (FIGS. 5A & 13A.) Screws 99, or other fasteners may be used to secure the top wall 66 onto the housing body 63 by engaging threaded holes formed in screw bosses 100 supported by the housing body 63. In this manner, the housing body 63 is sealed in a manner to significant reduce EMI leakage.

Figure 15:
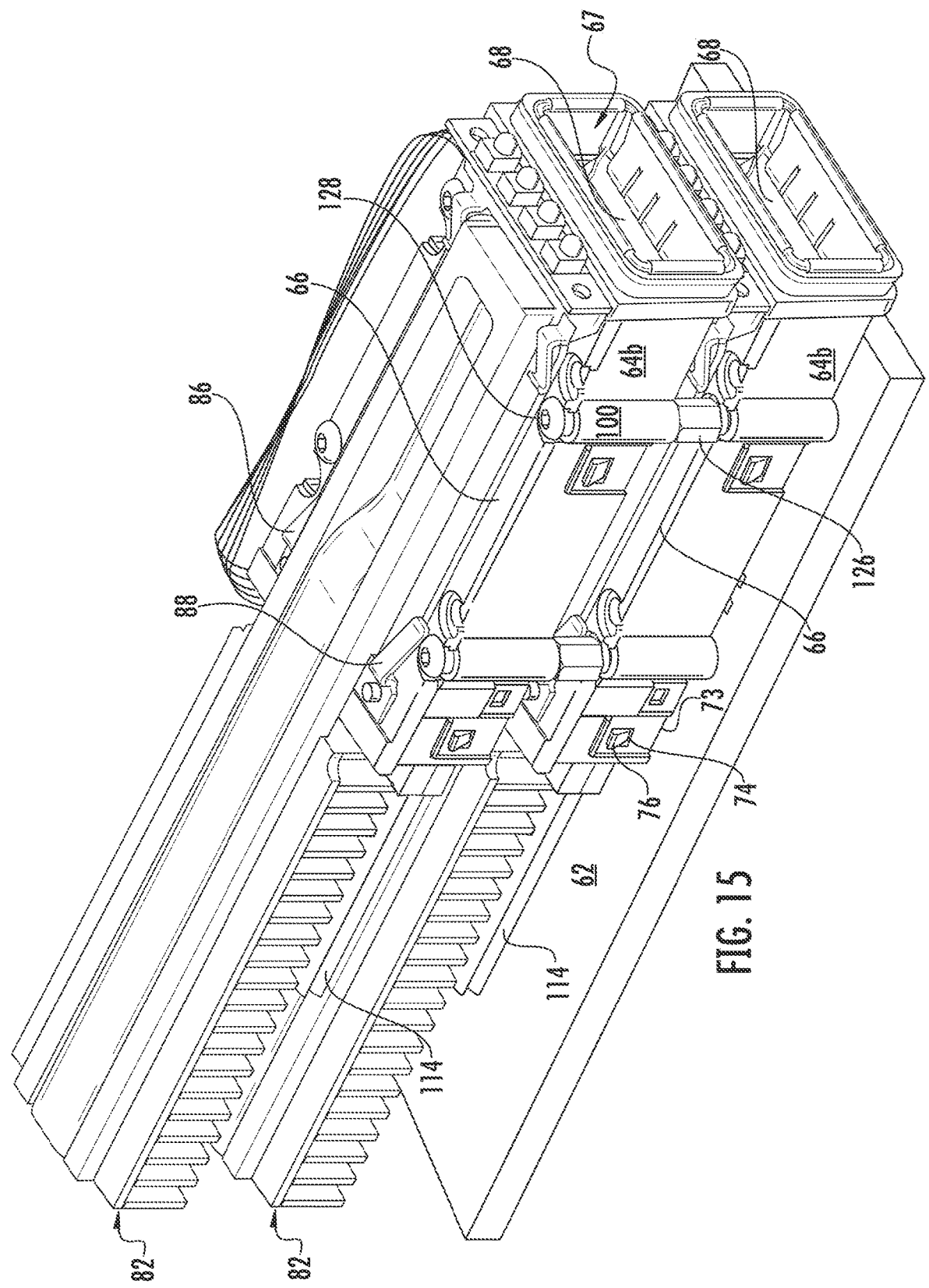
FIG. 15 is a perspective view of a pair of connector housings with heat transfer members and indicator lights arranged in a vertical stack on a circuit board.
Figure 15A:
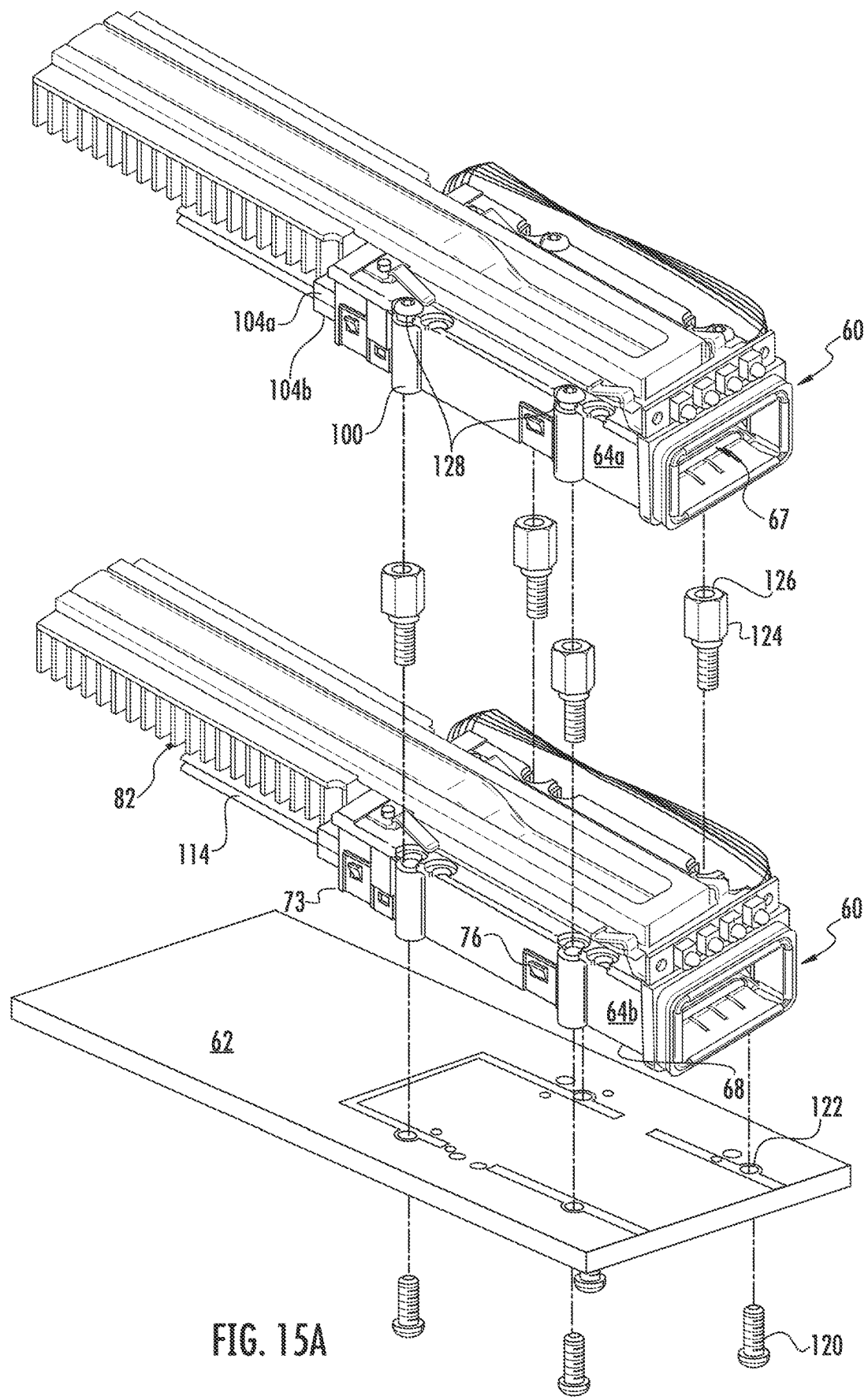
FIG. 15A is an exploded view of FIG. 15.

Because the internal connectors 70 are connected directly to the cables 60, the housings 80 of the present disclosure need not be mounted to the motherboard 62 by direct termination, but can attached by way of fasteners 120 that extend through openings 122 in the circuit board and into the screw bosses 100. Sealing off of the bottom of the housing 80 and elimination of a right-angle connector not only eliminates the need to mount the housing 80 on the motherboard 62 but also facilitates stacking of the housings/ports 80 in vertical and horizontal arrangements. FIGS. 15 & 16 illustrate just two different styles of stacking. FIGS. 15 & 15A illustrate a pair of housings 80 with their entrances 67 oriented horizontally in a vertical stack. The two housings 80 are shown supported on a circuit board 62 by way of bottom screws 120 that engage the screw bosses 100 in an upward manner through openings in the circuit board. A set of middle screws 124 are provided to engage the screw bosses 100 of the lower housing and these screws 124 have threaded male ends and threaded female ends 126. The female ends 126 engage top screws 99, 128 extending into the screw bosses 100 of the top housing. Thus, multiple housings 80 of the present disclosure may be stacked in such a fashion without requiring complex high speed connecting traces formed in the circuit board 62 and terminated to the internal connectors 70. Conventional stacking requires a dual connector that is terminated to the circuit board at right angles which will possess the signal integrity problems described above.

Figure 16A:
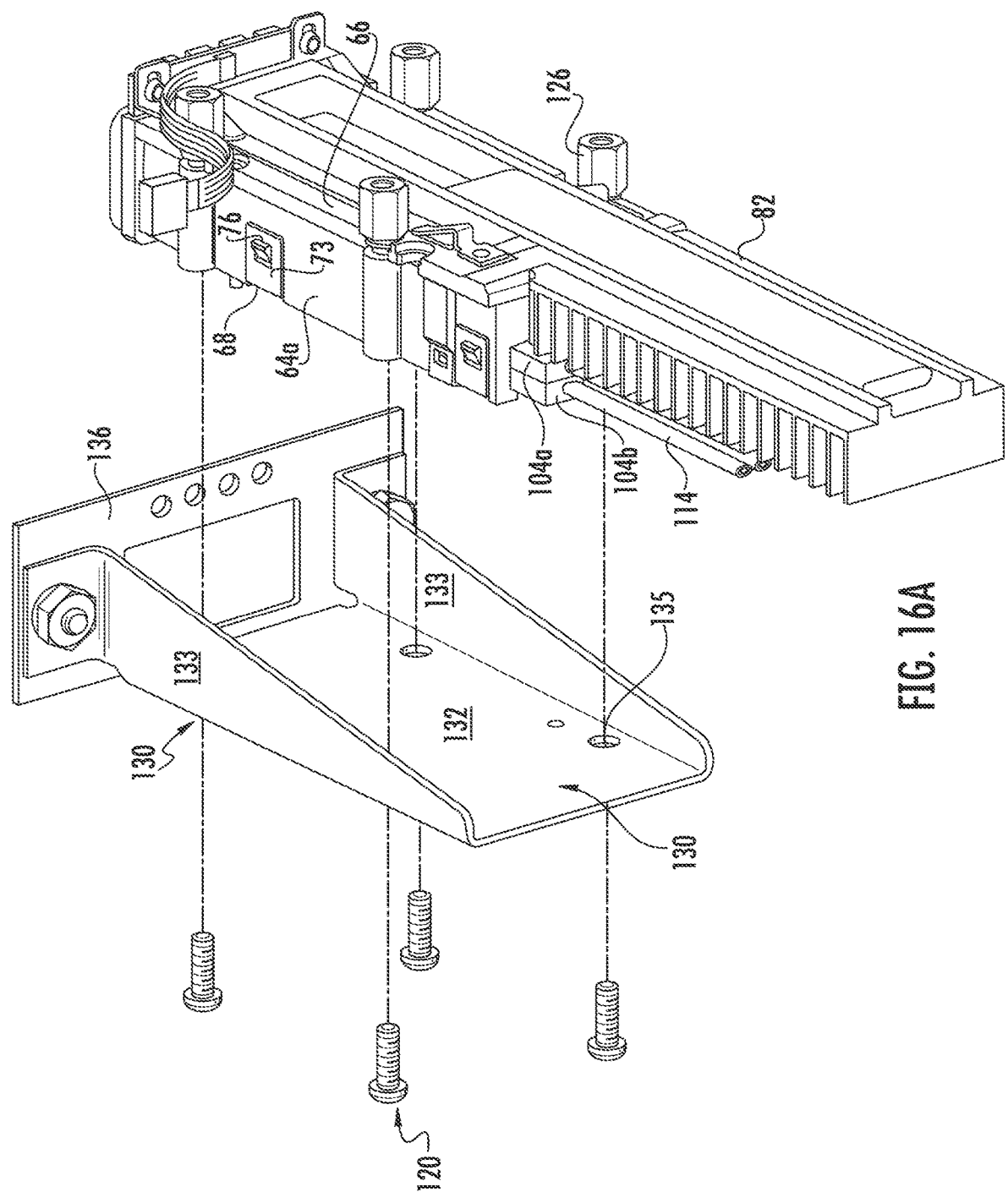
FIG. 16A is an exploded view of a vertical module housing and face plate mounting assembly.
Figure 17:
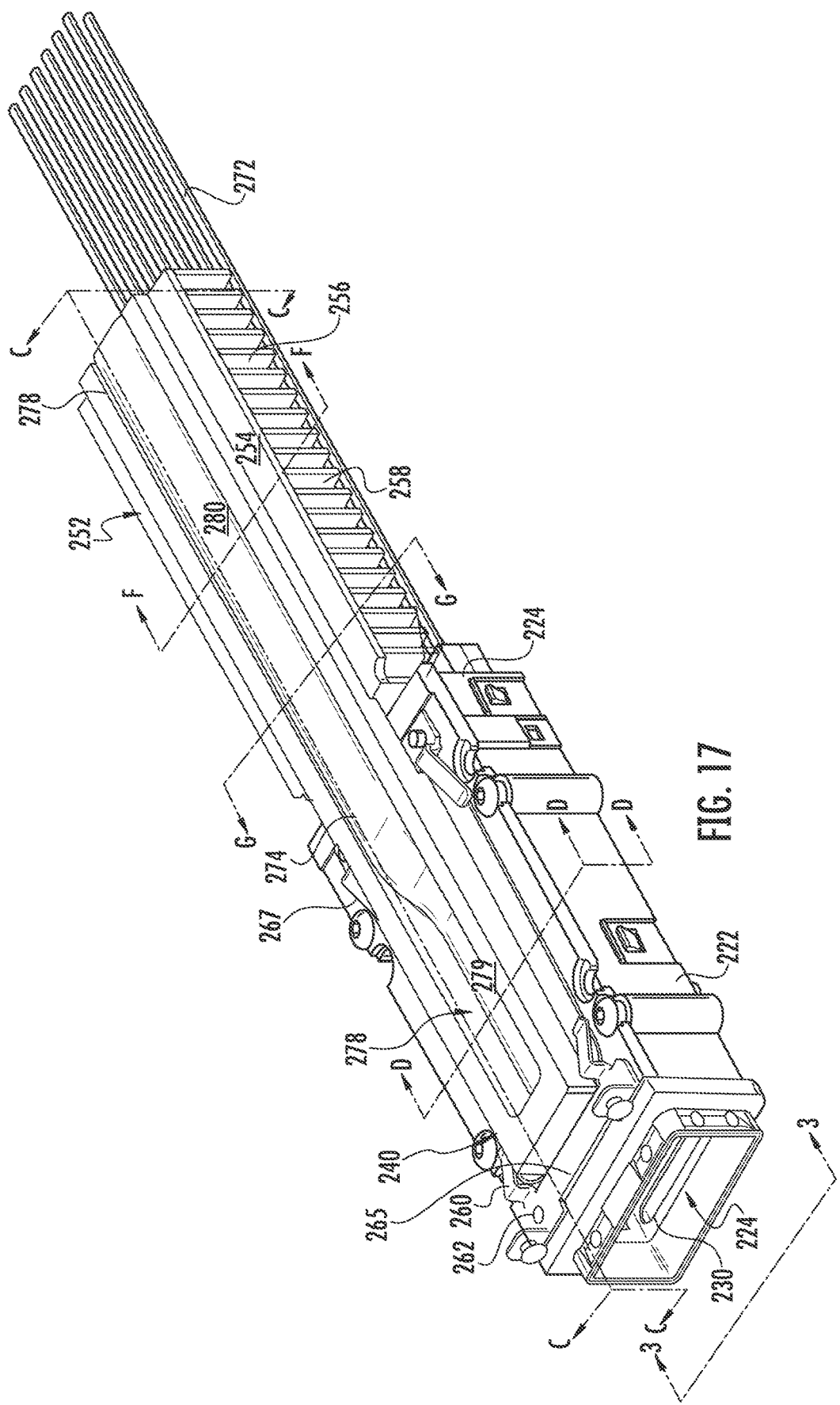
FIG. 17 is a perspective view of a module housing with an improved heat sink assembly constructed in accordance with the principles of the present disclosure attached thereto.

FIGS. 16-16A illustrate another manner in which the housings 80 of the present disclosure may be arranged. This arrangement includes a horizontal row of three housings that are aligned vertically along a front of the host device, but raised off of the circuit board 62. FIG. 16A illustrates a mounting nest 130 that has a base 132 and two extending sidewalls 133 that form a recess which accommodates a housing 80. The mounting nest 130 has two attachment flanges 134 that can be attached to a faceplate 136 with fasteners as shown extending through openings 135 in the base 132. Fasteners may be used to attach the housings to the nest, and they extend through the base openings 135 into the screw bosses 100. The top wall 66 of the housing 80 may be attached to the housing body 63 with male-female ended fasteners 126 as noted above so that adjacent housings 80 may be assembled into an integrated arrangement with male fasteners extending through the bases 132 of the nests 130 into the female ends 126 of opposing fasteners or into the screw bosses 100 of the housing body. The housings 80 may also be spaced closely together in instances as shown in FIGS. 14-16A as the heat transfer member 82 has its heat dissipating fins extending rearwardly of the housing body as set forth to follow.

Accordingly, a free-standing connector port/housing is provided that can be attached to an external wall of a host device, such as a faceplate or bezel or to a circuit board without requiring any termination traces positioned underneath the module housing. Such a free-standing port does not have to be mounted on a circuit board, but may be panel mounted. The connector port may take the form of an adapter frame, a shielding cage or similar type of housing. Still further, the connector port may be used an as internal connecting sleeve to provide an internal connector port that is positioned within the host device and which receives a plug-style connector. The connector port cables are terminated to the connector element terminal tails at the proximal ends of the cables, and the cables can be terminated at their distal ends to the chip packages or processors of the host device. An integrated bypass assembly such as this can be installed and removed or replaced as a unit, which bypasses the circuit board and the associated loss problems which occur in FR4 materials, thereby simplifying the design and reducing the cost of the circuit board.

The mating connectors used to connect to the I/O connectors generate heat during operation, and this heat must be removed in order to maintain efficient transmitting and reception of signals during operation. High temperatures can negatively affect the performance of not only the modules, but also the devices in which they are used, so it is important to remove this operational heat. Such removal is typically accomplished by the use of heat sinks which include solid bases that make contact with selected surfaces of the modules, typically the top surfaces. These heat sinks further have plurality of heat-dissipating fins that project upwardly from the bases into the interior space of the device. The fins are spaced apart from each other so that air can flow over and around the fins in a manner that heat is dissipated from the fins into the surrounding interior atmosphere. The fins are mounted above the heat sinks and modules and extend upwardly for a specific height in order to achieve a desired degree of thermal exchange. However, the use of such heat sinks does not permit a designer to reduce the height of the devices in which modules are used, eliminating the possibility of reducing the overall heights of such devices.

We have developed a thermal transfer structure that is suitable for use with electronic and other modules that are inserted into housings and guide or adapter frames. Such a structure may also be utilized for thermal transfer intentions on processors and integrated circuits, as well.

Figure 18:
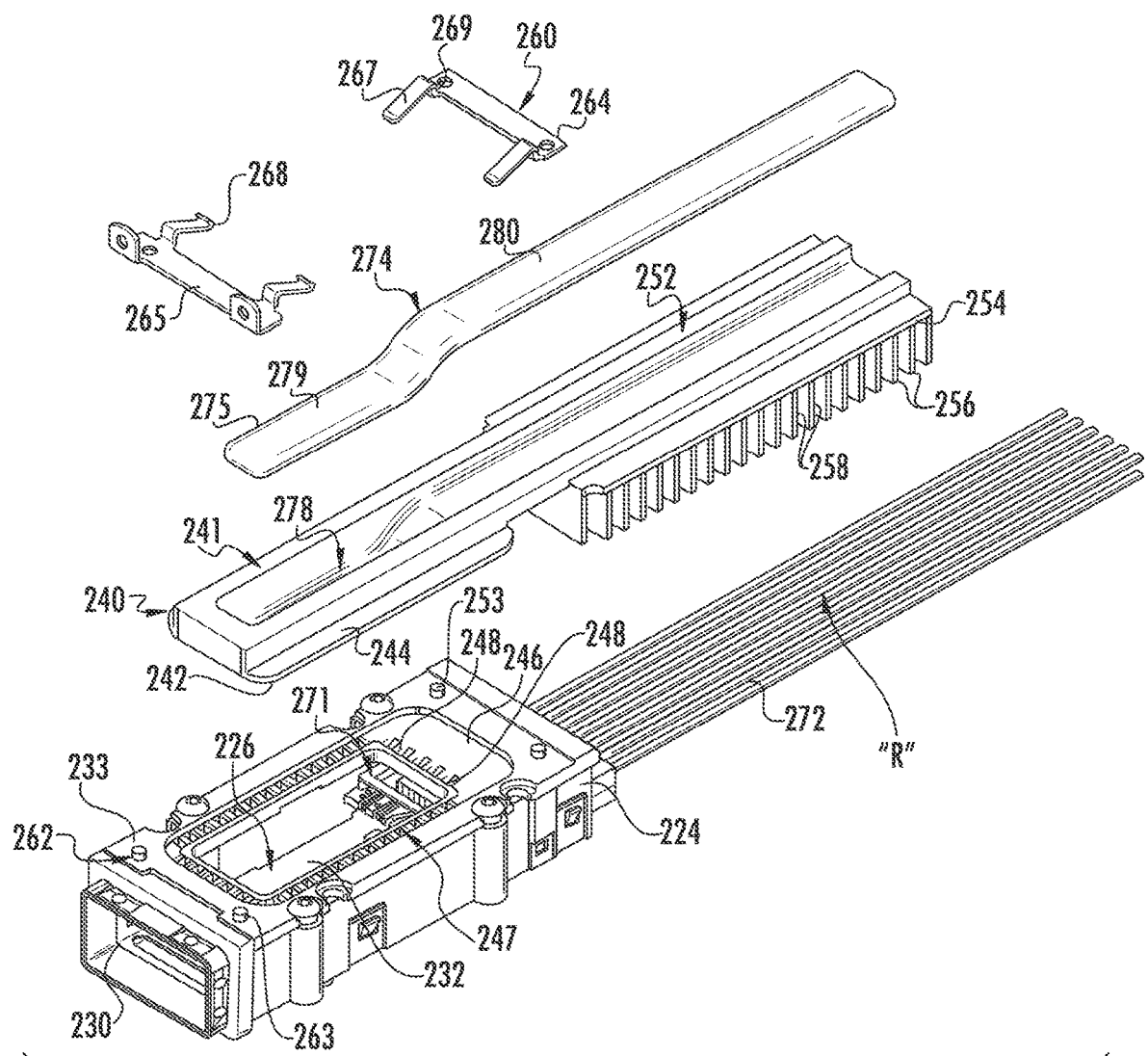
FIG. 18 is a partially exploded view of the module housing-heat sink assembly of FIG. 17, with the heat sink assembly components removed from their engagement with the top of the module housing for clarity.
Figure 18A:
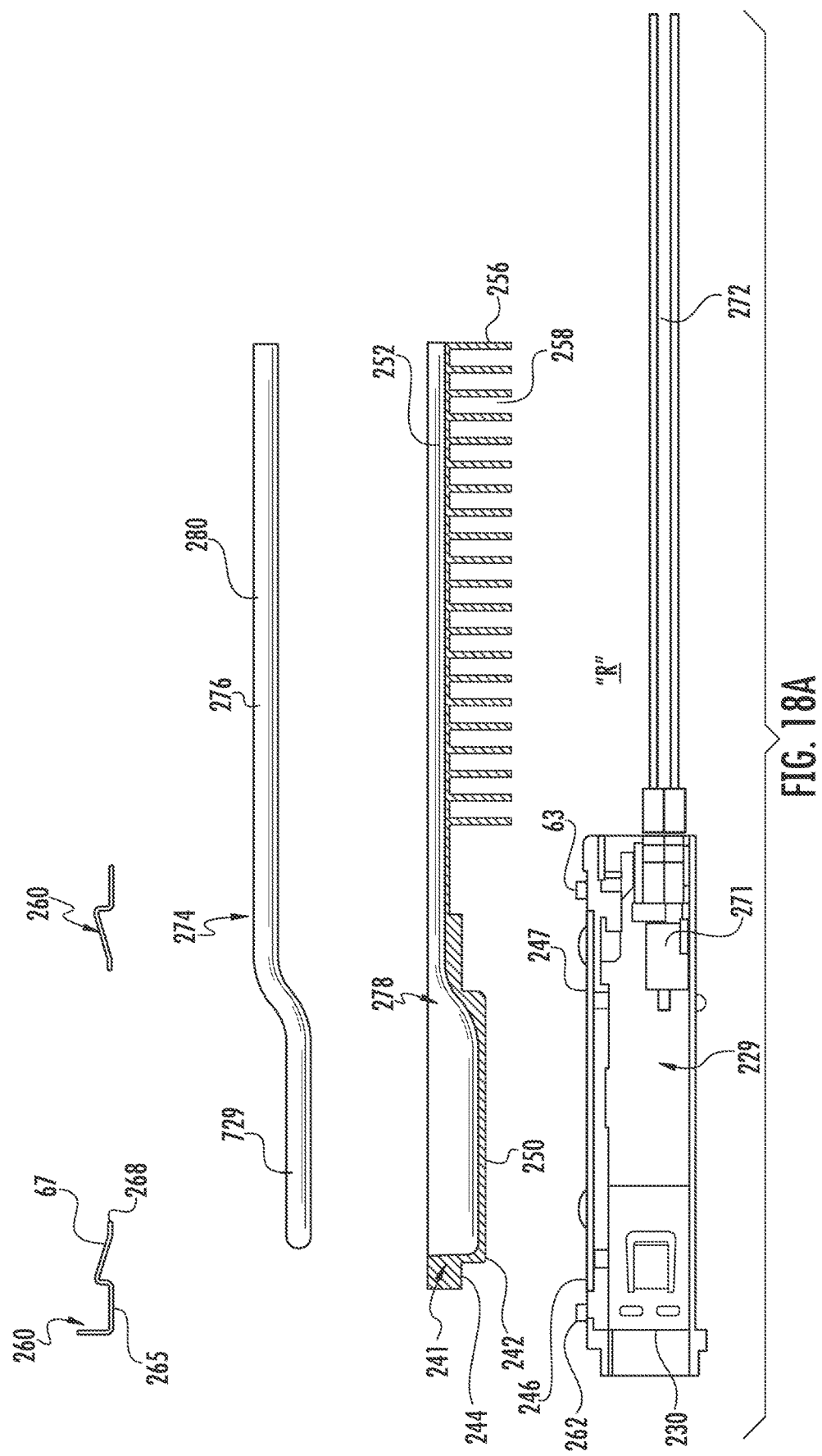
FIG. 18A is a side view of the exploded view of FIG. 18, with the components depicted therein sectioned along lines C-C thereof.
Figure 19:
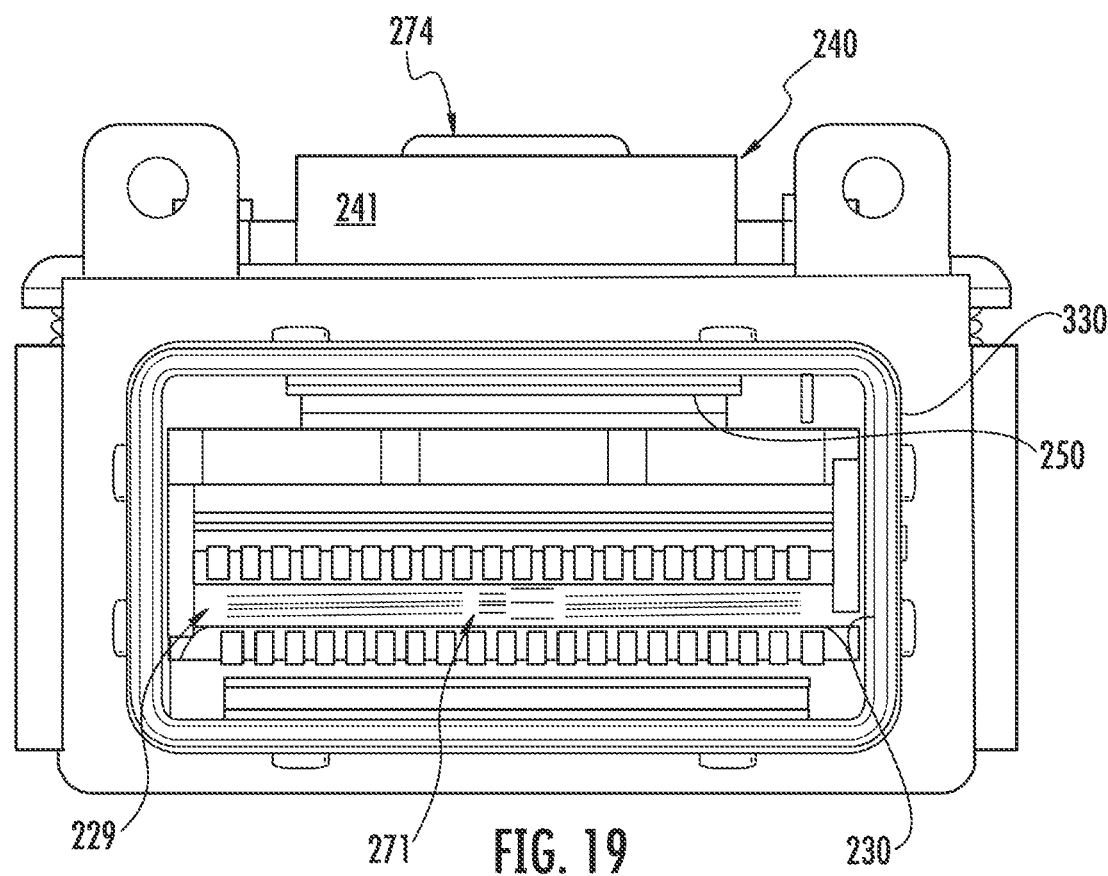
FIG. 19 is a front elevational view of the module housing-heat sink assembly of FIG. 17, taken along lines 3-3 thereof.
Figure 19B:
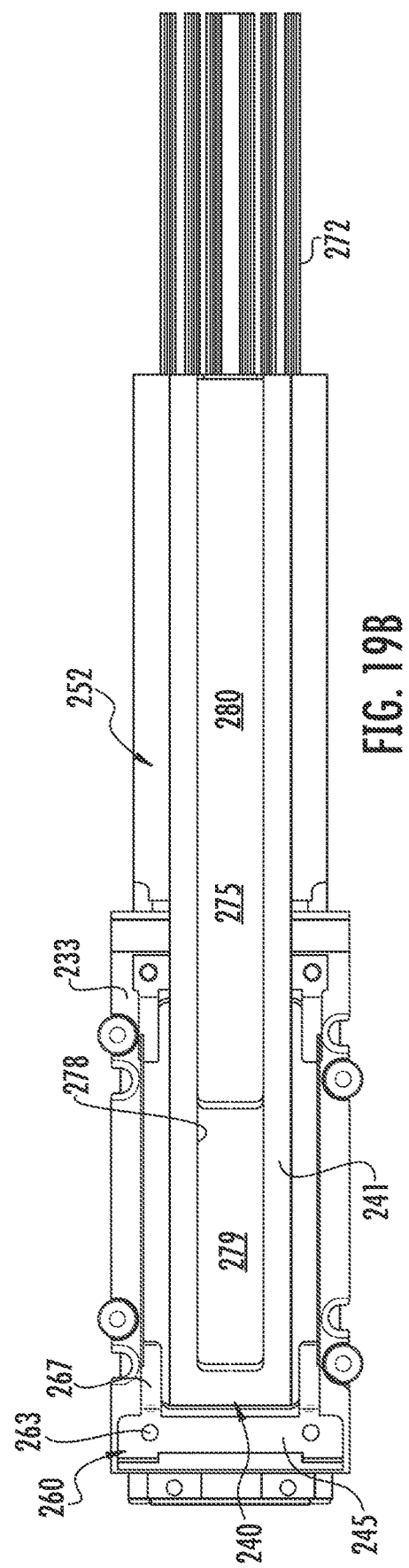
FIG. 19B is a top plan view of the module housing-heat sink assembly of FIG. 17.
Figure 19C:
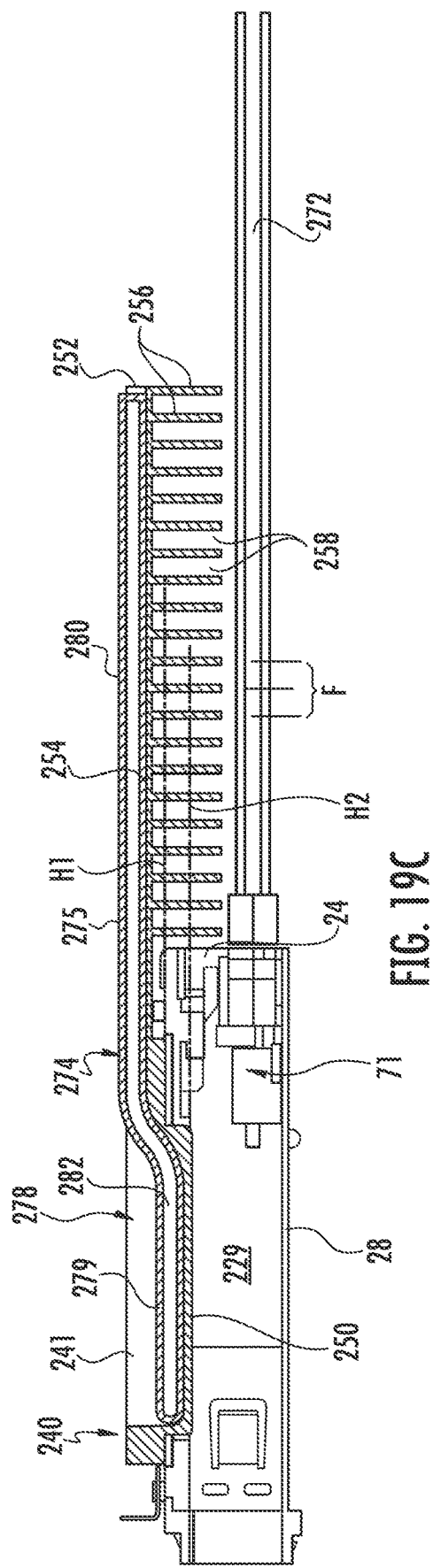
FIG. 19C is a longitudinal sectional view of the module housing-heat sink assembly of FIG. 17, taken along lines C-C thereof.

In this regard, as shown in FIGS. 17-19G, a heat sink assembly 240 is provided that includes a heat transfer portion 241 which has a solid base 242 that depends downwardly into the interior space 226 of the module housing/connector port 222. The heat transfer portion base 242 is complimentary in shape to the opening 232 in the housing 222 so that the base portion 242 may extend through the opening 232 and into the interior space 226 so as to make thermal contact with the top or upper surface of a module inserted into the front opening 230 of the interior bay 229 of the housing 222. The base 242 may further include a skirt or lip portion 244 that extends around at least a substantial portion of the periphery of the base 242, and preferably around the entire periphery of the base 242. This skirt 244 is received in a corresponding recess 246 formed in the top surface 233 of the housing 222 and which preferably surrounds the opening 232. A conductive EMI ring gasket 247 is provided that fits in the recess 246 and which encircles the opening 232. The gasket 247 has a plurality of spring fingers 248 that provides a conductive seal between the heat transfer portion skirt 244 and the housing top recess 246 so as to prevent EMI leakage through the opening 232. The EMI gasket 247 sits within the recess 246 and surrounds the opening 232 with the spring fingers 248 extending radially outwardly, as shown and into contact with the bottom surface of the skirt 244. The opening 232 in the top of the housing 222 is considered as a contact opening as it permits the heat transfer portion 241 to extend into the interior space 226 of the housing 222 and into thermal transfer contact with any module inserted therein by way of a thermal contact surface 250. (FIG. 19C.)

The heat transfer portion 241 has a solid base portion 242 that preferably includes a planar thermal contact surface 250 (on its bottom) that is configured to enter the frame contact opening and contact the top surface of a module inserted into the bay 229 in effective and reliable thermal contact. The base 242 may include an angled lead-in portion on its contact surface 250 to facilitate the insertion of a module. The heat sink assembly 240 further includes a distinct heat dissipating portion 252 that dissipates heat generated by the module and transferred to the heat transfer portion 241 by way of contact between the thermal contact surface 250 and an opposing top surface(s) of the module. As shown in FIG. 18, this heat dissipating portion 252 is distinct from the heat transfer portion 241 and is spaced apart therefrom in a longitudinal or horizontal direction.

The heat dissipating portion 252 includes a base 254 that extends out in a cantilevered fashion from the heat transfer portion 241 along a similar longitudinal axis. A plurality of vertical heat-dissipating fins 256 are disposed on the base 254 and extend vertically downwardly from the heat dissipating portion base 254. As illustrated, the fins 256 are spaced apart from each other in the longitudinal (horizontal) direction to define a plurality of cooling passages 258 therebetween that are spaced away lengthwise from the heat transfer portion 241 and which further extend lengthwise with respect to the modules. In order to retain the heat transfer portion 241 in contact with a corresponding module, and also resist any moment that may occur due to the weight and/or length of the heat dissipating portion 252, retainers 260 are illustrated. These retainers 260 are attached to the frame top surface 233 by means of fasteners, such as rivets 262, which may be formed as part of the housing 222 in the nature of vertical posts 263 that are received within corresponding openings 264 disposed in the retainer base portion 265. The free ends of these posts 263 may be "dead-headed" or "mushroomed" to form the connection between the retainers 260 and the skirt 244. The retainers 260 are seen to have pairs of cantilevered spring arms 267 associated with them and which extend longitudinally from the base portions 265 as illustrated. The spring arms 267 are flexible and are formed as elastic spring arms 267 with a preformed downward bias. The spring arms 267 terminate in free ends 268 and they extend at a downward angle into contact with the heat transfer member skirt 244. Four such contact points are provided for the heat sink 240 assembly illustrated in the Figures, and the contact points will define a four-sided figure when connected by imaginary lines. However, the contact points of the spring arms 267 may vary from the locations shown according to the extent to which space is available on the skirt portion 244 of the heat sink member 240.

The elasticity of the spring arms 267 permits a designer to obtain a desired contact pressure by configuring the length of the spring arm 267, the depth to which the spring arm 267 depends down into the recess 246 and the height of the stub 269 that joins the spring arm 267 to the retainer 260. The fastener connection of the retainer 260 to the skirt plate 244 eliminates forming and utilizing attachments on the sides of the housing 222 which would take up space and affect spacing between housing 222. The rivets 262 also have a low profile so that the frame 226 is not unduly enlarged in any direction, including the vertical direction. The spring arms 267 are relatively short in length and therefore contact the heat transfer portion 241 at approximately four corners thereof to exert a reliable contact pressure on it in order to maintain it in good thermal transfer contact with any modules.

Uniquely, the heat-dissipating fins 256 are removed from immediate contact with the heat transfer portion 241 of the heat sink assembly 240. Rather, they are positioned on the heat dissipating portion 252 and they extend downwardly therefrom. The fins 256 are longitudinally spaced away from the heat transfer portion 41 and its base 242. The fins 256 are further arranged in a series of planes, shown as vertical planes F, that intersect both the horizontal plane, H1, in which the heat transfer portion skirt extends and the horizontal plane H2 in which the thermal contact surface(s) 250 extend. As shown in FIG. 19C, not only do the vertical planes F intersect the two planes H1 and H2, but the fins themselves extend for heights that intersect those two planes. Furthermore, adjacent fins 256 are separated by intervening cooling passages or air channels through which air may circulate. The fins 256 and cooling passages 258 extend transversely to a longitudinal axis of the heat sink assembly 240. In this manner, the fins 256 may occupy the space R rearwardly of the housing 222 and above the wires 272 which are terminated to the receptacle connector 271 supported in the housing 222. Locating the fins 256 in this manner permits the overall height of the device in which the housing structures are used to be reduced by approximately the height of the fins that ordinarily would project upwardly from the housing. It is desired to have the fins 256 not touch the wires 272 in this orientation. In this regard, the height of the fins 256 is preferably less that the height of the housing 222 as illustrated in the Figures.

Figure 19D:
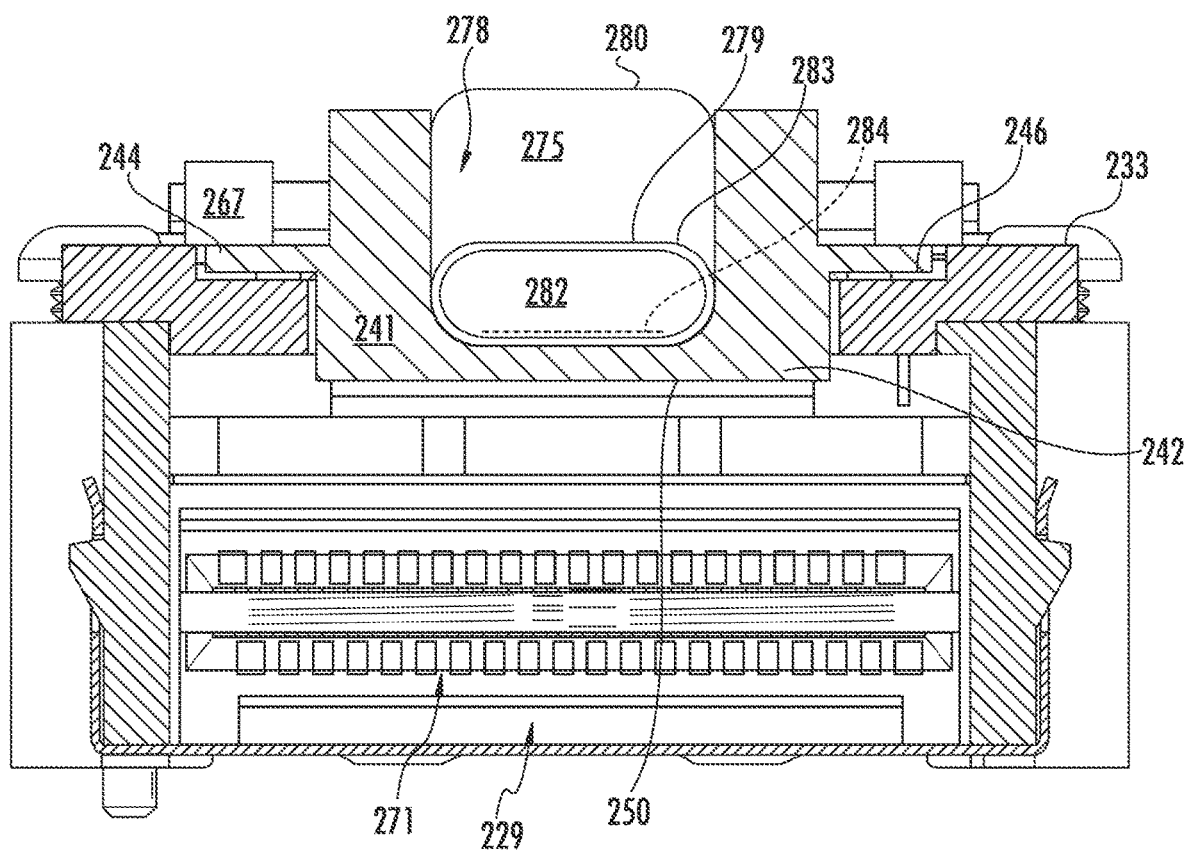
FIG. 19D is a transverse sectional view taken through the module housing-heat sink assembly in the transfer portion of the heat sink assembly of FIG. 17, taken along lines D-D thereof.

The heat transfer and heat dissipating portions 241, 252 are shown as being integrally formed as one piece to promote heat transfer from the transfer portion 241 to the dissipating portion 252. However, it is contemplated that the two portions 241, 252 could be formed separately and subsequently joined together where desirable. In order to further enhance the transfer of heat from the heat transfer portion 241, a thermal transfer member 274 is provided that extends lengthwise along and in contact with the heat transfer and heat dissipating portions 241, 252. Such a transfer member 274 is shown in the Figures as a heat pipe 275, having an oblong, or elliptical, cross-sectional configuration which include major and minor axes that define such a shape. (FIG. 19D.) The oblong configuration of the heat pipe 275 increases the amount of contact area between the heat pipe 275 and the two portions 241, 252 of the heat sink assembly 240. Other non-circular configurations such as a rectangular inner cavity may be utilized or even cylindrical ones. The heat pipe 275 is received within a common channel 278 that also extends longitudinally along the heat sink assembly 240 and it follows the contour of the two portion 241, 252. Accordingly, the heat pipe 275 has an offset configuration with two distinct portions 279, 280 that extend at the different heights, or elevations, of the heat sink assembly 240.

The heat pipe 275 is a hollow member with an inner cavity 282 defined by sidewalls 283 that is sealed at its ends and which contains a two-phase (e.g., vaporizable) fluid within its inner cavity 282. Examples of a two-phase fluid that can reside within embodiments of inner cavity 282 include purified water, freon, etc. The heat pipe 275 and its walls 283 can be composed of aluminum, copper or other thermally conductive materials. The inner cavity 282 preferably includes an evaporator region 279 located adjacent the heat transfer portion 241 and a condenser region 280 located adjacent the heat-dissipating portion 252. Heat is transmitted from the heat transfer portion 241 through bottom and side walls 283 of the heat pipe 275 into the inner cavity 282 where is can cause the two-phase fluid present in the evaporator region 279 to evaporate. This vapor can then be condensed to liquid in the condenser region 280. In the illustrated embodiment, the vapor gives up heat as it condenses, and that heat is transmitted out of the inner cavity 282 through the walls 283 of the heat pipe 275 into the base of the heat dissipating portion 252 and its associated fins 256. The inner cavity 282 may include a wick 284 to facilitate travel of the condensed liquid along the wick back to the evaporator region 280. (FIG. 19D.) The wick 284 may take the form of grooved channels on the interior surface of the inner cavity 282, or an extent of wire mesh or the like.

Figure 19E:
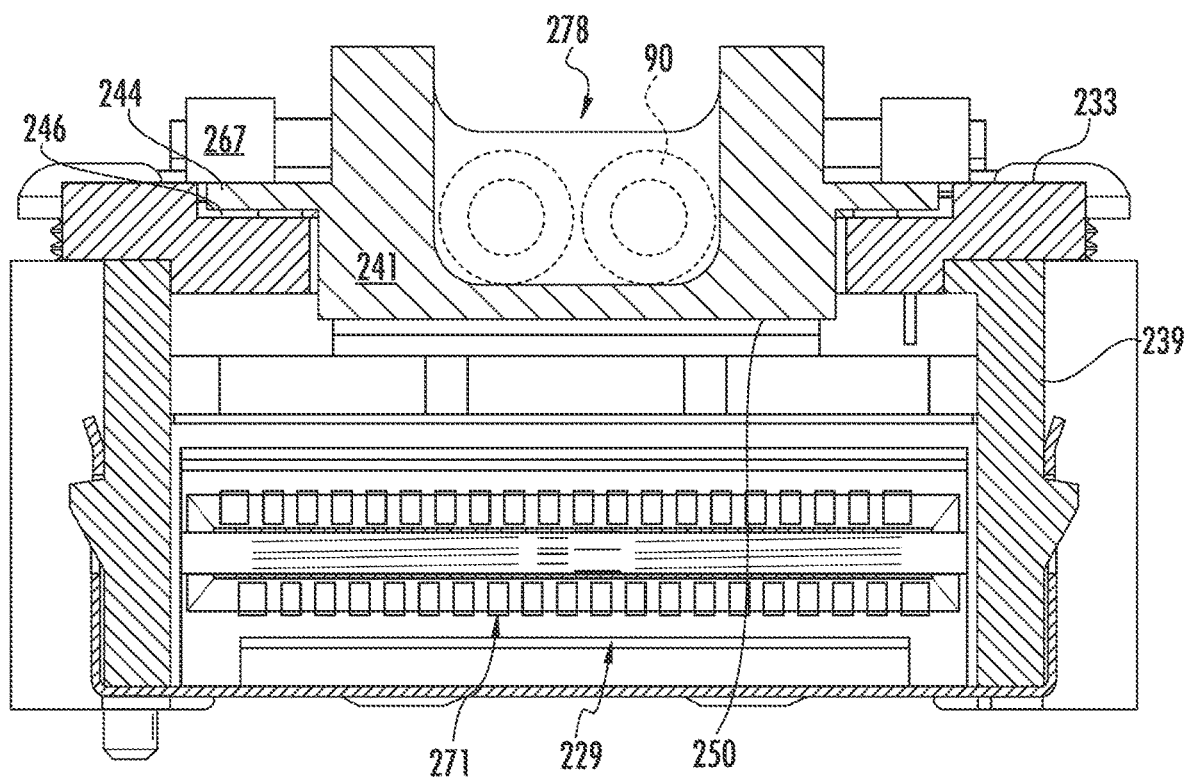
FIG. 19E is the same view as FIG. 19D, but with the heat pipe removed from the heat sink assembly for clarity and with an alternate configuration of a pair of heat pipes shown in phantom.
Figure 19F:
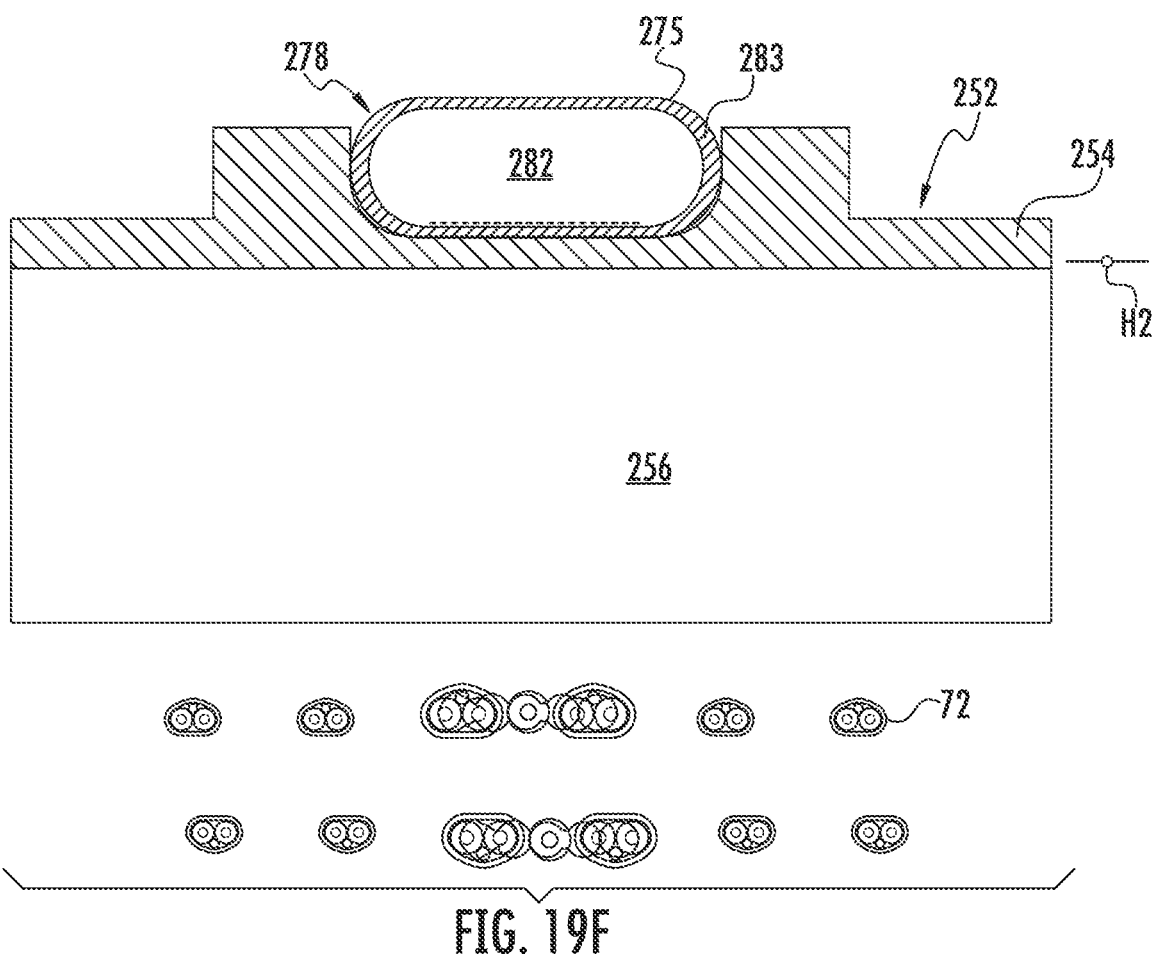
FIG. 19F is a transverse sectional view, looking rearwardly, taken through the module housing-heat sink assembly in the dissipating portion of the heat sink assembly of FIG. 17, taken along lines F-F thereof.
Figure 19G:
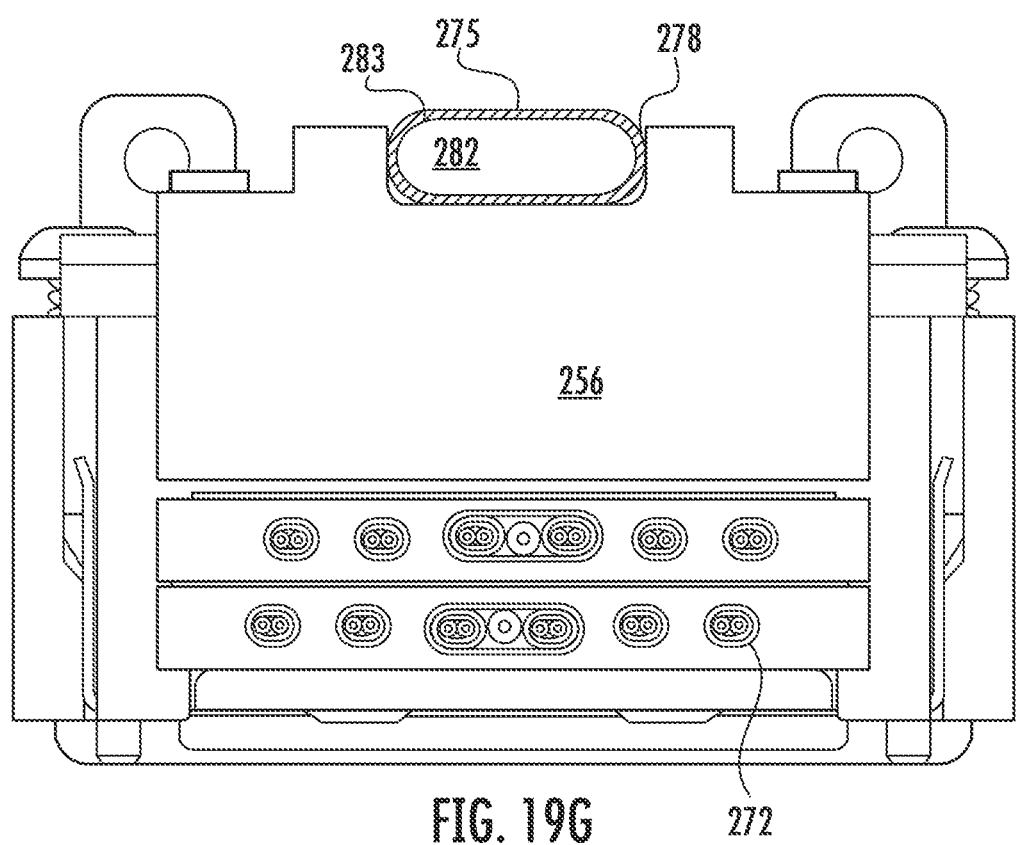
FIG. 19G is a transverse sectional view, looking forwardly, taken through the module housing-heat sink assembly in the dissipating portion of the heat sink assembly of FIG. 17, taken along lines G-G thereof, illustrating the clearance between the heat-dissipating fins and the connector wires.

As illustrated, the heat transfer and heat dissipating portions 241, 252 of the heat sink assembly 240 extend longitudinally but extend at different elevations, with the heat dissipating portion 252 being raised with respect to the heat transfer portion 241. This difference in elevation facilitates, to some extent, the movement of the liquid vapor from the heat transfer portion 241 up into the heat dissipating portion 252, but its primary purpose is to accommodate the heat dissipating portion 252 in its horizontal extent without having to modify the frame 222 to accommodate it. If one desired to extend the heat dissipating portion 252 at the same elevation as the heat transfer portion 241, the rear wall 224 and a portion of the top surface 233, proximate thereto would need to be modified. A channel, or recess, may be formed in those two walls 224, 233 to accommodate the area of the heat sink assembly 40 between the heat transfer and dissipating portions 241, 252. Also, although mostly one heat pipe 275 has been discussed, it is understood that multiple heat pipes, such as a pair of heat pipes 290, as illustrated in phantom in FIG. 19E may be routed in the heat sink assembly channel In this instance, the pair of pipes may be encapsulated in a medium that facilitates heat transfer to make up for the amount of direct contact lost between a pair of heat pipes and a single, oblong configured heat pipe as illustrated. Thermally conductive greases or other compounds may be applied to the heat pipes to enhance the thermal transfer.

This heat sink assembly thermally engages the module housing and uniquely transfers heat therefrom to an area rearwardly of the module housing. With this structure and its downwardly depending heat dissipating fins, the devices in which such heat sink assemblies are used can have a reduced height, permitting additional devices in closets and stacks. The location of heat dissipating fins is such that all of the spaces between the fins are used for cooling as none of them have light pipes or any other members extending therethrough. The heat sink heat-dissipating portion extend horizontally but spaced above the motherboard of the device so a designer can utilize this open space for additional functional components without increasing the lateral size and depth of the host device. Examples of the manner in which the connector ports with the heat sinks integrated therewith can be arranged and mounted for use in a host device are illustrated in FIGS. 15-16A.

Figure 20:
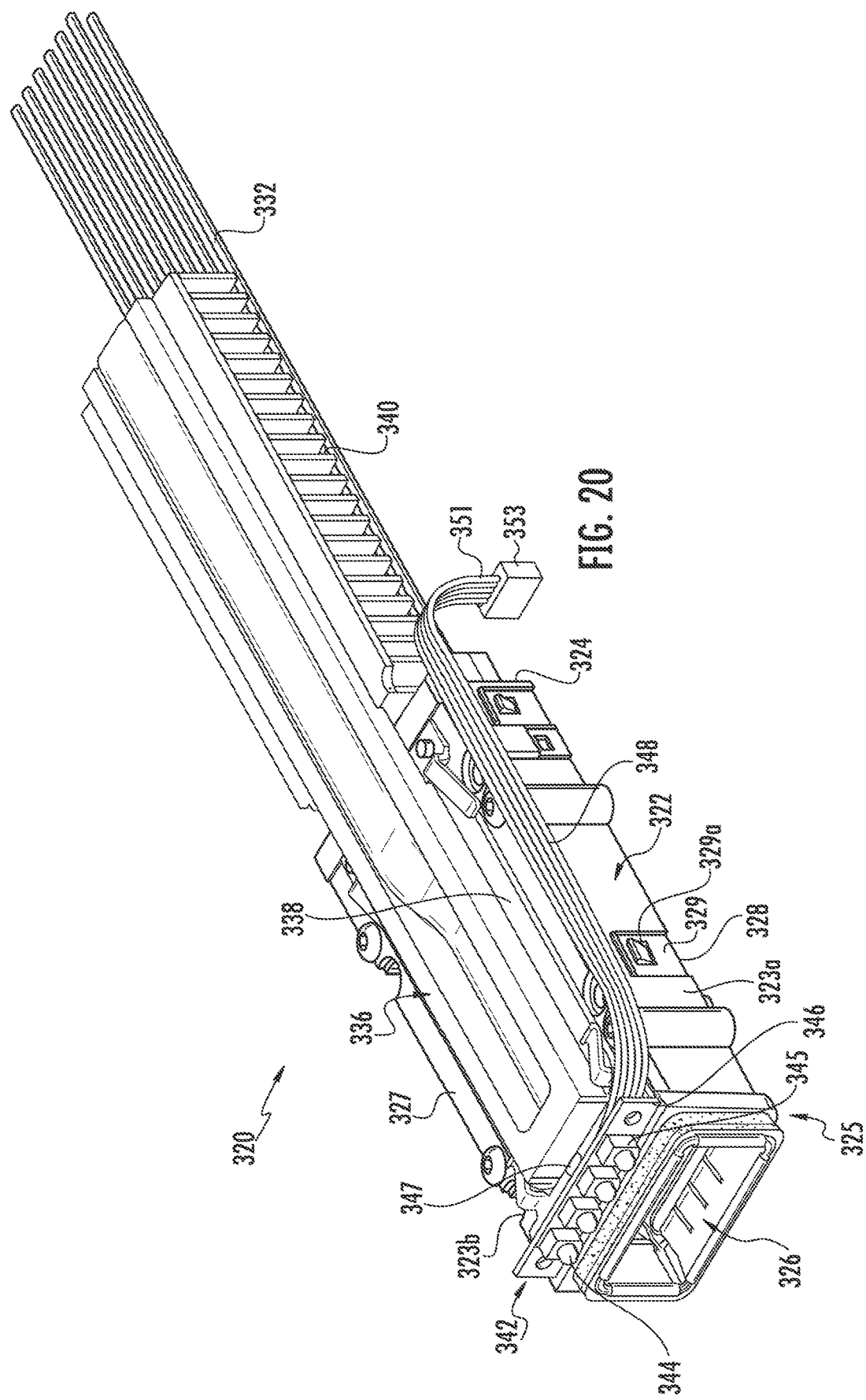
FIG. 20 is a perspective view of a connector port of the present disclosure with an indicator light assembly supported thereon.

FIGS. 20-20C illustrate a connector port 320 having a housing 322 and an indicator light assembly 342 of the present disclosure. The housing 322 has a hollow interior space 326 that is formed from a plurality of interconnected walls, such as sidewalls 323a, 323b, rear wall 324, top wall 327 and bottom wall 328. The housing 322 has a front end 325 that includes an entrance 328 that communicates with the hollow interior 326. The bottom wall 328 is preferably formed of sheet metal and may have engagement flaps 329 that are formed to contact engagement lugs 329a formed on sidewalls 323a, 323b of the housing 322. The bottom wall 328 seals the bottom of the housing.

Figure 20A:
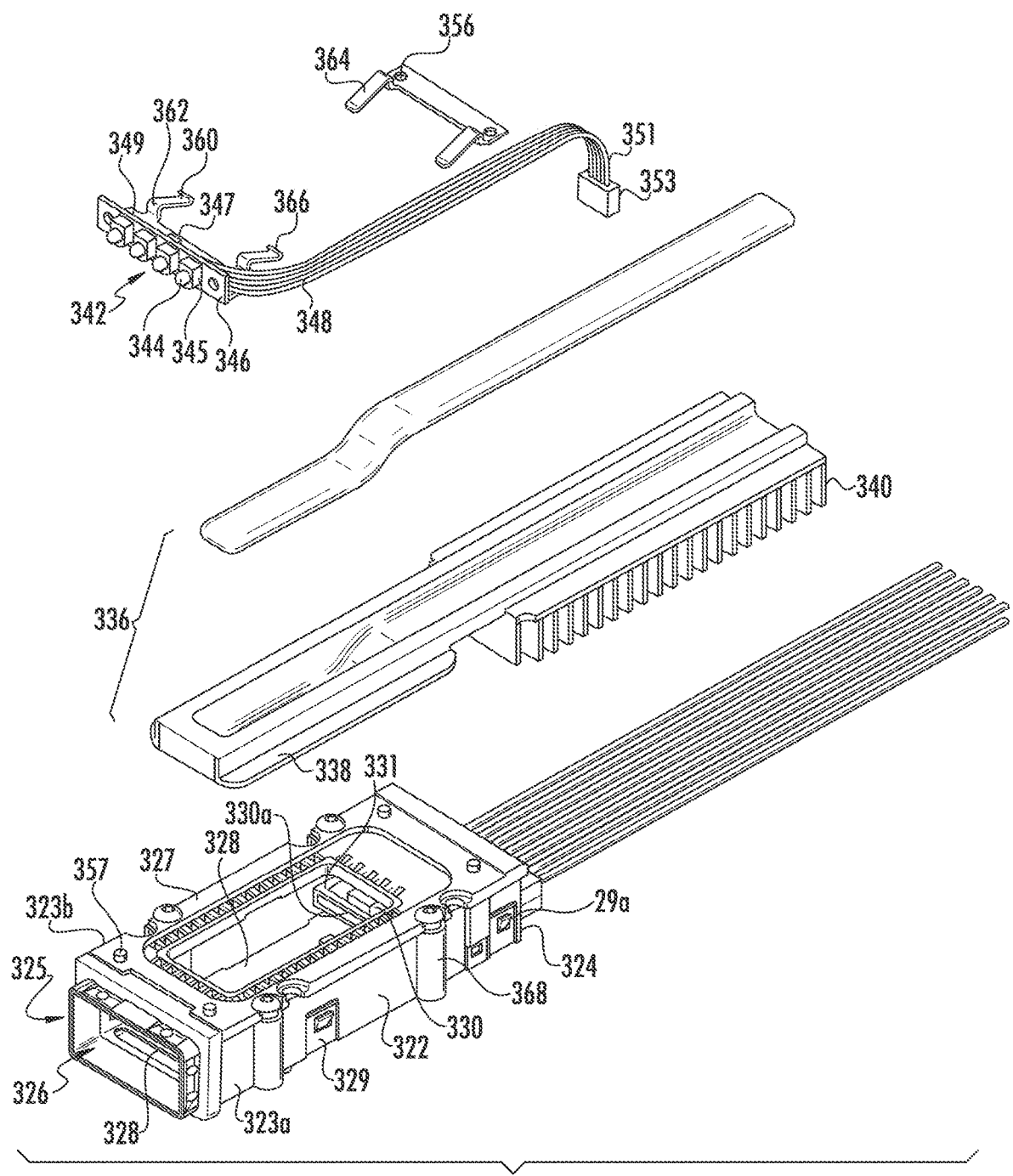
FIG. 20A is an exploded view of the assembly of FIG. 20.
Figure 20B:
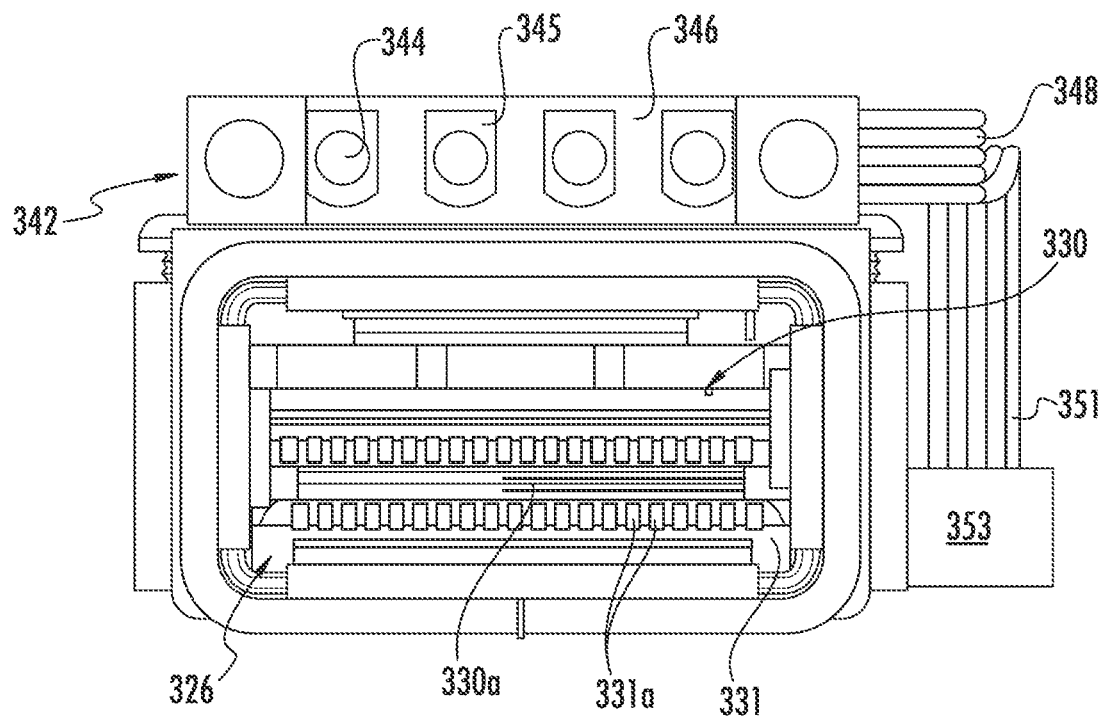
FIG. 20B is a front elevational view of the assembly of FIG. 20.

The housing 322 independently houses an internal receptacle connector 330 that has a connector housing 331 that includes a card-receiving slot 330a in which a plurality of conductive terminals 331a are disposed. (FIG. 20B.) The slot 330a receives a mating blade, or edge card of a corresponding plug connector. The connector port 320 is intended for mounting in an electronic device, such as a switch, server, router or the like in a manner such that the entrance 326 thereof is supported along a face panel, or bezel 374. The terminals 331a of the internal connector 330 are connected to various circuits and components of the host device by way of conductors enclosed in wires 332 that extend through the rear wall 324 of the housing 322. The front end 325 of the housing 322 may include an EMI gasket interposed between the housing and the panel 374. Other EMI gaskets can be supported within the entrance 326.

An elongated heat transfer member 336 is shown that extends lengthwise of the housing 322. As noted above, it has a base 338 and a cantilevered rear end 339 that extends past the rear wall 324 of the housing 322 and which contains a plurality of heat-dissipating fins 340 that extend downwardly and widthwise of the module housing 322. The base 338 has a flat bottom surface which is intended to make contact with an opposing surface of an inserted module in order to affect the transfer of heat from the module to the base portion and into the atmosphere by way of the heat-dissipating fins 340.

The housings 322 and their corresponding internal connectors 330 are mated for use in high speed data transmission applications. Each housing, typically when attached to a panel, defines a connector port for a pluggable module that serves one or more data transmission lines, or channels. In order to indicate the operational status of these channels, indicator lights are utilized that are visible from the front panel. The lights can indicate by color or illumination if a port (and its associated channels) is connected, active, down or the like. These indicator lights facilitate the installation of data transmission devices and permit an installer to confirm proper operation of the ports and channels.

Prior art indicator systems, such as U.S. Pat. No. 5,876, 239 mentioned in the Background Section above, have utilized plastic pipes as light transmission conduits. This involves usually mounting a lighting element such as a light-emitting diode (LED) on the circuit board of the device and contacting the LED with one end of the plastic pipe. The other end of the pipe extends to the face panel and into a hole in the panel. The problem with such a structure is that the light pipes must often take a non-linear path. Turns, bends and offsets reduce the amount of light transmitted and when pipes for different channels are located close to each other the colored light in one pipe may affect the color of the light in the adjacent pipe, thereby creating visual crosstalk and possibly effecting the indication of the correct operational status of the device ports.

FIG. 21 illustrates an indicator light assembly 342 constructed in accordance with the principles of the present disclosure. In this assembly 342, the LEDs 344 are brought as close as they can to the indicator openings 343 associated with each connector port without the use of any plastic transmission material. This is done by mounting an array of LEDs 344 onto a substrate 346. The substrate 346 may be a circuit board shaped in the form of a horizontal bar that extends widthwise over the housing 322 as shown in FIGS. 20 & 20C. The LEDs 344 may include bases 345 that are mounted to the substrate. When a circuit board is used as the substrate 346, the LEDs 344 may be terminated to circuits with end points at a termination area of the substrate. In FIGS. 20A and 20C, this is illustrated as a connector 347, preferably of the wire-to-board style. In order to connect the LEDs 344 to their associated operational circuits, typically on the device circuit board, a plurality of conductive wires 348 are provided and the distal ends 351 of the wires 348 are terminated to a second connector 353, which is mateable with a corresponding opposing connector mounted to the circuit board of the device.

Figure 23:
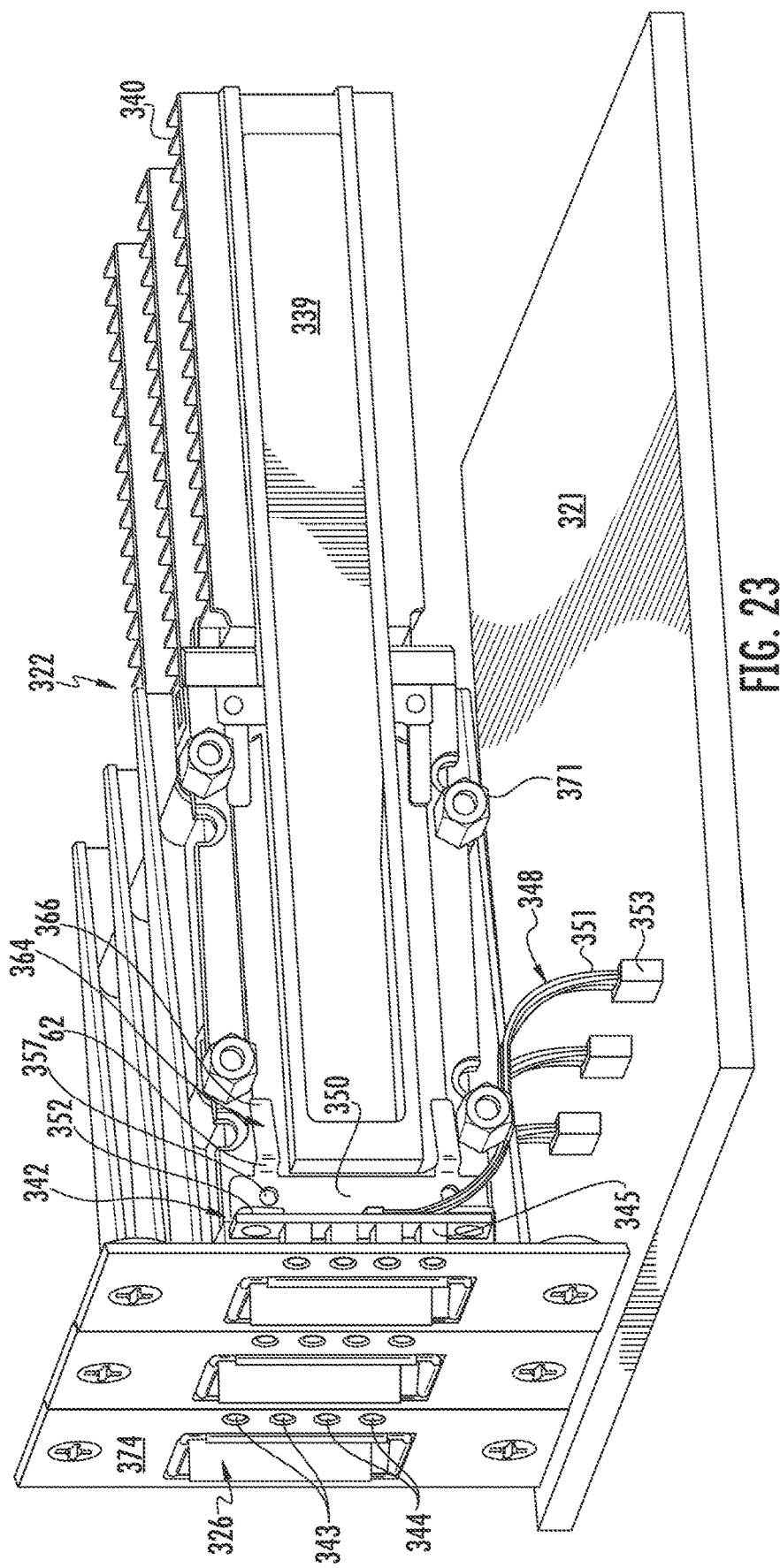
FIG. 23 is a perspective view of three connector ports and associated indicator light assemblies stacked together in a horizontal orientation.

The LEDs 344 and their supporting substrate 346 define a light bar that may be mounted on the module housing top wall 327 proximate to the entrance 326 and the face panel so that the LEDs 344 are received within the indicator openings 343 of a face panel 374. (FIG. 23.) The wires 348 are by their very nature flexible and hence, a designer has many possibilities for reduced space mounting of the assemblies 320. The need for plastic pipes extending from the circuit board either behind or alongside the module housing to the front end 325 is eliminated. Also, there are no transmission losses to incur through bends and turns of the wires 348 as they transmit only low power signal to the LEDs 344. In effect, the indicating lights 344 are generated at the face plate and the likelihood of dimmed lights or muted (through light crosstalk) lights is virtually eliminated, leading to correct operational status indications. Locating the indicator lights near the faceplate or bezel frees up space on the circuit board 321 behind and alongside the housing 322, and facilitates lower design costs of the device.

Figure 20D:
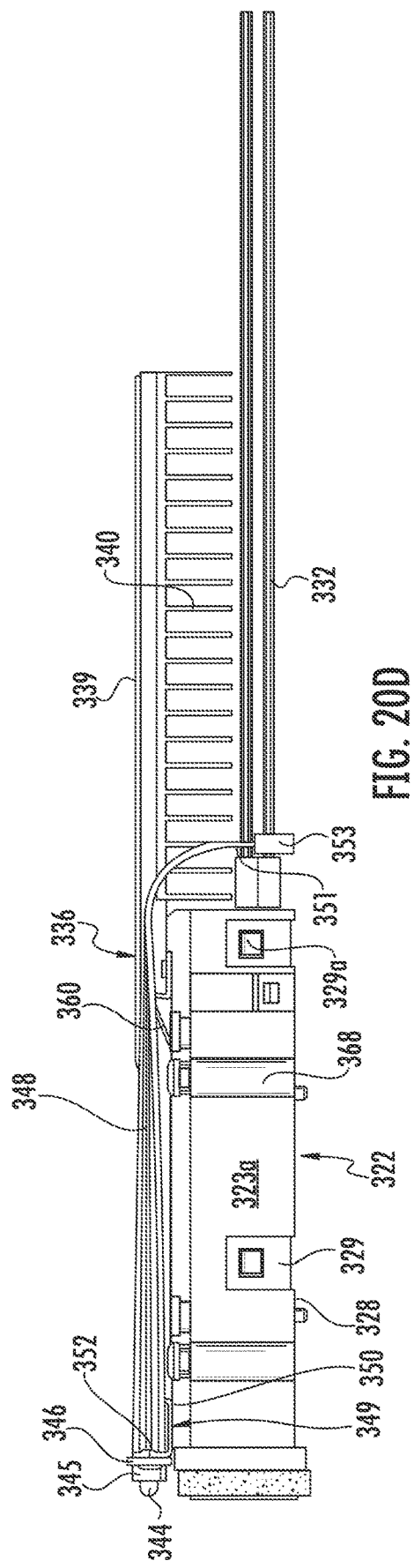
FIG. 20D is a side elevational view of the assembly of FIG. 20.

A support bracket 49 is illustrated for supporting the LEDs 344 and their substrate 346 and the bracket 349 has an overall L-shape with a flat base 350 and one or more flanges 352 that extend at an angle to the base 350, shown upwardly in FIGS. 20A and 20D. The base 350 may have holes 356 that engage posts 357 formed as part of the housing top wall 327 which may be dead-headed to attach the bracket 349 to the housing 322. The flanges 352 may include rivets for attaching the substrate 346 to the bracket 349. Due to its proximity to the heat transfer member 336, the bracket 349 may include retainers in the form of spring arms 360 that are elastically formed with a preload for exerting a retention pressure on the heat transfer member 336 to maintain it in place on the module housing 322 and in contact with the inserted module.

The bracket base 350 may include upright tabs 362 (FIG. 20A) to which are joined cantilevered contact arms 364 that extend downwardly therefrom at an acute angle thereto. The contact arms 364 terminate in free ends 366 that are formed with a preformed downward bias to preferably at least partially extend into the access opening 334 that communicates with the hollow interior of the housing 322 in which the internal connector 330 is located. When the heat transfer member 336 is engaged with the housing 322, the base 338 of the heat transfer member 336 projects partially through the access opening and into contact with an inserted module. In this instance, the top surface of the base 338 is contacted by the contact arm free ends 366 which exert a downward retention force thereon.

Figure 22:
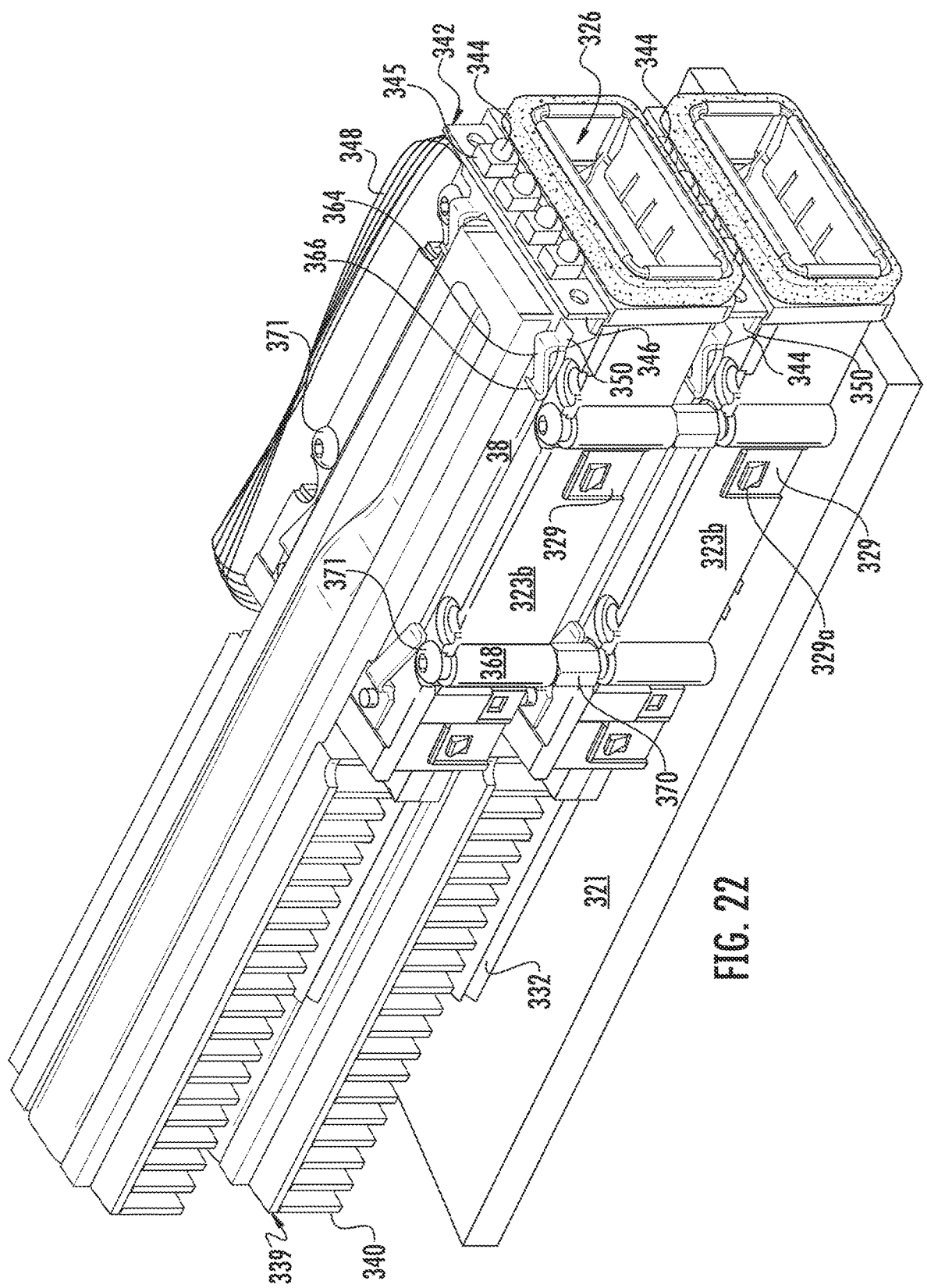
FIG. 22 is a perspective view of a pair of connector ports with indicator light assemblies supported thereon, stacked together in a vertical orientation.

The use of the light bar and flexible connecting wires as shown and described facilitates the design on electronic devices. For example, as shown in FIG. 22, two or more housings 322 may be oriented horizontally while stacked vertically on top of each other. Because there is no light pipe support structure associated with the bottom housing, it is easier to stack the two housings 322 together. This can be done by way of fasteners, such as screws 370, 371 that are received within corresponding bosses 368 that are formed as part of the housing 322. One set of screws 370 may engage the other set 371. FIG. 23 illustrates another manner of stacking the housings 322 together that is facilitated by the use of the indicator light assemblies 342 of the present disclosure. In these Figures, the module housings 322 are oriented vertically and stacked together horizontally. In this regard, mounting nests 376 are provided which have a general U-shape with a base portion 378 that is flanked by two sidewalls 380. Openings 381 in the mounting nests 376 which are aligned with the fastener bosses 368 permit screws 382 to be used to hold the three module housings 322 shown in FIG. 23. The distal connectors 353 of the LEDs 44 may engage other connectors that are easily located on the circuit board.

Figure 24:
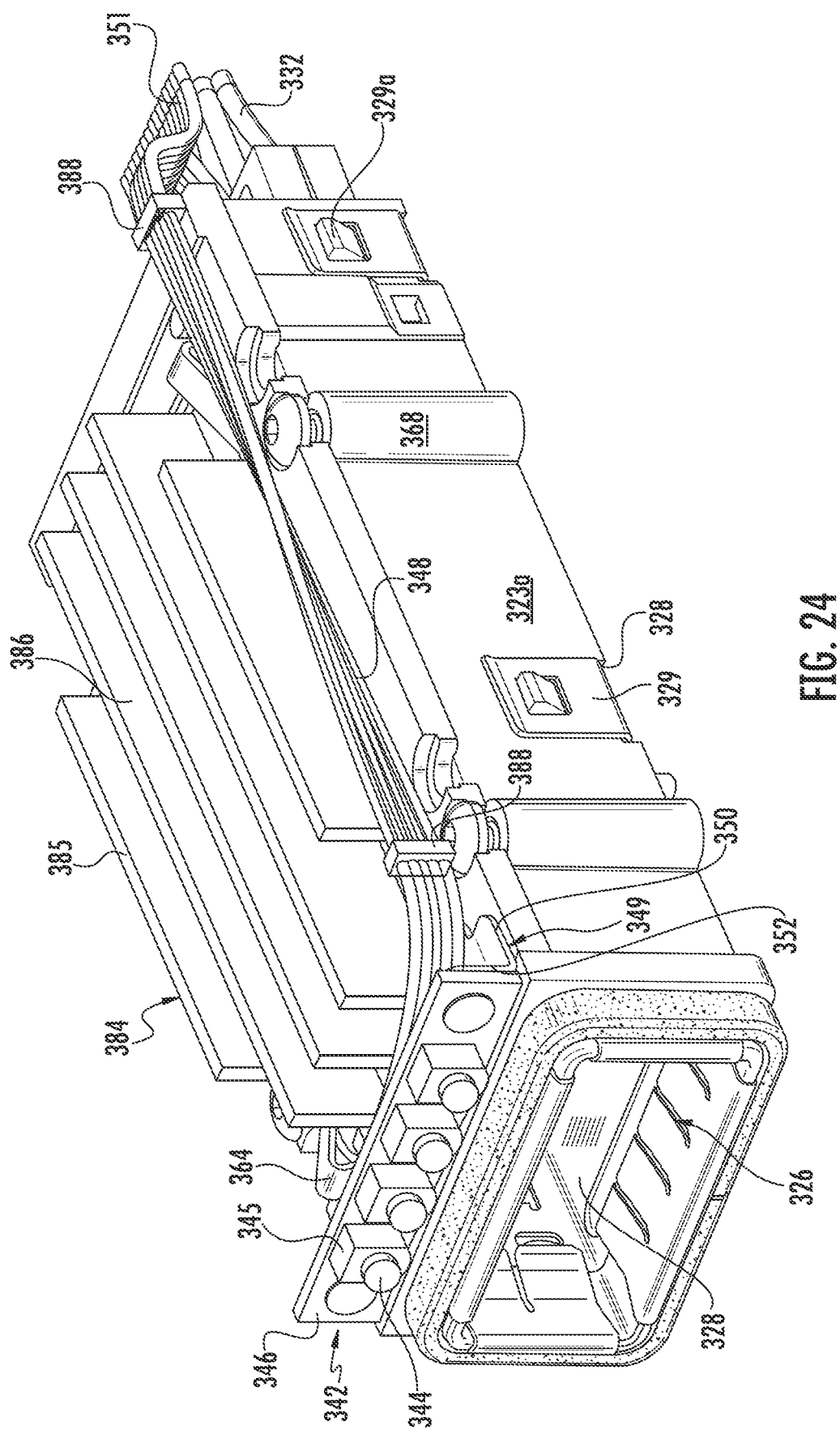
FIG. 24 is a perspective view of an indicator light assembly in place on a connector port with a thermal transfer member having its heat-dissipating fins located on the top of the housing portion of the port, illustrating the path of the indicator light wires; and, FIG. 24A is an exploded view of the assembly of FIG. 24.
Figure 24A:
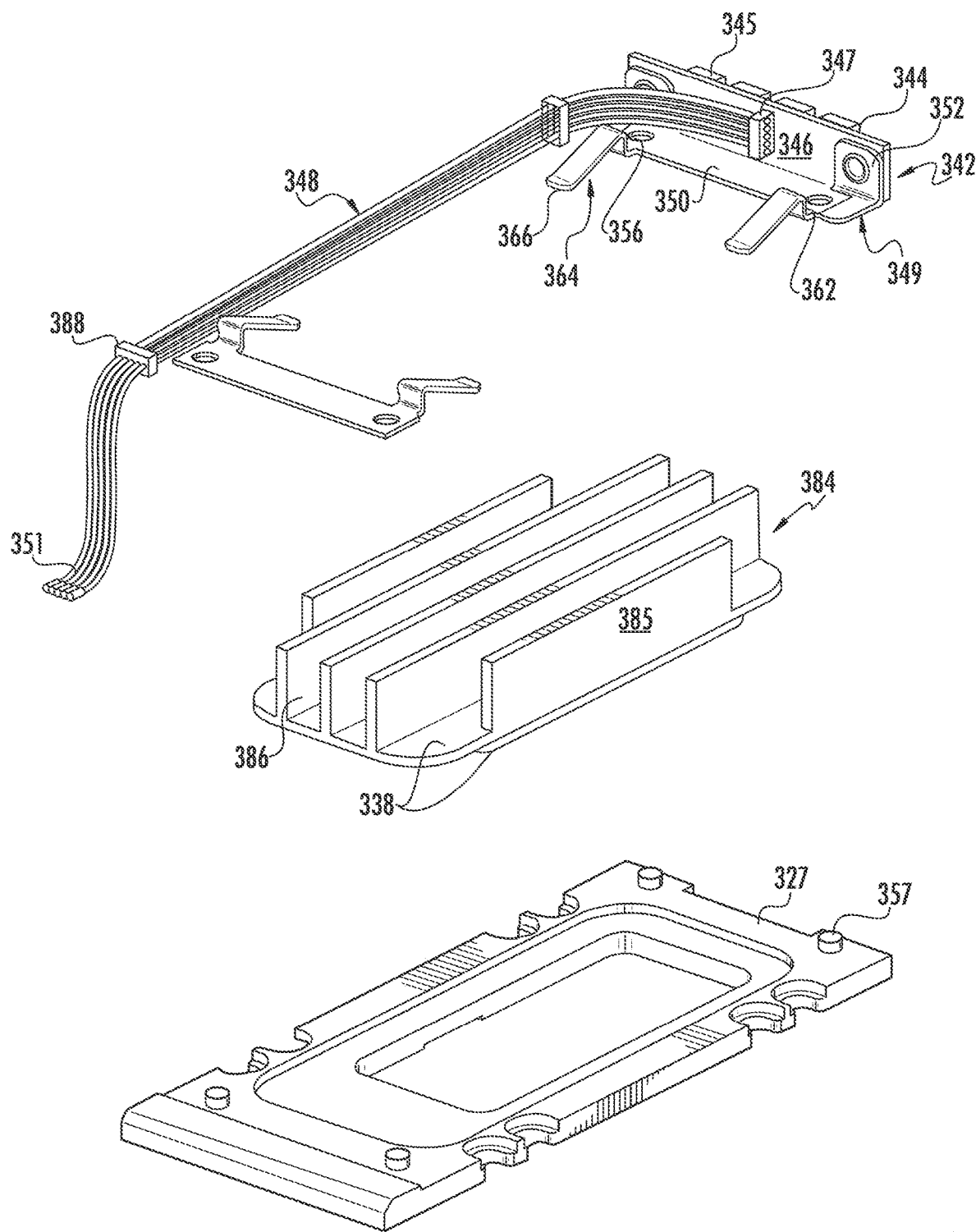

FIGS. 24-24A illustrate the use of the indicator light assembly 342 with a housing having a thermal transfer member 384 that has longitudinal heat-dissipating fins 385 separated by intervening airflow spaces 386. In this embodiment, as with the previously discussed embodiments, the LEDs 344 and the substrate 346 may be attached to or formed with the support bracket 349 to form an integrated, one-piece assembly. The flexible connecting wires 348 can be routed alongside of the fins 385 and held in place by supports such as wire combs 388. In this manner all of the spaces 386 between the fins 385 are used for cooling as none of them accommodate light pipes or light pipe supports.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A bypass assembly, comprising:
   a box with a front panel;
   a first cage and a second cage positioned in the box, each of the cages having a four side walls that help define a port, the four side walls defining a port opening that is positioned in the front panel, wherein each of the first and second cages are separate and the first cage is stacked on top of the second cage;

a connector positioned in each of the first cage and the second cage, the connector not being mounted to a circuit board and having a card slot configured to mating with an inserted module, the connector rearwardly from the front opening and having a first and second row of terminals positioned in the card slot, each of the terminals including a contact and a tail, the contacts being positioned in the card slot in a cantilevered manner; and a plurality of conductors connected to the tails, at least some of the conductors arranged in pairs in a twin-ax configured cable to provide high-speed differential channel that extends from the terminals in the first row through the twin-ax configured cable, wherein other of the conductors are configured to provide low-speed signals and/or power.

2. The bypass assembly of claim 1, wherein the high-speed differential channel is configured to support 10 GHz signaling.

3. The bypass assembly of claim 2, wherein each of the first and second cages further includes a heat transfer member positioned on a top side of the respective cage, the heat transfer member configured to direct thermal energy to a plurality of heat dissipating fins.

4. The bypass assembly of claim 1, wherein the connector includes a frame that supports a plurality of cables, each of the cables having a twin-ax construction with a ground shield provided around the pair of conductors.

5. The bypass assembly of claim 2, wherein all the terminals in the connector are connected to one the plurality of conductors.

6. The bypass assembly of claim 1, wherein the cage extends along a top, a bottom and two sides of the connector so as to provide a substantially continuous shielding around the connector.

7. A bypass assembly, comprising:
a box with a front panel;
a first cage and a second cage positioned in the box, each of the cages having a four side walls that help define a port, the four side walls defining a port opening that is positioned in the front panel;
a first and second cradle configured to respective support the first and second cage, the first and second cradle being positioned adjacent each other;
a connector positioned in each of the first cage and the second cage, the connector not being mounted to a circuit board and having a card slot configured to mating with an inserted module, the connector rearwardly from the front opening and having a first and second row of terminals positioned in the card slot, each of the terminals including a contact and a tail, the contacts being positioned in the card slot in a cantilevered manner; and
a plurality of conductors connected to the tails, at least some of the conductors arranged in pairs in a twin-ax configured cable to provide high-speed differential channel that extends from the terminals in the first row through the twin-ax configured cable, wherein other of the conductors are configured to provide low-speed signals and/or power.

8. The bypass assembly of claim 7, wherein the first and second cage are arranged in a vertical alignment.

9. The bypass assembly of claim 8, wherein the high-speed differential channel is configured to support 10 GHz signaling.

10. The bypass assembly of claim 9, wherein the twin-ax configured cable is at least 10 inches long.

11. The bypass assembly of claim 7, wherein all the terminals in the connector are connected to one the plurality of conductors.

12. The bypass assembly of claim 7, wherein the cage extends along a top, a bottom and two sides of the connector so as to provide a substantially continuous shielding around the connector.

* * * * *